United States Patent
Kim et al.

(10) Patent No.: US 12,398,315 B2
(45) Date of Patent: Aug. 26, 2025

(54) ORGANIC ELECTROLUMINESCENCE DEVICE

(71) Applicant: LG Display Co., Ltd., Seoul (KR)

(72) Inventors: Sangbeom Kim, Paju-si (KR); Shinhan Kim, Seoul (KR); Jeongdae Seo, Incheon (KR); Inbum Song, Seoul (KR); Seunghee Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 598 days.

(21) Appl. No.: 16/537,222

(22) Filed: Aug. 9, 2019

(65) Prior Publication Data
US 2020/0058874 A1    Feb. 20, 2020

(30) Foreign Application Priority Data
Aug. 17, 2018    (KR) .................. 10-2018-0096346

(51) Int. Cl.
*C09K 11/06*    (2006.01)
*H10K 50/11*    (2023.01)
(Continued)

(52) U.S. Cl.
CPC ............ *C09K 11/06* (2013.01); *H10K 85/615* (2023.02); *H10K 85/626* (2023.02);
(Continued)

(58) Field of Classification Search
CPC ............ C09K 11/06; C09K 2211/1037; C09K 2211/185; H01L 2251/5384; H01L 51/008;
(Continued)

(56) References Cited

U.S. PATENT DOCUMENTS 8,299,703 B2    10/2012    Jeong et al.
8,319,211 B2    11/2012    Sakuma et al.
(Continued)

FOREIGN PATENT DOCUMENTS

CN    101747256 A    6/2010
CN    102382105 A    3/2012
(Continued)

OTHER PUBLICATIONS

Ikuta Toshiaki et al., Machine translation of WO-2015102118-A1 (2015) pp. 1-208. (Year: 2015).*
(Continued)

*Primary Examiner* — Dylan C Kershner
(74) *Attorney, Agent, or Firm* — Fish & Richardson P.C.

(57) ABSTRACT

Disclosed is an organic electroluminescence device. The device includes an anode; a cathode; and a first light-emission layer disposed between the anode and the cathode and configured for emitting blue light. The first light-emission layer comprises a host composition and a blue dopant. The blue dopant includes at least one compound represented by Chemical Formula D. The host composition
(Continued)

contains a first host compound and a second host compound. The first host compound has a triplet energy level higher than a triplet energy level of the blue dopant, while the second host compound has a triplet energy level lower than the triplet energy level of the blue dopant.

<Chemical Formula D>

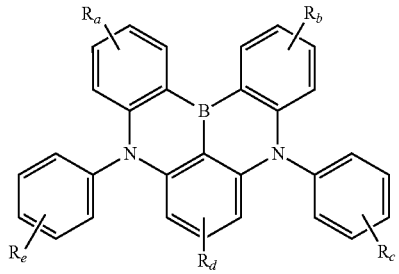

In Chemical Formula D, each of $R_a$, $R_b$, $R_c$, $R_d$ and $R_e$ independently is the same as defined in the present specification.

6 Claims, 13 Drawing Sheets

(51) Int. Cl.
*H10K 50/19* (2023.01)
*H10K 59/12* (2023.01)
*H10K 85/60* (2023.01)
*H10K 101/00* (2023.01)
*H10K 101/10* (2023.01)
*H10K 101/20* (2023.01)

(52) U.S. Cl.
CPC ....... *H10K 85/657* (2023.02); *H10K 85/6572* (2023.02); *H10K 85/658* (2023.02); *C09K 2211/1037* (2013.01); *H10K 50/11* (2023.02); *H10K 50/19* (2023.02); *H10K 59/12* (2023.02); *H10K 2101/10* (2023.02); *H10K 2101/20* (2023.02); *H10K 2101/90* (2023.02)

(58) Field of Classification Search
CPC ............... H01L 51/5016; H01L 51/006; H01L 51/0061; H01L 51/0067; H01L 51/0072; H01L 51/0073; H01L 51/0074; H01L 51/0058; H10K 85/322; H10K 85/658; H10K 50/11; H10K 85/633; H10K 85/636; H10K 85/654; H10K 85/6572; H10K 85/6574; H10K 85/6576; H10K 85/342; H10K 85/324; H10K 85/626; H10K 85/624; H10K 85/40

See application file for complete search history.

(56) References Cited

U.S. PATENT DOCUMENTS

| | | | |
|---|---|---|---|
| 8,729,536 B2 | 5/2014 | Sakuma et al. | |
| 9,105,856 B2 | 8/2015 | Sakuma et al. | |
| 9,570,717 B2 | 2/2017 | Sakuma et al. | |
| 2003/0170491 A1* | 9/2003 | Liao | H01L 51/5278 428/690 |
| 2006/0043858 A1* | 3/2006 | Ikeda | C07C 15/28 313/250 |
| 2006/0216411 A1* | 9/2006 | Steudel | H01L 51/0035 427/66 |
| 2016/0043324 A1 | 2/2016 | Qiu et al. | |

FOREIGN PATENT DOCUMENTS

| | | | | |
|---|---|---|---|---|
| CN | 103524497 A | | 1/2014 | |
| CN | 103922995 A | | 7/2014 | |
| CN | 104078572 A | | 10/2014 | |
| CN | 107039592 A | | 8/2017 | |
| EP | 1 535 352 A1 | | 6/2005 | |
| EP | 3 109 253 A1 | | 12/2016 | |
| JP | 2003133075 A | * | 5/2003 | |
| JP | 2010215759 A | * | 9/2010 | |
| KR | 10-2014-0000259 A | | 1/2014 | |
| KR | 10-2014-0085110 A | | 7/2014 | |
| KR | 10-1876763 B1 | | 7/2018 | |
| WO | WO-2015102118 A1 | * | 7/2015 | ............. C09B 57/00 |
| WO | 2016/015422 A1 | | 2/2016 | |
| WO | 2016/152544 A1 | | 2/2018 | |
| WO | 2017/138526 A1 | | 12/2018 | |
| WO | 2017/188111 A1 | | 2/2019 | |

OTHER PUBLICATIONS

Nishizeki, Masahito et al., Machine translation of JP-2010215759-A (2010) pp. 1-178. (Year: 2010).*
Tominaga, Takeshi et al., Machine translation of JP-2003133075-A (2003) pp. 1-9. (Year: 2003).*
European Search Report issued Oct. 10, 2019 in European Patent Application No. 19191672.5 (5 pages).
Chinese Office Action dated Sep. 28, 2021 issued in corresponding Patent Application No. 201910759980.6 (11 pages).

* cited by examiner

ORGANIC ELECTROLUMINESCENCE DEVICE

CROSS-REFERENCE TO RELATED APPLICATION

This application claims priority from Korean Patent Application No. 10-2018-0096346 filed on Aug. 17, 2018, in the Korean Intellectual Property Office, the disclosure of which incorporated herein by reference in its entirety.

BACKGROUND

Field of the Disclosure

The present disclosure relates to an organic electroluminescence device.

Description of the Background

An organic electroluminescence device is a self-light-emission device that converts electrical energy into light energy using an organic material. Generally, in the organic electroluminescence device, an organic material layer is placed between an anode and a cathode.

When a voltage is applied between the anode and the cathode, holes are injected from the anode into the organic material layer, and electrons are injected into the organic material layer from the cathode. When the injected holes and electrons encounter each other, excitons are formed. Light emission may occur when the exciton falls to a ground state.

In order to increase efficiency and stability of the organic electroluminescence device, the organic material layer may have a multi-layered structure composed of different materials. For example, the organic material layer may include a hole injection layer, a hole transport layer, a light-emission layer, an electron transport layer, and an electron injection layer.

SUMMARY

One purpose of the present disclosure is to provide an organic electroluminescence device with improved electro-optical characteristics and life-span characteristics.

The purposes of the present disclosure are not limited to the above-mentioned purposes. Other purposes and advantages of the present disclosure, not mentioned above, may be understood from the following descriptions and more clearly understood from embodiments of the present disclosure. Further, it will be readily appreciated that the objects and advantages of the present disclosure may be realized by features and combinations thereof as disclosed in the claims.

In a first aspect of the present disclosure, there is provided an organic electroluminescence device that includes a first light-emission layer containing a host composition and a narrow blue dopant (NBD). The NBD refers to a blue dopant whose full width half maximum (FWHM) is narrower than that of a conventional blue dopant in a blue light-emission wavelength curve.

In one implementation, the host composition contains a first host compound and a second host compound. The first host compound has a higher triplet energy level than that of the NBD. The second host compound has a lower triplet energy level than that of the NBD.

In one implementation, the triplet energy level of the first host compound may be greater than 2.5 eV, for example, may be in a range of 2.7 eV to 2.8 eV. The triplet energy level of the second host compound may be lower than 2.4 eV, for example, may be in a range of 1.8 eV to 1.9 eV.

In one implementation, a content of the first host compound is lower than a content of the second host compound.

In one implementation, the organic electroluminescence device may satisfy Equation I:

$$X+Y=24 \quad \text{(Equation I)}$$

In the Equation I, X refers to a ratio of a mass of the first host compound to a mass of the NBD. Y refers to a ratio of a mass of the second host compound to a mass of the NBD. Y is a rational number of 14 to 22.

For example, the Y may be a rational number from 16 to 21.

For example, a ratio of the X and the Y may be in a range of 1:9 to 4:6.

In one example, the first host compound may be a carbazole-based compound.

In one example, the second host compound may be an anthracene-based compound.

In one implementation, the NBD may include at least one compound represented by Chemical Formula D:

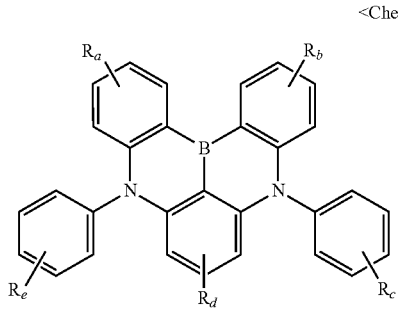

<Chemical Formula D>

In the Chemical Formula D, each of $R_a$, $R_b$, $R_c$, $R_d$ and $R_e$ independently represents one selected from a group consisting of a substituted or unsubstituted C1 to C12 monovalent aliphatic chain hydrocarbon group, a substituted or unsubstituted C3 to C20 monovalent aliphatic cyclic hydrocarbon group, a substituted or unsubstituted C6 to C60 monovalent aromatic hydrocarbon group, a substituted or unsubstituted C3 to C60 monovalent heteroaromatic hydrocarbon group, and a substituted or unsubstituted C6 to C24 arylamino. In the Chemical Formula D, at least one of the $R_a$, the $R_b$, the $R_c$, the $R_d$, and the $R_e$ may form a condensed ring with a 6-membered aromatic ring adjacent thereto.

In one implementation, the organic electroluminescence device includes an anode and a cathode. The first light-emission layer is placed between the anode and the cathode.

In one implementation, the first light-emission layer light-emits blue light. The organic electroluminescence device may further include a second light-emission layer that light-emits light of a wavelength longer than that of the blue light.

In this case, the organic electroluminescence device may further include a charge generation layer disposed between the first light-emission layer and the second light-emission layer. The charge generation layer may include an n-type charge generation layer and a p-type charge generation layer. The p-type charge generation layer may be placed between the n-type charge generation layer and the second light-emission layer.

Specific details of other embodiments are contained in detailed descriptions and drawings.

The present disclosure may at least have the following effects but is not limited thereto:

The present disclosure may provide an organic electroluminescence device with improved electro-optical characteristics and life-span characteristics.

Further specific effects of the present disclosure as well as the effects as described above will be described in conjunction with illustrations of specific details for carrying out the present disclosure.

BRIEF DESCRIPTION OF DRAWINGS

FIG. 5 shows driving characteristics of an organic electroluminescence device according to Example 1 and driving characteristics of organic electroluminescence devices according to Comparative Examples 1 and 2.

FIG. 6 shows life-span characteristics of an organic electroluminescence device according to Example 1 and life-span characteristics of organic electroluminescence devices according to Comparative Examples 1 and 2.

FIG. 7 shows driving characteristics of an organic electroluminescence devices according to Examples 2 to 4 and driving characteristics of an organic electroluminescence device according to Comparative Example 1.

FIG. 8 shows life-span characteristics of organic electroluminescence devices according to Examples 2 to 4 and life-span characteristics of an organic electroluminescence device according to Comparative Example 1.

FIG. 7 shows driving characteristics of an organic electroluminescence devices according to Examples 2, 5 and 6 and driving characteristics of an organic electroluminescence device according to Comparative Example 1.

FIG. 10 shows life-span characteristics of organic electroluminescence devices according to Examples 2, 5 and 6 and life-span characteristics of an organic electroluminescence device according to Comparative Example 1.

FIG. 11 shows driving characteristics of organic electroluminescence devices according to Examples 2, and 7 and driving characteristics of organic electroluminescence devices according to Comparative Examples 1 and 3.

FIG. 12 shows life-span characteristics of organic electroluminescence devices according to Examples 2, and 7 and life-span characteristics of organic electroluminescence devices according to Comparative Examples 1 and 3.

FIG. 13 shows driving characteristics of an organic electroluminescence device according to Example 8 and driving characteristics of an organic electroluminescence device according to Comparative Example 4.

FIG. 14 shows life-span characteristics of an organic electroluminescence devices according to Example 8 and life-span characteristics of an organic electroluminescence device according to Comparative Example 4.

DETAILED DESCRIPTIONS

Figure 1:
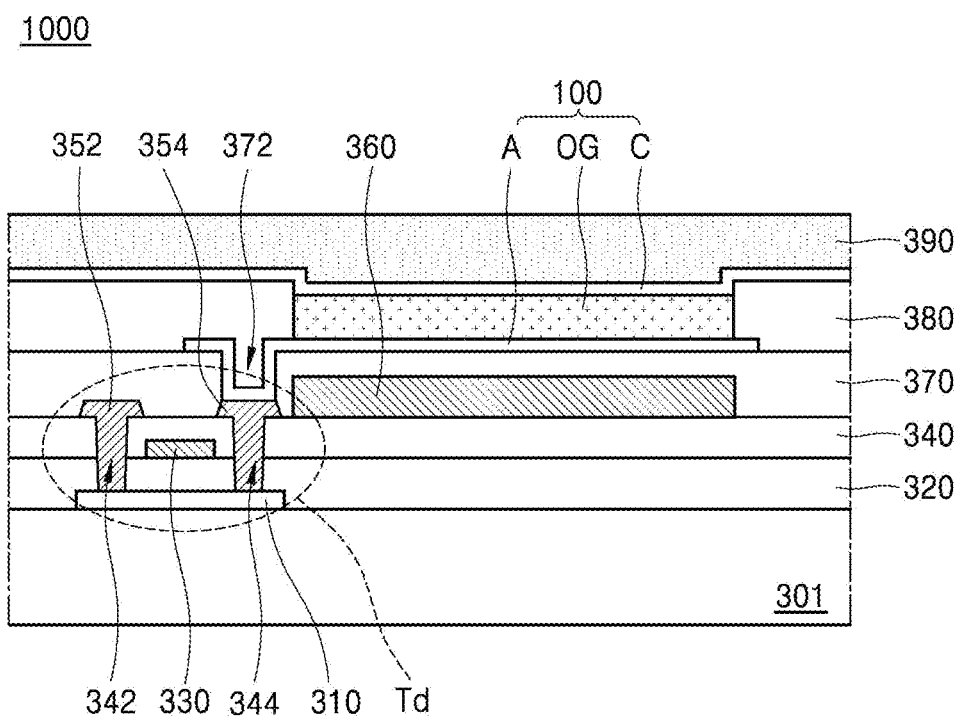
FIG. 1 is a schematic cross-sectional view of an organic electroluminescence display device according to one embodiment of the present disclosure.

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a "Ca to Cb" hydrocarbon group is defined as a hydrocarbon group or a hydrocarbon derivative group having a carbon number of "a" or greater and "b" or smaller. A phase "a to b" is defined as being a or greater and b or smaller. As used herein, a phase "a and/or b" means "a" or "b" or "a and b".

As used herein, in a phase "substituted" or "unsubstituted", the term "substituted" means that at least one hydrogen of a hydrocarbon compound or hydrocarbon derivative is replaced with a hydrocarbon group, a hydrocarbon derivative group, halogen or a cyano group (—CN) or the like. The term "unsubstituted" means that at least one hydrogen of a hydrocarbon compound or hydrocarbon derivative is not replaced with a hydrocarbon group, a hydrocarbon derivative group, halogen or a cyano group (—CN) or the like. Examples of the hydrocarbon group or the hydrocarbon derivative group may include C1 to C6 alkyl, C2 to C6 alkenyl, C2 to C6 alkynyl, C6 to C15 aryl, C1 to C6 alkyl C6 to C15 aryl, C6 to C15 aryl C1 to C6 alkyl, C1 to C6 alkylamino, C6 to C15 arylamino, C1 to C6 alkylidene, and the like, but not limited thereto.

Hereinafter, an organic electroluminescence display device according to one embodiment of the present disclosure will be described with reference to FIG. 1. FIG. 1 shows a schematic cross-section of an organic electroluminescence display device 1000.

The organic electroluminescence display device 1000 contains a display region in which pixels are arranged in a matrix form and a non-display region disposed around the display region. The display region refers to an area in which an image or information generated from the organic electroluminescence display device 1000 may be viewed to the viewer. The non-display region refers to an area where the image or information generated from the organic electroluminescence display device 1000 cannot be viewed to the viewer, and is generally referred to as a bezel area. The organic electroluminescence display device 1000 includes a plurality of pixels. FIG. 1 shows one pixel among a plurality of pixels provided in the organic electroluminescence display device 1000.

The organic electroluminescence display device 1000 may include a circuit substrate including an organic electroluminescence device 100 and a thin-film transistor Td on a pixel basis. The organic electroluminescence device 100 is electrically connected to the thin-film transistor Td and generates light-emission. In the organic electroluminescence device 100, each pixel contains an anode A, a cathode C, and an organic material layer OG. The organic material layer OG is disposed between the anode A and the cathode C. When the organic electroluminescence display device 1000 has a front light-emission type structure in which an image is rendered toward the cathode C, the cathode C may be embodied as a light transmitting type electrode while the anode A may be embodied as a reflective electrode. When the organic electroluminescence display device 1000 has a rear light-emission type structure in which an image is rendered toward the anode A, the anode A may be embodied as a light transmission type electrode, while the cathode C may be embodied as a reflective electrode.

The light transmission type electrode may be made of a light-transmitting metal oxide such as ITO, IZO, and ZnO. The reflective electrode may be made of a metal such as Ag, Mg, Al, Pt, Pd, Au, Ni, Nd, Ir, Cr, Li and Ca, for example.

The organic material layer OG may include a hole transport layer (not shown), a light-emission layer (not shown), and an electron transport layer ETL. The hole transport layer (not shown) is placed between the anode A and the light-emission layer (not shown). The light-emission layer (not shown) is placed between the hole transport layer (not shown) and the electron transport layer ETL. The electron transport layer ETL is placed between the light-emission layer (not shown) and the cathode C. The organic material layer OG may further include a hole injection layer (not shown). In this connection, the hole injection layer (not shown) may be placed between the anode A and the hole transport layer (not shown). The organic material layer OG may further include an electron injection layer (not shown). In this connection, the electron injection layer (not shown) may be placed between the electron transport layer (not shown) and the cathode C.

A pixel-defining film 380 functions to define a pixel. The pixel-defining film 380 may be disposed between the anode A and the cathode C and on top of the thin-film transistor Td. The pixel-defining film 380 may be partially removed to expose a portion of the anode A. In the partially removed region of the pixel-defining film 380 where the portion of the anode A is exposed, an organic material layer OG may be disposed therein.

The organic electroluminescence display device 1000 may further include an encapsulation layer 390. The encapsulation layer 390 may be disposed on the cathode C to prevent water or the like from entering the organic material layer OG from the outside.

A circuit substrate may include a driving circuit disposed on the substrate 301. Specifically, the driving circuit may include a driving thin-film transistor Td disposed on the substrate 301. Although not shown, a switching thin-film transistor or the like may be disposed on the substrate 301 to constitute the circuit substrate. The substrate 301 may be embodied as a transparent substrate which may be embodied commonly as a glass substrate, a transparent polymer resin substrate, or the like. A buffer layer (not shown) may be optionally interposed between the substrate 301 and the driving thin-film transistor Td to improve a flatness of the substrate 301. The buffer layer (not shown) may be composed of an inorganic oxide such as silicon oxide or an inorganic nitride such as silicon nitride.

The driving thin-film transistor Td is disposed on the substrate 301. The driving thin-film transistor Td may include a semiconductor layer 310, a first insulating film 320, a gate electrode 330, a second insulating film 340, a source electrode 352, and a drain electrode 354.

The semiconductor layer 310 is disposed on the substrate 301 in a first region thereof. For example, the semiconductor layer 310 may be made of oxide semiconductor material or polycrystalline silicon. When the semiconductor layer 310 is made of polycrystalline silicon, the semiconductor layer 310 may include an active layer (not shown) and a channel region (not shown) disposed at each of both sides of the active layer.

The first insulating film 320 is disposed between the gate electrode 330 and the substrate 301. A portion of the first insulating film 320 is disposed on the semiconductor layer 310 in the first region of the substrate 301 while a remaining portion of the first insulating film 320 is disposed on the substrate 301 in a second region of the substrate 301. The first region and the second region of the substrate 301 may be individual. As used herein, the first region of the substrate 301 may be defined as a region in which the semiconductor layer 310 is formed. The first insulating film 320 may be made of an inorganic oxide such as silicon oxide or an inorganic nitride such as silicon nitride.

The gate electrode 330 is disposed on the first insulating film 320 and overlaps the semiconductor layer 310 in the first region of the substrate 301. The gate electrode 330 may be made of an aluminum-based metal such as aluminum (Al) and aluminum alloy, or a silver-based metal such as silver (Ag) and sliver alloy, a copper based metal such as copper and copper alloy, a molybdenum based metal such as molybdenum (Mo) and molybdenum alloy, chromium (Cr), titanium (Ti), tantalum (Ta), or the like.

The second insulating film 340 is disposed on the first insulating film 320 and the gate electrode 330. Specifically, a portion of the second insulating film 340 is disposed on the first insulating film 320, while a remaining portion of the second insulating film 340 is disposed on the gate electrode 330. The second insulating film 340 may be made of an inorganic oxide such as silicon oxide or an inorganic nitride such as silicon nitride as in the first insulating film 320.

The source electrode 352 and the drain electrode 354 are disposed on the second insulating film 340. The source electrode 352 and the drain electrode 354 are disposed apart from each other on the second insulating film 340. The source electrode 352 and the drain electrode 354 are connected to the semiconductor layer 310 via contact holes 342 and 344 defined in the first insulating film 320 and the second insulating film 340 respectively. Each of the source electrode 352 and the drain electrode 354 may be made of a metal such as Al, Ag, Mg, Mo, Ti or W.

The organic electroluminescence display device 1000 may further include a passivation layer 370 disposed between the circuit substrate and the organic electroluminescence device 100. The passivation layer 370 may have a contact hole 372 defined therein for connecting the anode A and the drain electrode 354 with each other.

The organic electroluminescence display device 1000 may further include a color filter 360. In this connection, the color filter 360 is disposed on the second insulating film 340 to overlap the organic material layer OG. The passivation layer 370 may be interposed between the anode A and the color filter 360.

Figure 2:
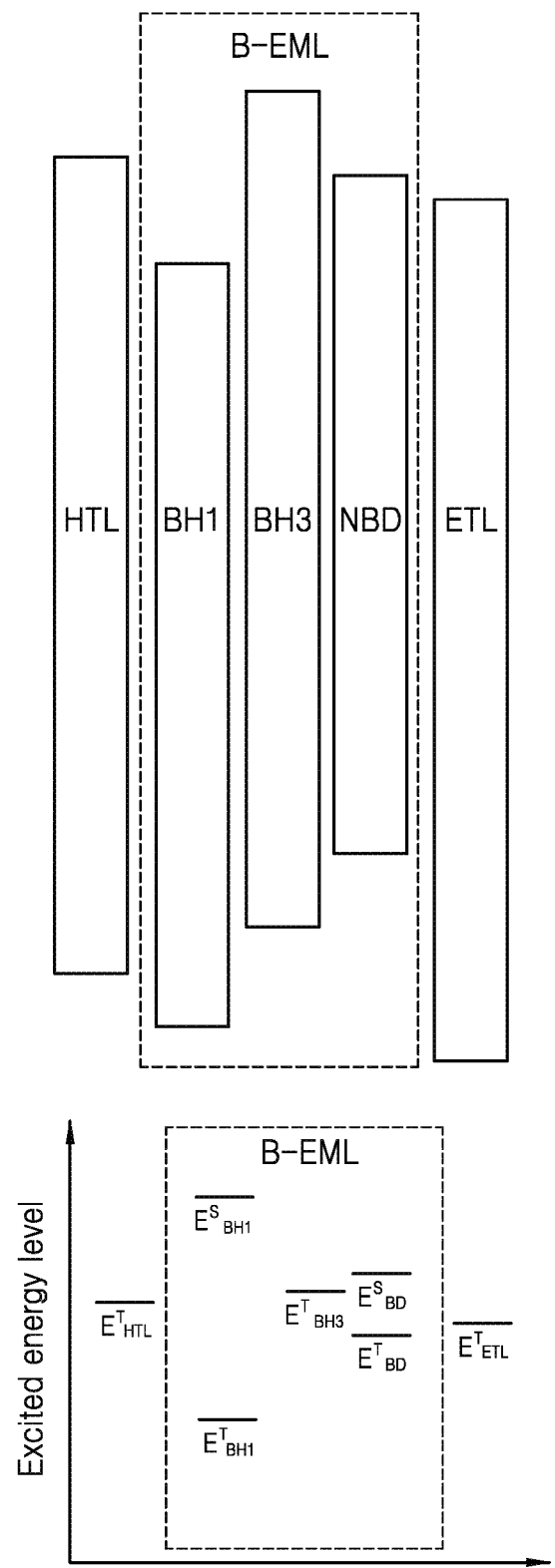
FIG. 2 is a schematic view of a bandgap energy diagram of an organic material layer of an organic electroluminescence device according to one embodiment of the present disclosure.

The organic material layer OG may include the light-emission layer (not shown). The light-emission layer (not shown) may include at least one of a blue light-emission layer, a green light-emission layer, a red light-emission layer, and a white light-emission layer. FIG. 2 shows a schematic view of a bandgap energy diagram of an organic material layer OG including a first light-emission layer that light-emits blue light.

Referring to FIG. 1 and FIG. 2, the organic material layer OG includes a hole transport layer HTL, a first light-emission layer B-EML, and an electron transport layer ETL. The first light-emission layer B-EML contains a host composition and a narrow blue dopant (NBD). The host composition contains a first host compound BH3 and a second host compound BH1.

In FIG. 2, $E^T$ HTL represents a triplet energy level of the hole transport layer HTL. $E^T$ ETL means the triplet energy level of the electron transport layer ETL. $E^T$ BH3 means a triplet energy level of the first host compound BH3. $E^T$ BH1 refers to a triplet energy level of the second host compound BH1. $E^T$ BD means a triplet energy level of a narrow blue dopant NBD.

Further, in FIG. 2, $E^S$ BH3 represents a singlet energy level of the first host compound BH3. $E^S$ BH1 refers to a singlet energy level of the second host compound BH1. $E^S$ BD means a singlet energy level of a narrow blue dopant NBD.

Referring to FIG. 2, the triplet energy level $E^T$ BH3 of the first host compound BH3 is higher than the triplet energy level $E^T$ BD of the narrow blue dopant NBD. The triplet energy level $E^T$ BH1 of the second host compound BH1 is lower than the triplet energy level $E^T$ BH3 of the first host compound BH3 and is lower than the triplet energy level $E^T$ BD of the narrow blue dopant NBD.

For example, the triplet energy level $E^T$ BH3 of the first host compound BH3 may be greater than 2.5 eV. The triplet energy level $E^T$ BH1 of the second host compound BH1 may be lower than 2.4 eV. For example, the triplet energy level $E^T$ BH3 of the first host compound BH3 may be in a range of 2.7 eV to 2.8 eV. The triplet energy level $E^T$ BH1 of the second host compound BH1 may be in a range of 1.8 eV to 1.9 eV.

An example of the first host compound BH3 may include a carbazole-based compound.

The carbazole-based compound may include at least one compound represented by the following Chemical Formula C:

<Chemical Formula C>

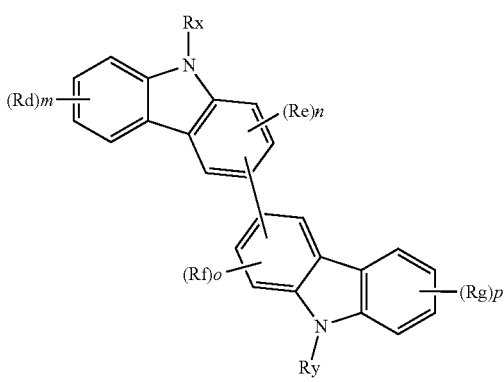

In the Chemical Formula C, each of $R_d$, $R_e$, $R_f$ and $R_g$ independently represents one selected from a group consisting of hydrogen, deuterium, halogen, a substituted or unsubstituted C1 to C6 alkyl group, a substituted or unsubstituted C3 to C6 cycloalkyl group, a substituted or unsubstituted C6 to C15 aryl group, a substituted or unsubstituted C5 to C9 heteroaryl group, a substituted or unsubstituted carbazole group, a substituted or unsubstituted dibenzofuran group, a substituted or unsubstituted dibenzothiophene group, a substituted or unsubstituted trialkylsilyl group, and a substituted or unsubstituted triarylsilyl group.

In the Chemical Formula C, each of m and p independently is an integer of 1 to 4. Each of n and o is independently an integer of 1 to 3.

In the Chemical Formula C, each of $R_x$ and $R_y$ independently represents a substituted or unsubstituted C6 to C50 monovalent aromatic hydrocarbon group.

The carbazole-based compound may include at least one compound represented by Chemical Formula C-1:

<Chemical Formula C-1>

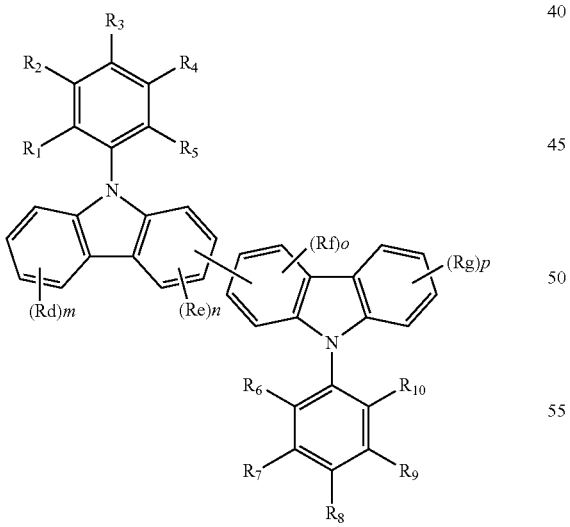

In the Chemical Formula C-1, each of $R_d$, $R_e$, $R_f$ and $R_g$ independently represents one selected from a group consisting of hydrogen, deuterium, halogen, a substituted or unsubstituted C1 to C6 alkyl group, a substituted or unsubstituted C3 to C6 cycloalkyl group, a substituted or unsubstituted C6 to C15 aryl group, a substituted or unsubstituted C5 to C9 heteroaryl group, a substituted or unsubstituted carbazole group, a substituted or unsubstituted dibenzofuran group, a substituted or unsubstituted dibenzothiophene group, a substituted or unsubstituted trialkylsilyl group, and a substituted or unsubstituted triarylsilyl group.

In the Chemical Formula C-1, each of m and p independently is an integer of 1 to 4. Each of n and o is independently an integer of 1 to 3.

In the Chemical Formula C-1, each of $R_1$, $R_2$, $R_3$, $R_4$, $R_5$, $R_6$, $R_7$, $R_8$, $R_9$, and $R_{10}$ independently represents one selected from a group consisting of hydrogen, deuterium, halogen, a substituted or unsubstituted C1 to C6 alkyl group, a substituted or unsubstituted C6 to C15 aryl group, a substituted or unsubstituted carbazole group, a substituted or unsubstituted dibenzofuran group, and a substituted or unsubstituted dibenzothiophene group.

The carbazole-based compound may include at least one of following compounds:

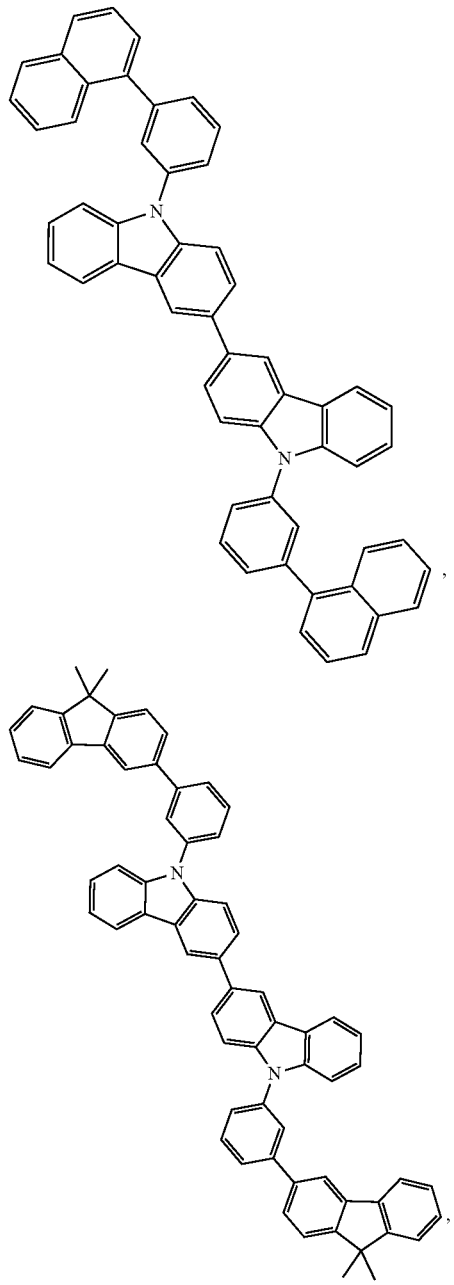

-continued
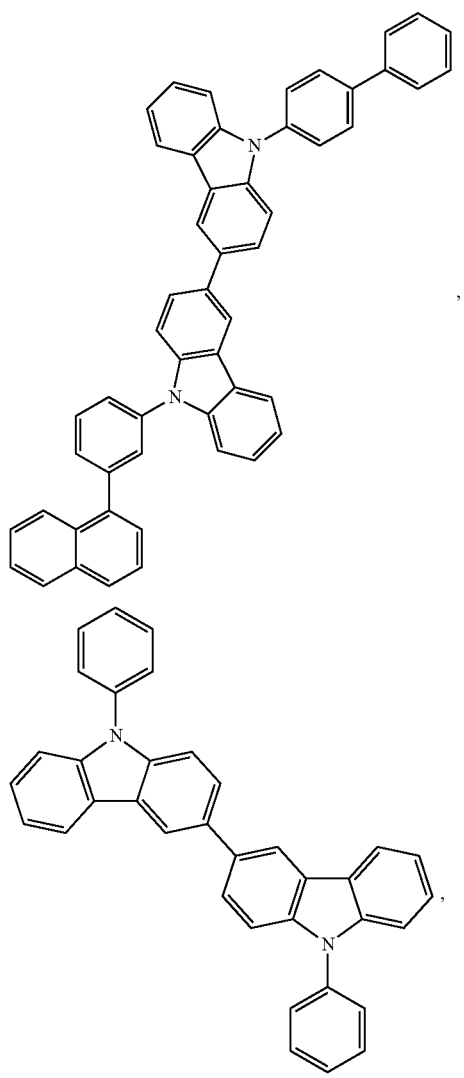
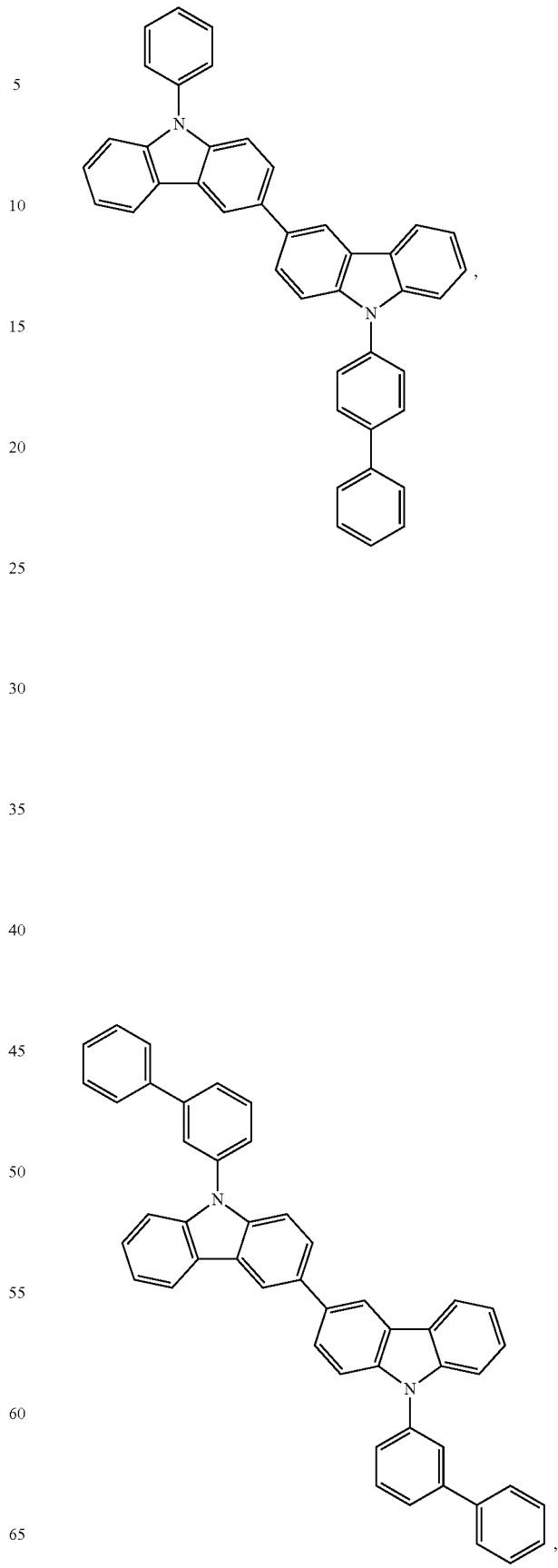

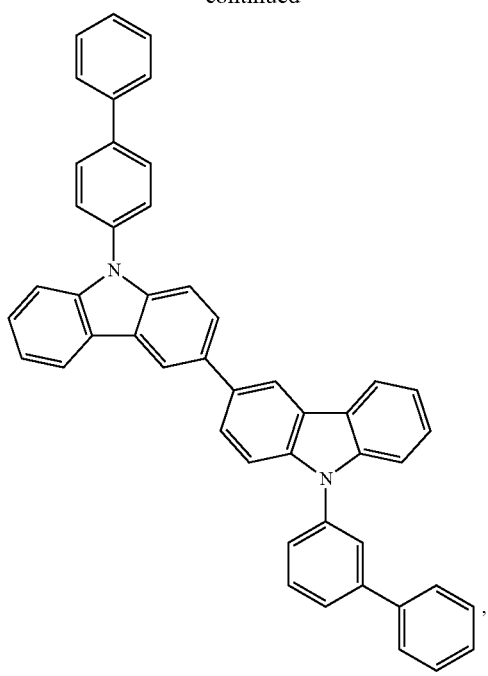
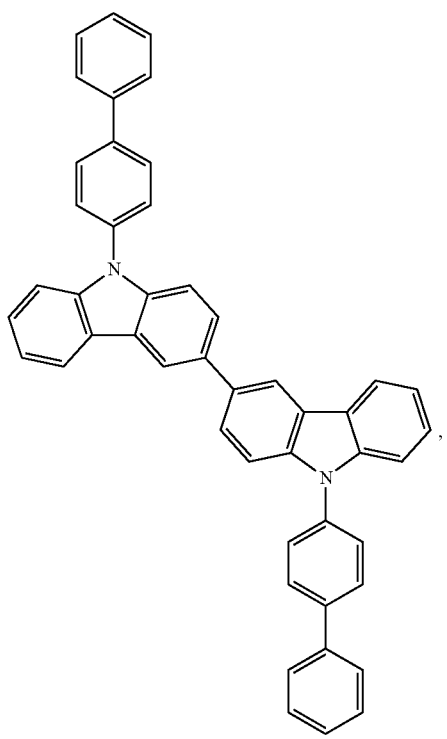
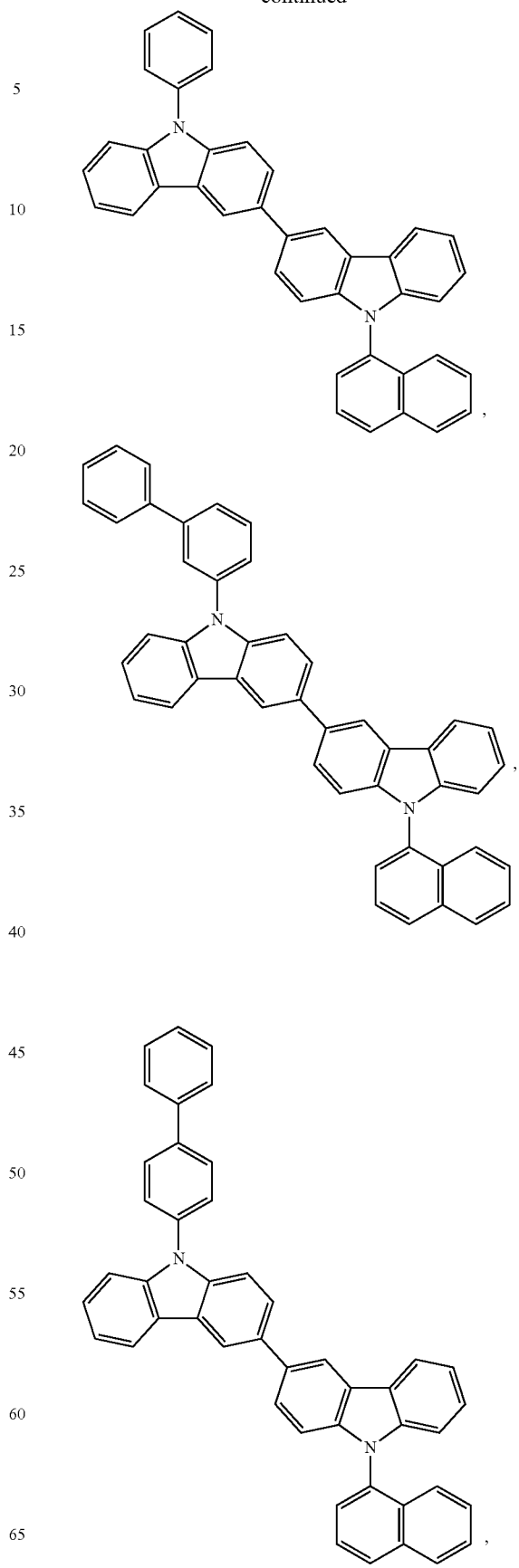

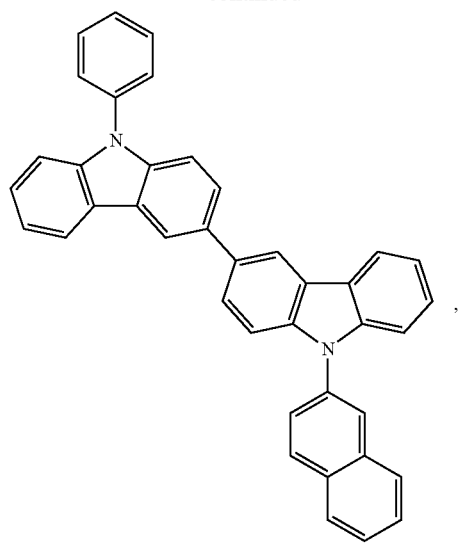
,
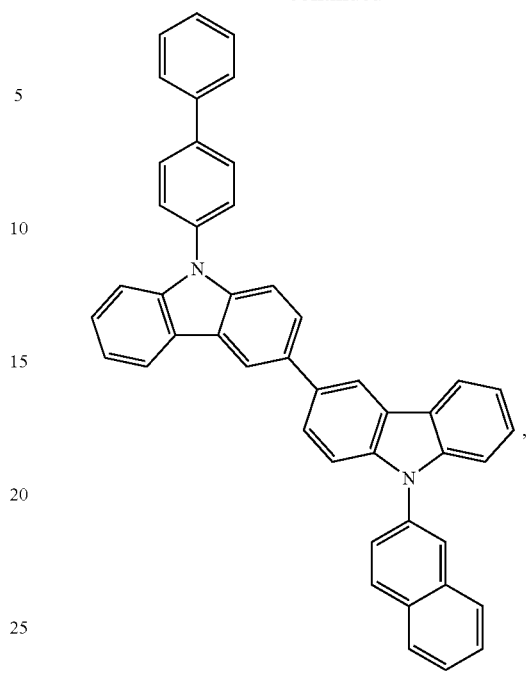
,
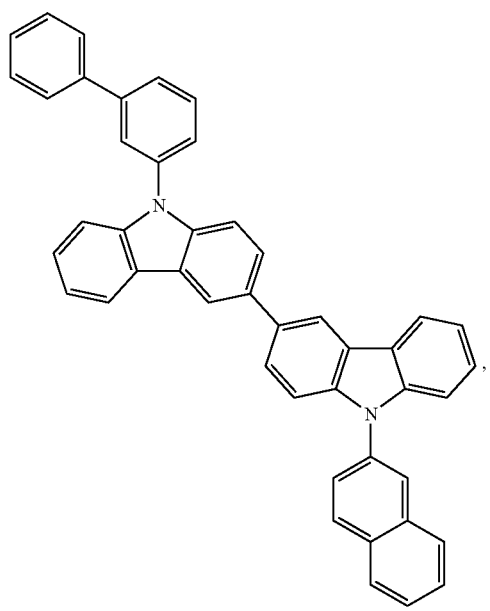
,
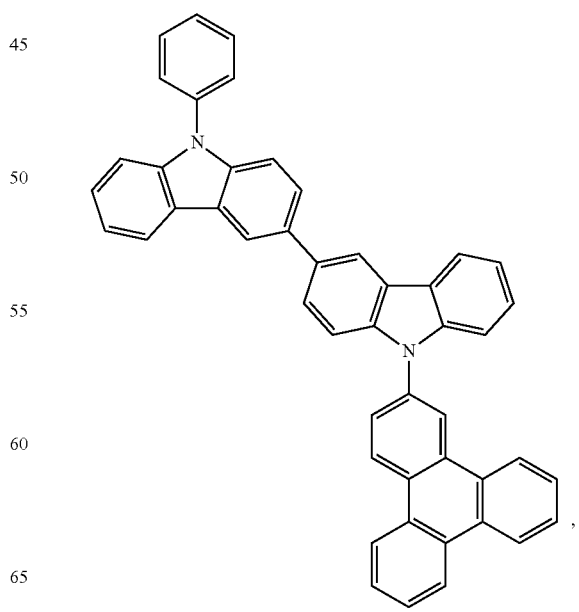
,

17
-continued
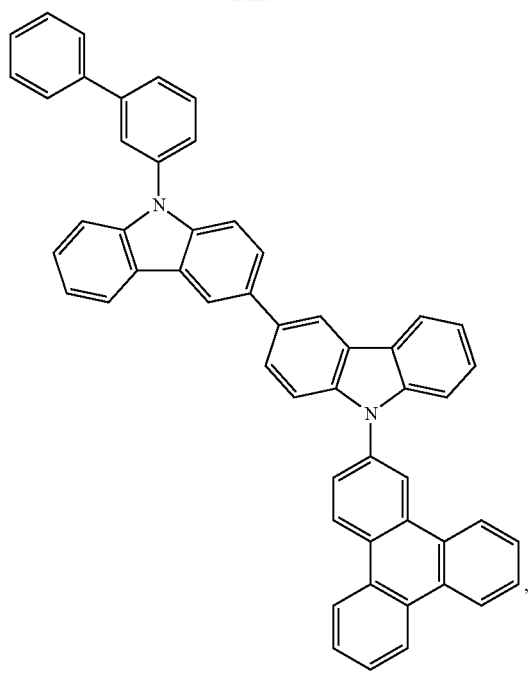
18
-continued
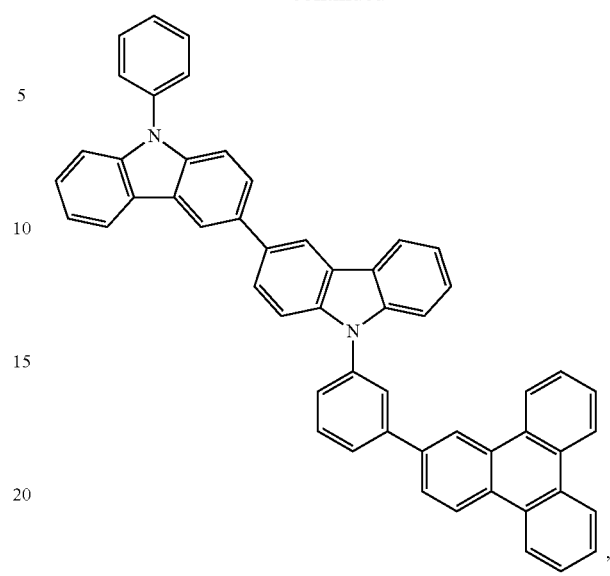
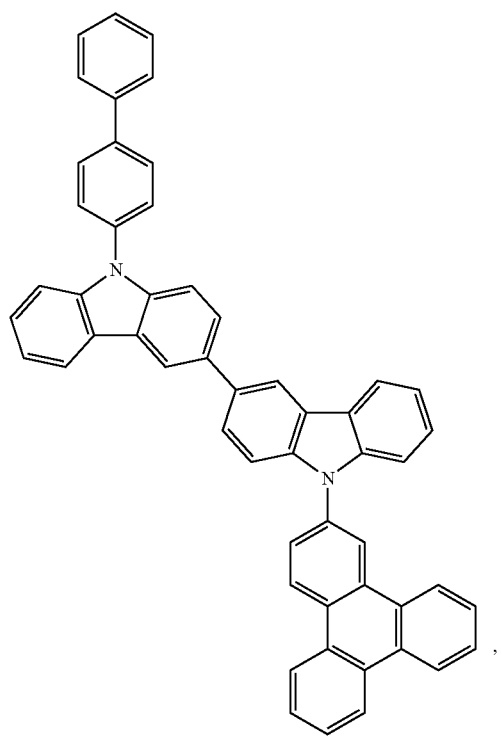
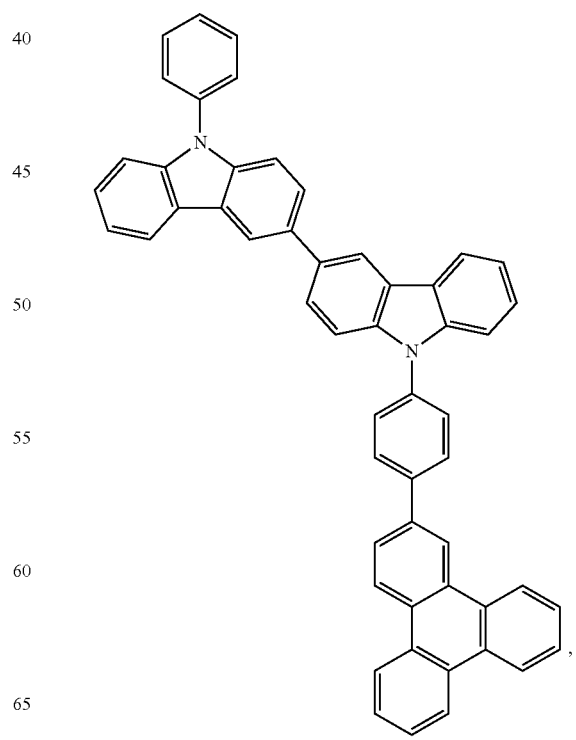

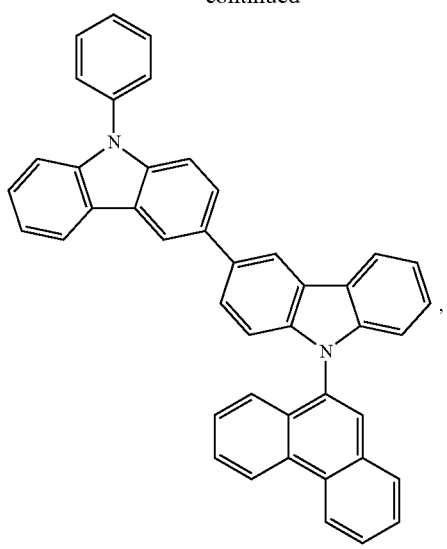
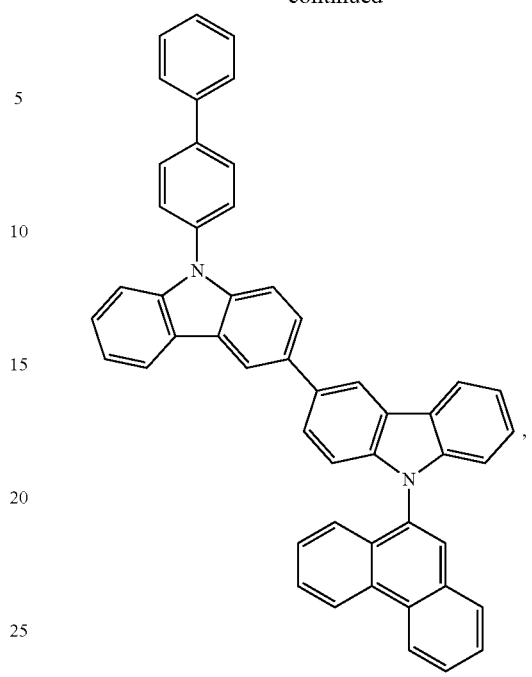

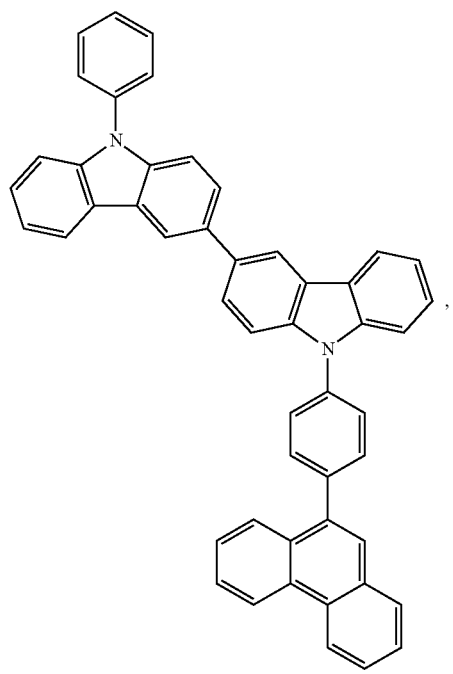
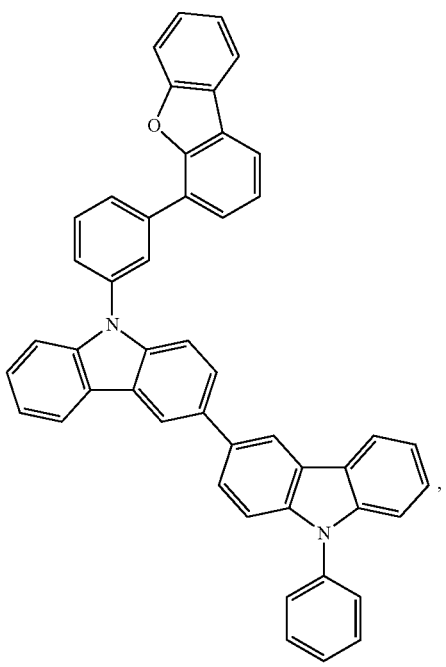
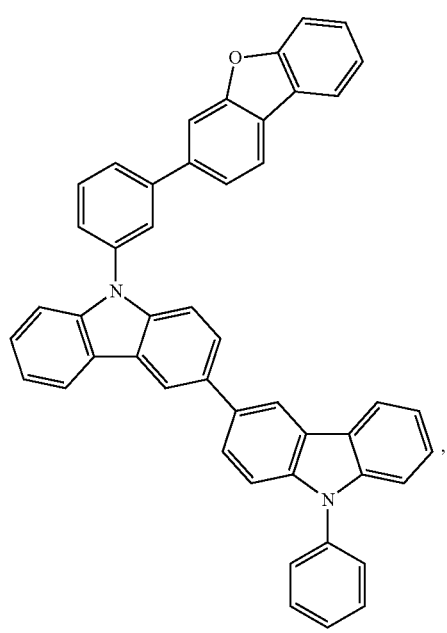
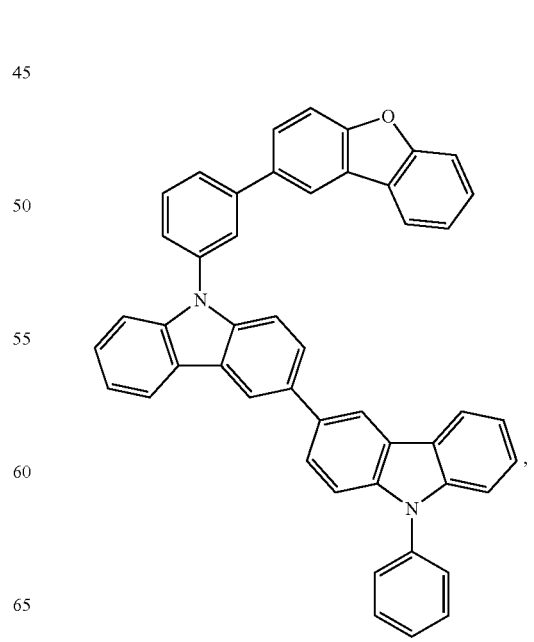

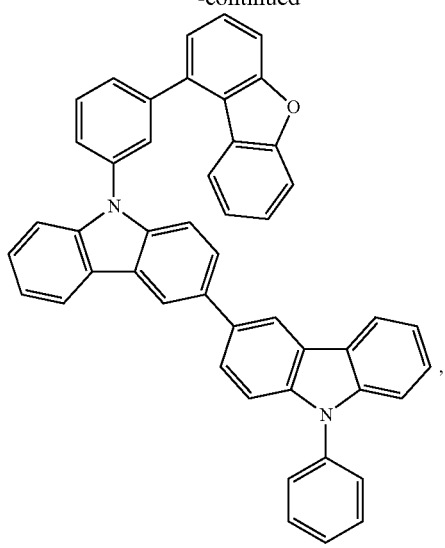
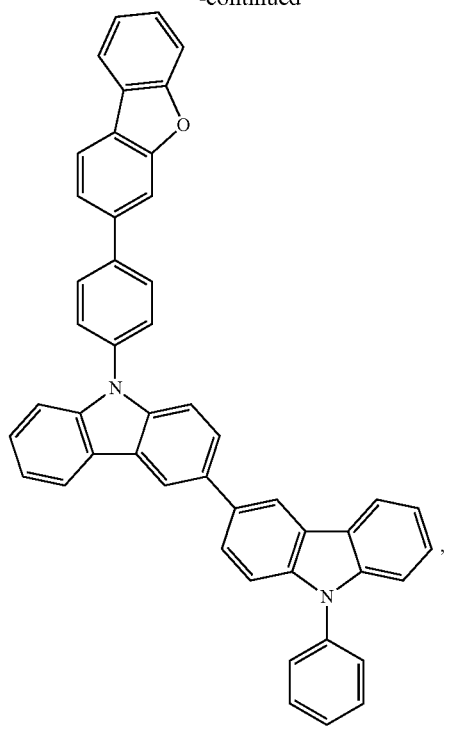
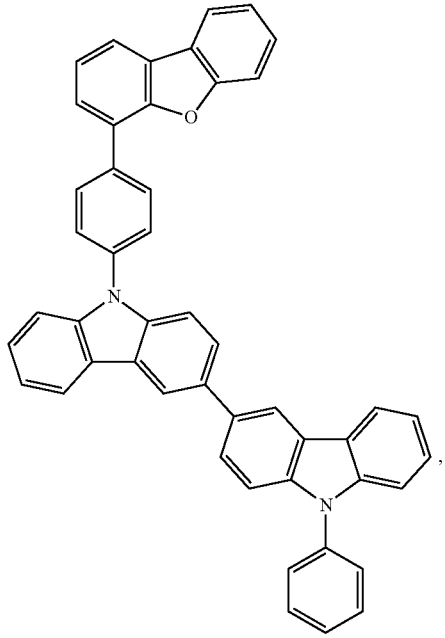
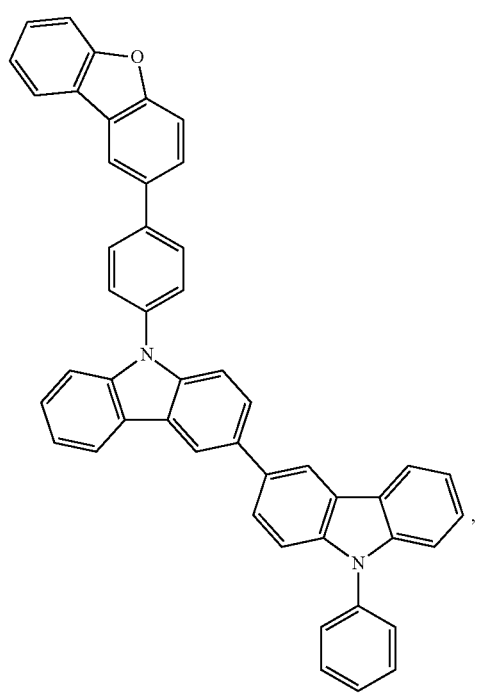

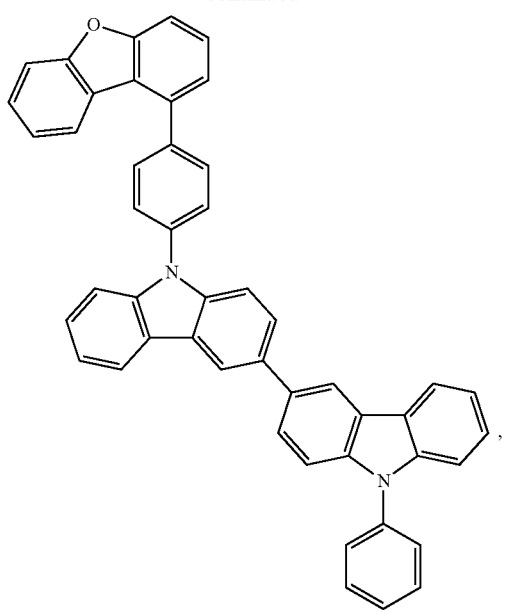
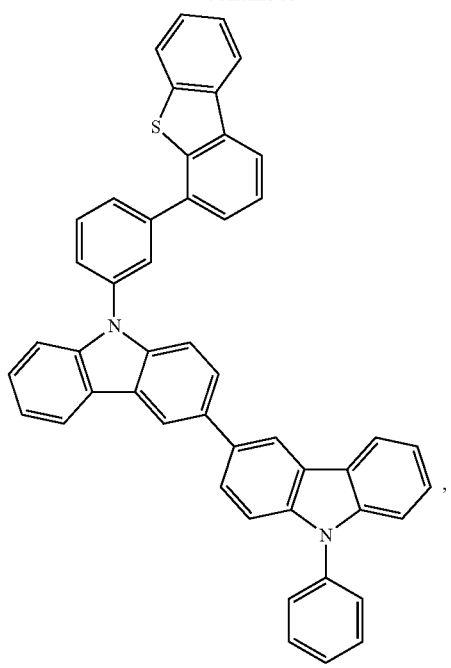
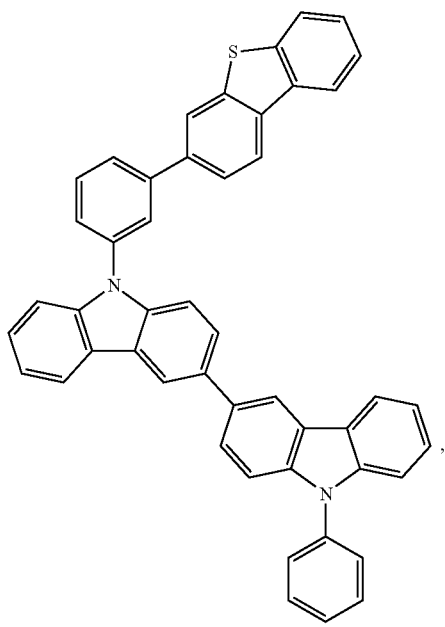
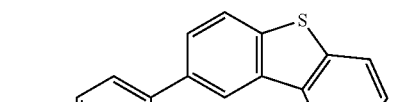

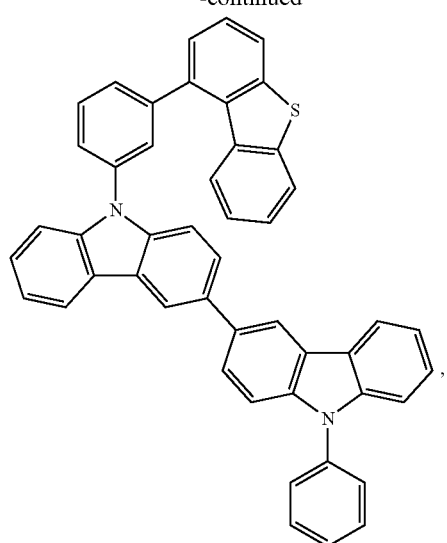
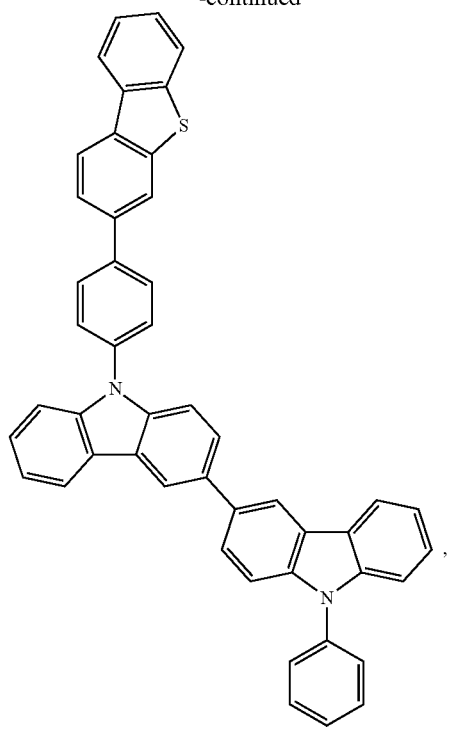
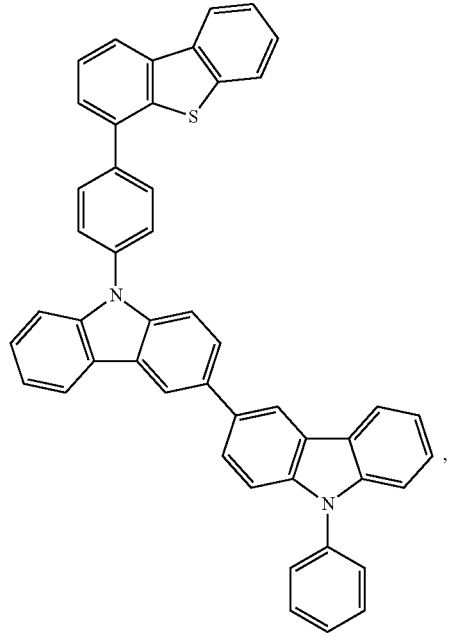
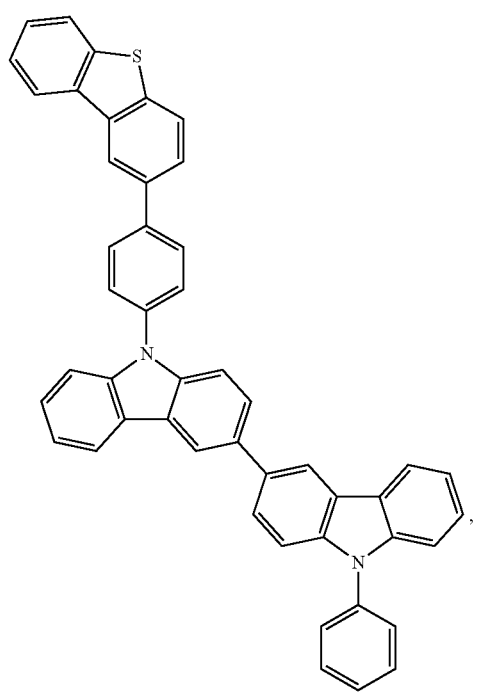

-continued
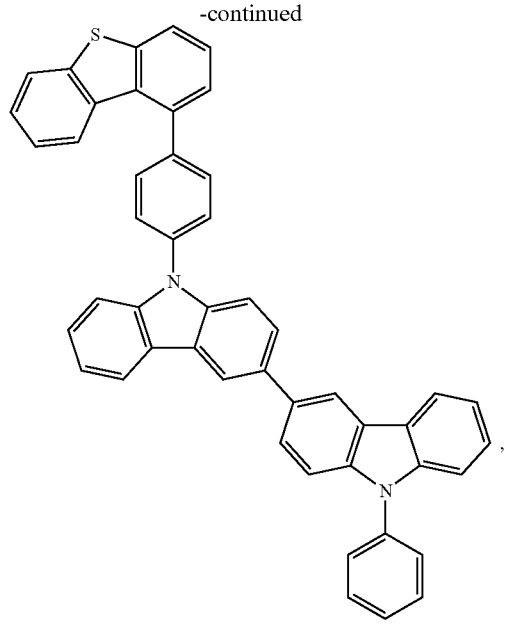
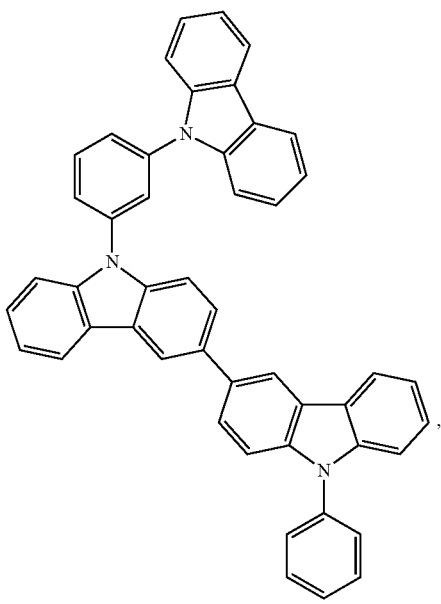
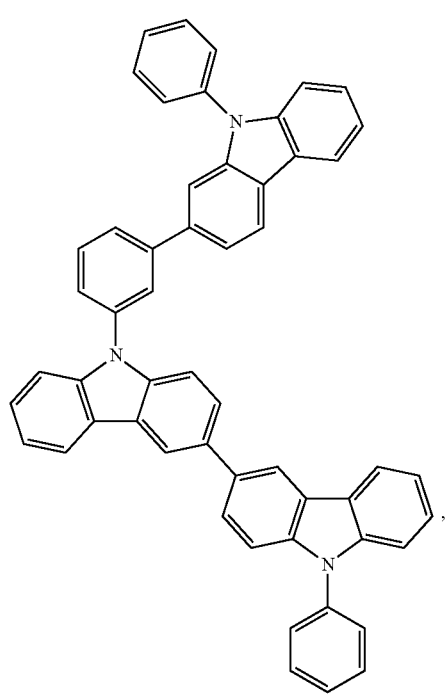
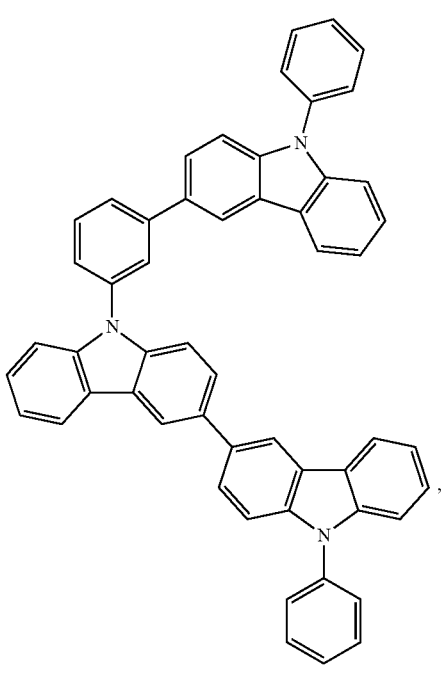

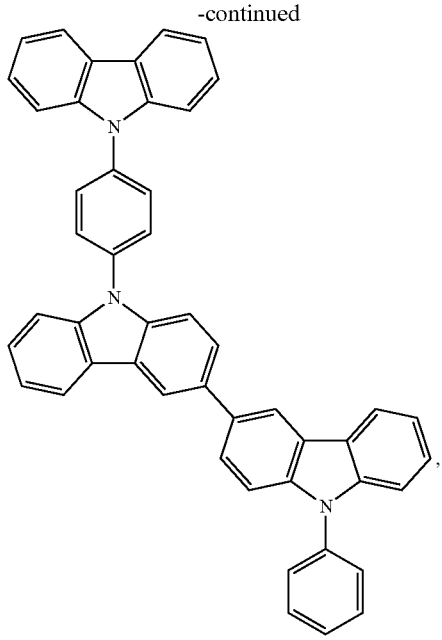

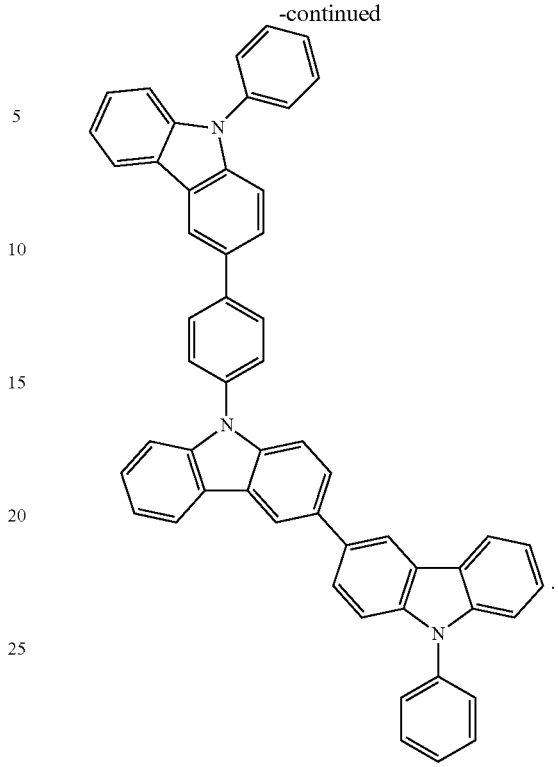

An example of the second host compound BH1 may include an anthracene-based compound.

The anthracene-based compound may include at least one compound represented by Chemical Formula H:

<Chemical Formula H>

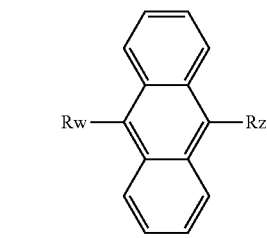

In the Chemical Formula H, each of $R_w$ and $R_z$ independently represents *—L-Ar$_n$, where * refers to a site bonded to anthracene. L is a substituted or unsubstituted C6 to C30 divalent aromatic hydrocarbon group. Ar$_n$ is a hydrogen, or a substituted or unsubstituted C6 to C50 monovalent aromatic hydrocarbon group.

The anthracene-based compound may include at least one of following compounds:

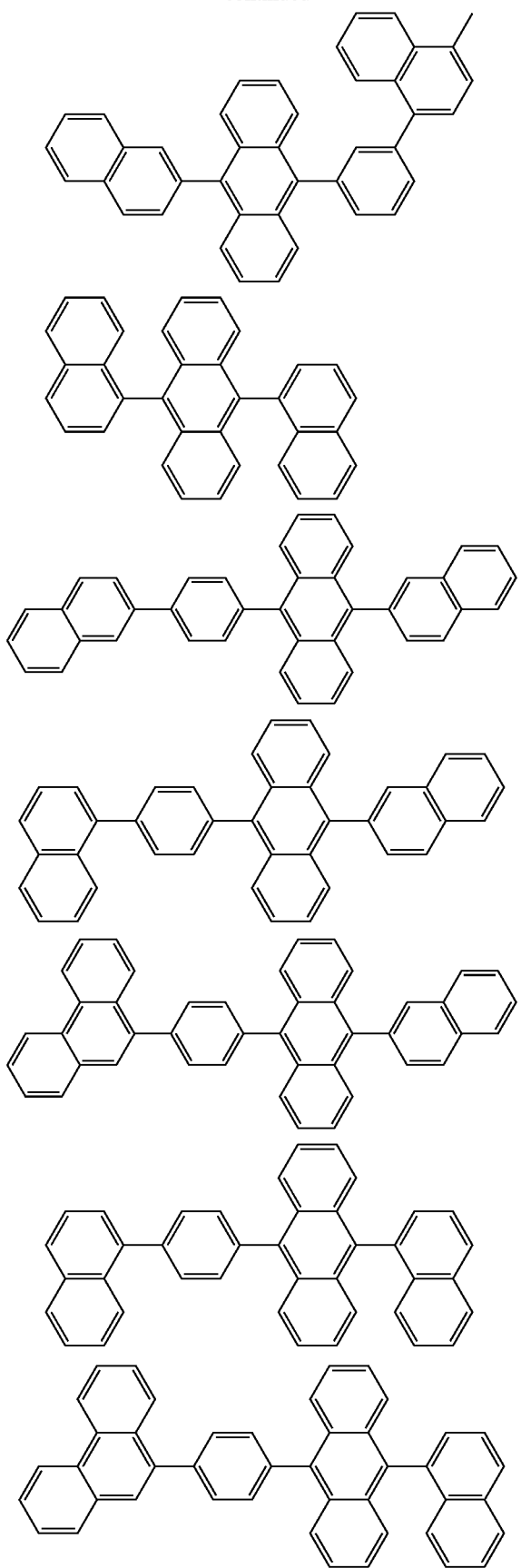

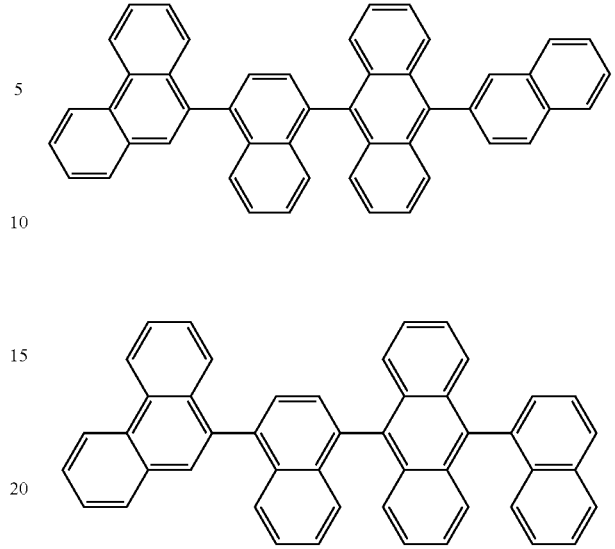

The narrow blue dopant NBD refers to a blue dopant whose full width half maximum (FWHM) is narrower than that of a conventional blue dopant in the blue light-emission wavelength curve. A molecular structure design of the narrow blue dopant NBD may allow limiting intramolecular and/or intermolecular interactions to reduce the full width half maximum (FWHM) of the light-emission wavelength, resulting in high purity blue light emission. The narrow blue dopant NBD may contribute to improved color and color rendering of the organic electroluminescence device.

The narrow blue dopant (NBD) may include at least one compound represented by Chemical Formula D:

<Chemical Formula D>

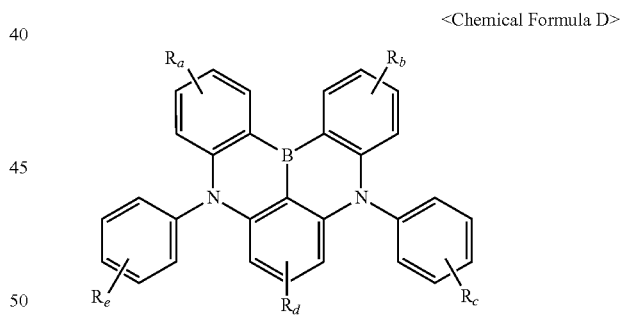

In Chemical Formula D, each of $R_a$, $R_b$, $R_c$, $R_d$ and $R_e$ independently represents one selected from a group consisting of a substituted or unsubstituted C1 to C12 monovalent aliphatic chain hydrocarbon group, a substituted or unsubstituted C3 to C20 monovalent aliphatic cyclic hydrocarbon group, a substituted or unsubstituted C6 to C60 monovalent aromatic hydrocarbon group, a substituted or unsubstituted C3 to C60 monovalent heteroaromatic hydrocarbon group, and a substituted or unsubstituted C6 to C24 arylamino. In the Chemical Formula D, at least one of the $R_a$, the $R_b$, the $R_c$, the $R_d$, and the $R_e$ may form a condensed ring with an adjacent 6-membered aromatic ring.

The narrow blue dopant NBD may include at least one of following compounds:

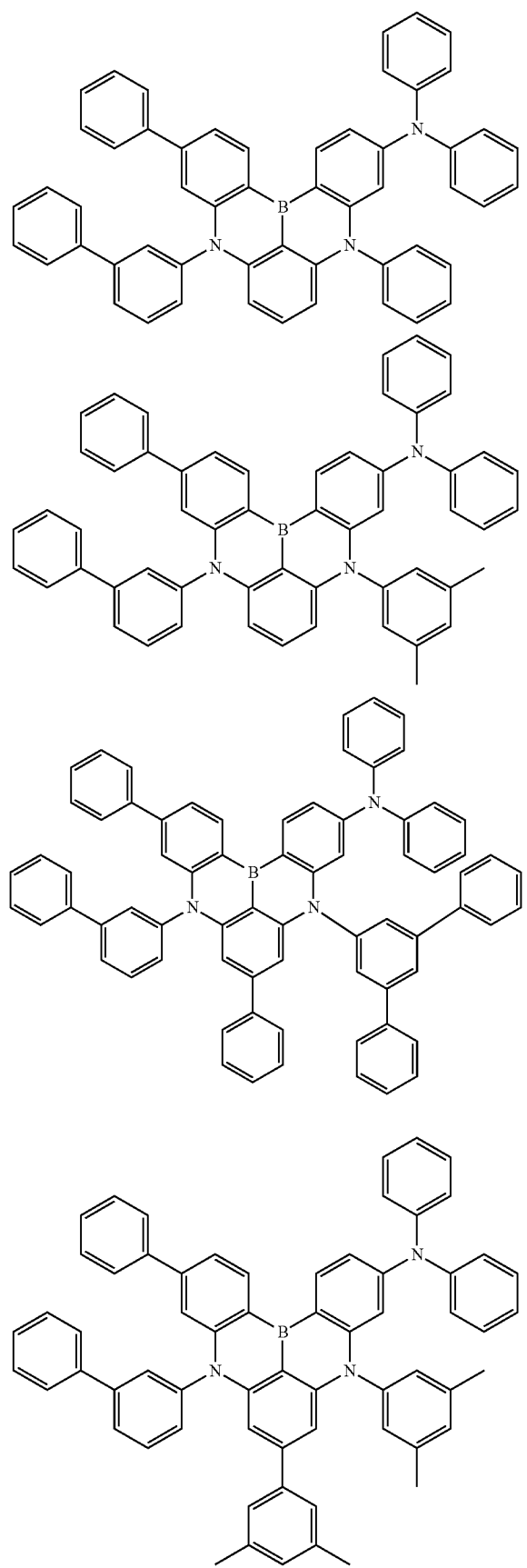
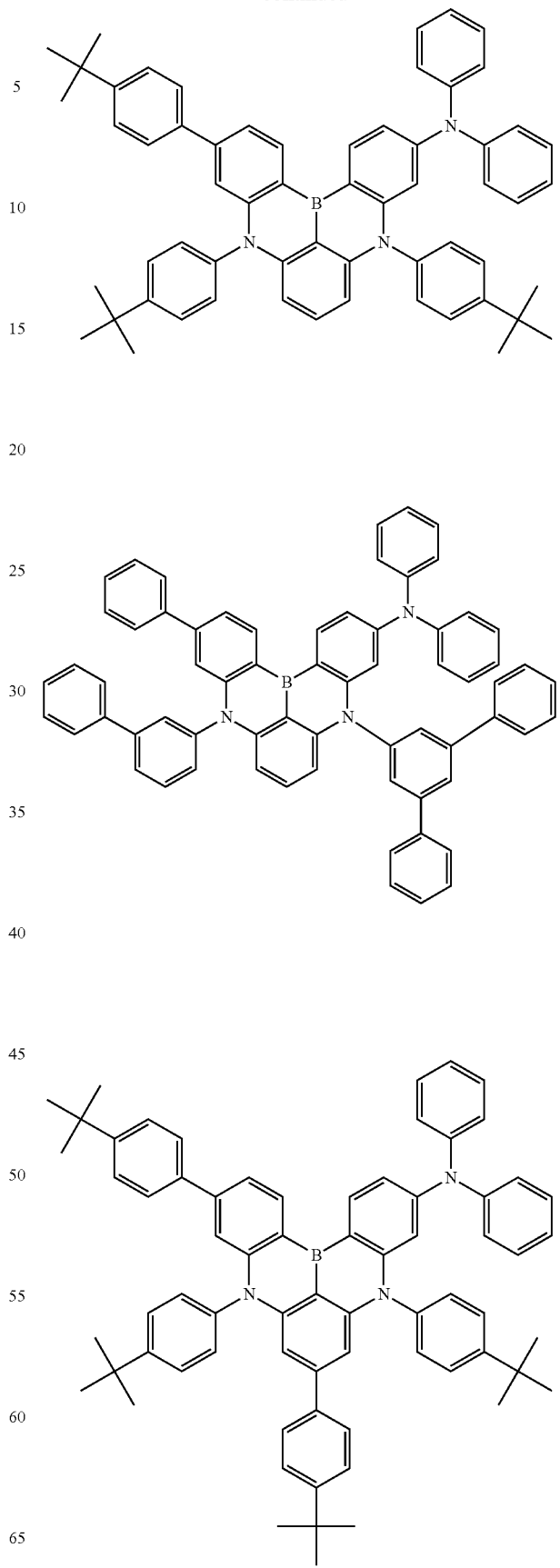

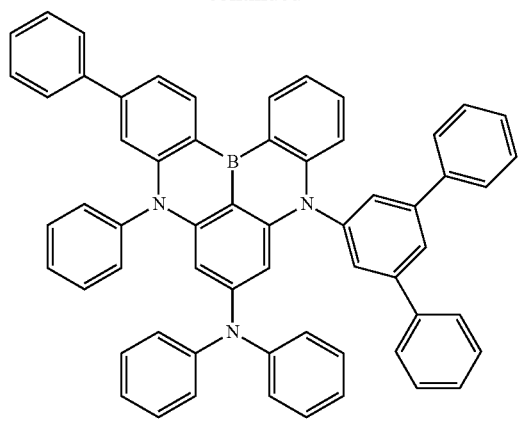

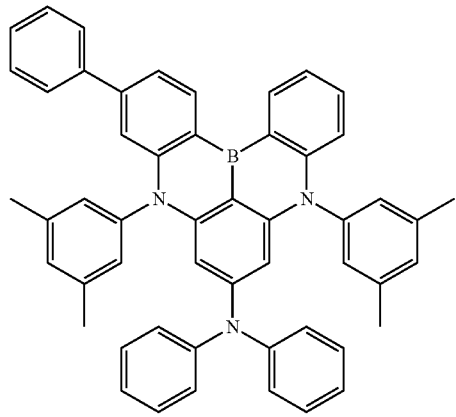

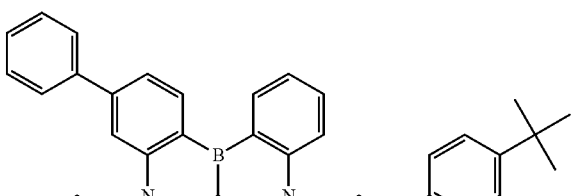

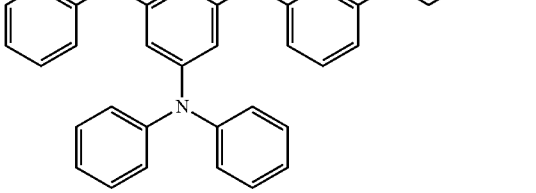

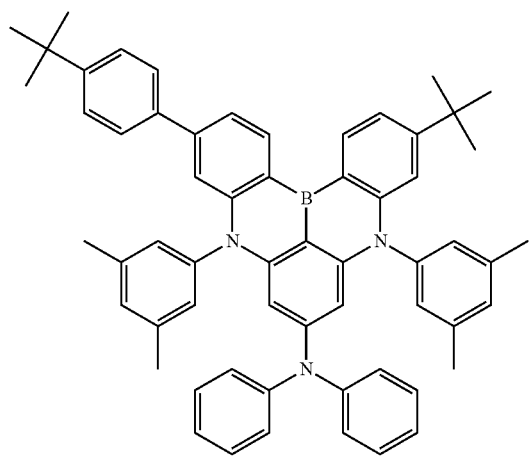

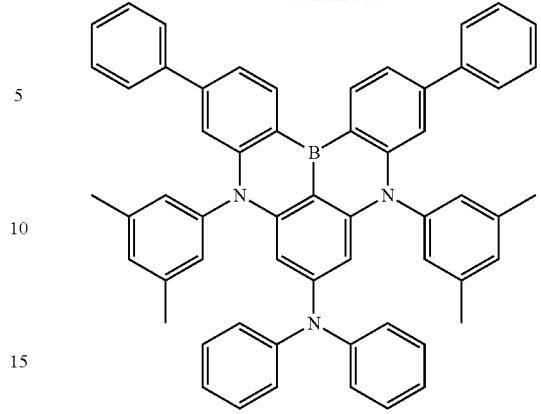

Most of excitons in the first light-emission layer B-EML are generated by hole-electron combinations in the host composition. Some of the excitons in the first light-emission layer B-EML may be generated by hole-electron combinations in compounds represented by the Chemical Formula D. Each of the compounds represented by the Chemical Formula D may have a small difference between singlet energy and triplet energy. The triplet energy of each of the compounds represented by the Chemical Formula D may be converted to the singlet energy via RISC (reverse inter-system crossing) for light-emission. The triplet energy of each of the compounds represented by the Chemical Formula D may be delivered to the triplet energy of the adjacent host material in the host composition.

In order that the triplet energy of each of the compounds represented by the Chemical Formula D is inhibited from being transferred to the triplet energy of the host material and in order to maximize TADF (thermally activated delayed fluorescence) characteristics, the first light-emission layer B-EML contains the first host compound BH3. Because the first host compound BH3 has a higher triplet energy level than those of the compounds represented by the Chemical Formula D, the first host compound BH3 may suppress a pathway via which the triplet energy of each of the compounds represented by the Chemical Formula D is delivered to the triplet energy of the host material, to improve the light-emission efficiency of the organic electroluminescence device.

Each of the compounds represented by the Chemical Formula D may act as a hole trapping material due to the energy level and the characteristics of the molecular structure thereof. The hole injected into the first light-emission layer B-EML may move directly to the compounds represented by the Chemical Formula D rather than being combined with the electron to form an exciton in the host composition. As a result, the compounds represented by the Chemical Formula D may become unstable and thus the life-span of the organic electroluminescence device may be degraded.

The carbazole-based compound has a high triplet energy and has high hole mobility. The high hole mobility of the carbazole-based compound may prevent the hole injected into the first light-emission layer B-EML from moving directly to the compounds represented by the Chemical Formula D or may minimize the hole movement directly to the compounds represented by the Chemical Formula D. In other words, the carbazole-based compound may allow holes injected into the first light-emission layer B-EML to selectively migrate to the host composition, and thus may allow exciton to be generated in the host composition.

When the first host compound BH3 includes the carbazole-based compound, the life-span of the organic field organic electroluminescence device (1000 in FIG. 1) may be increased. This may be because the formation of hole and electron pairs occurs not only in a peripheral region of the hole transport layer HTL but also entirely in the first light-emission layer B-EML and thus the formation of the exciton may occur entirely in the first light-emission layer B-EML.

The high hole mobility of the carbazole-based compound may facilitate the injection and transport of charges into and in the organic electroluminescence device (100 in FIG. 1). Thus, when the first host compound BH3 includes the carbazole-based compound, a driving voltage of the organic electroluminescence device is reduced.

The present inventors have confirmed that driving voltage, current efficiency, external quantum efficiency and life-span characteristics of the organic electroluminescence device were changed according to a composition ratio of the first host compound BH3, the second host compound BH1 and the narrow blue dopant NBD.

A content of the first host compound BH3 is lower than a content of the second host compound BH1. When the content of the first host compound BH3 is higher than the content of the second host compound BH1, the current efficiency, external quantum efficiency and life-span characteristics of the organic electroluminescence device were significantly lower than in a case when the host material of the first light-emission layer B-EML was only composed of the second host compound BH1.

The organic electroluminescence device (100 in FIG. 1) may satisfy Equation I:

$$X+Y=24 \qquad \text{(Equation I)}$$

In the Equation I, X refers to a ratio of a mass of the first host compound BH3 to a mass of the narrow blue dopant NBD. In the Equation I, Y refers to a ratio of a mass of the second host compound BH1 to a mass of the NBD. For example, the X may be a mass value of the first host compound BH3 when the mass value of the NBD is 1. Further, the Y may be a mass value of the second host compound BH1 when the mass value of the NBD is 1.

The Y has a larger value than the X. When the X has a larger value than the Y, the current efficiency, external quantum efficiency and life-span characteristics of the organic electroluminescence device were significantly lower than in a case when the host material of the first light-emission layer B-EML was composed of only the second host compound BH1.

In the Equation I, Y is a rational number from 14 to 22. When the Y is smaller than 14, the current efficiency, external quantum efficiency, and life-span characteristics of the organic electroluminescence device were significantly lower than in a case when the host material of the first light-emission layer B-EML was composed only of the second host compound BH1. When the Y is greater than 22, the current efficiency, external quantum efficiency and life-span characteristics of the organic electroluminescence device were similar to those in a case when the host material of the first light-emission layer B-EML was only composed of the second host compound BH1.

For example, the Y may be a rational number from 16 to 21. When the Y is a rational number from 16 to 21, the current efficiency, external quantum efficiency, and life-span characteristics of the organic electroluminescence device were greatly improved compared to a case where the host material of the first light-emission layer B-EML was composed of only the second host compound BH1. Further, when the Y was a rational number from 16 to 21, a driving voltage of the organic electroluminescence device was reduced.

A ratio of the X and the Y (hereinafter referred to as X:Y) may be in a range of 1:9 to 4:6. When the X:Y is greater than 4:6, the current efficiency, external quantum efficiency, and life-span characteristics of the organic electroluminescence device were significantly lower than those in a case when the host material of the first light-emission layer B-EML was composed of only the second host compound BH1.

When the X:Y is smaller than 1:9, the current efficiency, external quantum efficiency and life-span characteristics of the organic electroluminescence device were similar to those in a case when the host material of the first light-emission layer B-EML was composed of only the second host compound BH1.

For example, the X:Y may be in a range of 2:8 to 3:7. When the X:Y is in a range of 2:8 to 3:7, the current efficiency, external quantum efficiency, and life-span characteristics of the organic electroluminescence device were greatly improved compared to a case where the host material of the first light-emission layer B-EML was composed of only the second host compound BH1. Further, when the X:Y is in a range of 2:8 to 3:7, the driving voltage of the organic electroluminescence device was reduced.

The first light-emission layer B-EML may contain the NBD at a range of 1 wt % to 5 wt %.

The organic electroluminescence device may be embodied as a white organic electroluminescence device. In this connection, the organic electroluminescence device may be designed, for example, to have an RGB direct stacked structure, a quantum well structure, or a multilayer light-emission structure.

The RGB direct stacked structure contains an anode, a hole transport layer, a light-emission layer, an electron transport layer, and a cathode, in which the light-emission layer has a structure in which a red light-emission layer, a green light-emission layer, and a blue light-emission layer are directly stacked vertically. The quantum well structure contains an anode, a hole transport layer, a light-emission layer, an electron transport layer, and a cathode, in which the light-emission layer has a structure in which a red light-emission layer, a green light-emission layer, a blue light-emission layer, and a hole blocking layer are directly stacked vertically while the hole blocking layer is interposed between the red light-emission layer and the green light-emission layer, and between the green light-emission layer and the blue light-emission layer.

The organic electroluminescence device having the multi-layer light-emission structure contains an anode, n stacks, n−1 charge generation layers (CGLs), and a cathode, in which each of the n stacks many contain a hole transport layer, a light-emission layer, and an electron transport layer, and in which each of the n−1 charge generation layers contains an n-type charge generation layer and a p-type charge generation layer. The n stacks are placed between the anode and the cathode. Each of the n−1 charge generation layers is placed between adjacent stacks of the n stacks. Each of the n stacks may further contain a hole injection layer, an electron injection layer, and like. The n may be a natural number of 2 or greater. For example, the n may be a natural number from 2 to 4.

Figure 3:
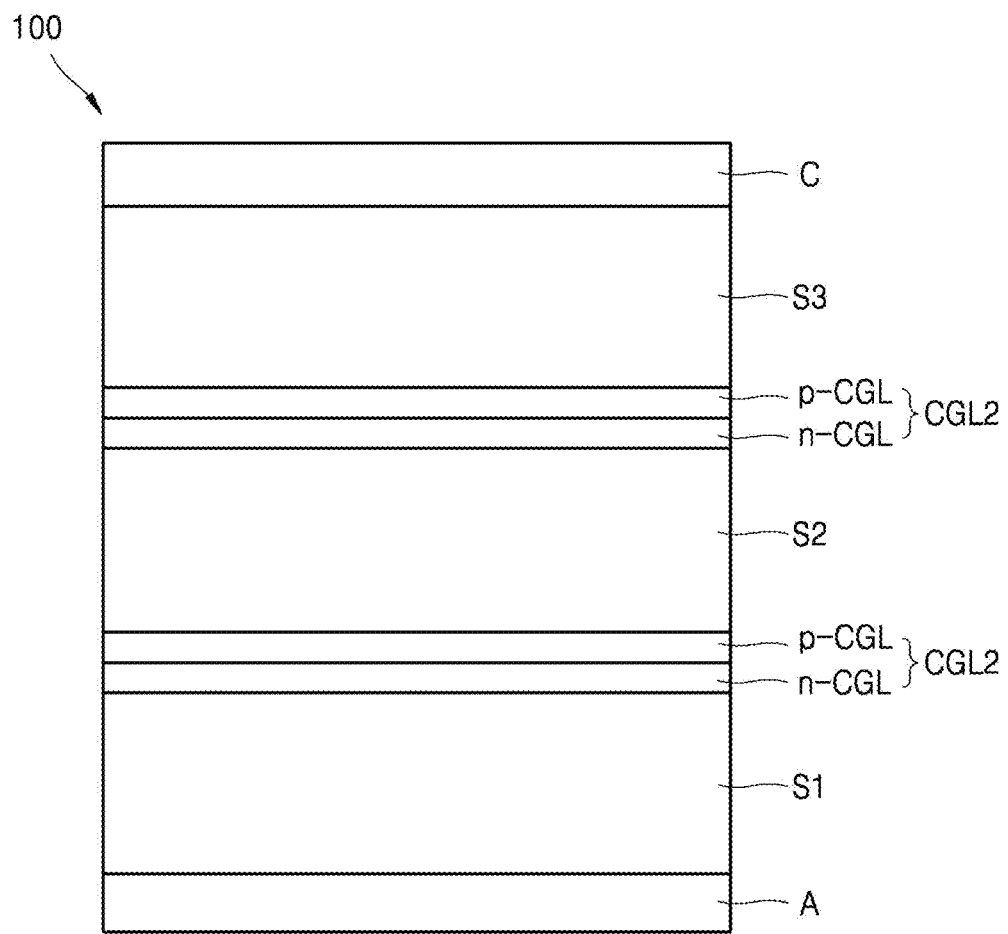
FIG. 3 is a schematic diagram of an organic electroluminescence device with a multilayer light-emission structure according to one embodiment of the present disclosure.
Figure 4:
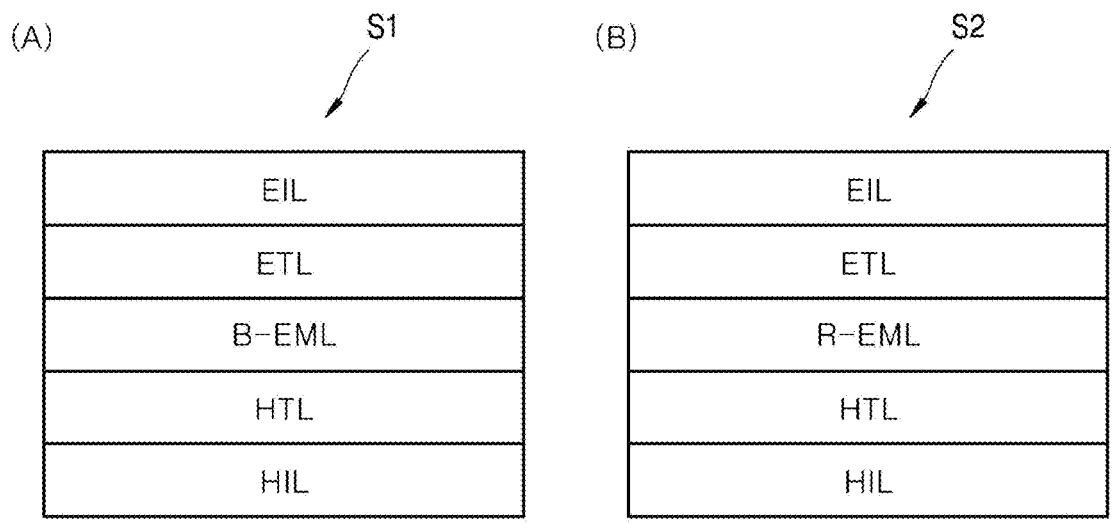
FIG. 4 is a schematic diagram of first and second stacks used in the organic electroluminescence device of the multilayer light-emission structure of FIG. 3. A is a schematic diagram of the first stack, and (B) is a schematic diagram of the second stack.

FIG. 3 shows a schematic diagram of an organic electroluminescence device 100 according to one implementation of the present disclosure. FIG. 4 shows schematic diagrams of a first stack S1 and a second stack S2, respectively. In FIG. 4, (A) is a schematic diagram of the first stack S1 while (B) is a schematic diagram of the second stack S2.

Referring to FIG. 3 and FIG. 4, the organic electroluminescence device 100 having a multilayer light-emission structure will be described below.

Referring to FIG. 3, an organic electroluminescence device 100 include an anode A, a cathode C, stacks S1, S2 and S3, and charge generation layers CGL1 and CGL2. The stacks S1, S2, and S3 are disposed between the anode A and the cathode C. Each of the charge generation layers CGL1 and CGL2 is disposed between adjacent stacks of the stacks S1, S2 and S3. Specifically, the first charge generation layer CGL1 is disposed between the first stack S1 and the second stack S2 while the second charge generation layer CGL2 is disposed between the second stack S2 and the third stack S3.

As shown in FIG. 4, the first stack S1 contains a hole injection layer HIL, a hole transport layer HTL, a first light-emission layer B-EML, an electron transport layer ETL, and an electron injection layer EIL. The second stack S2 contains a hole injection layer HIL, a hole transport layer HTL, a second light-emission layer R-EML, an electron transport layer ETL and an electron injection layer EIL.

The hole injection layer HIL plays a role in injection of holes from the anode to the light-emission layer. In one example, the hole injection layer HIL may contain at least one selected from a group consisting of HAT-CN, CuPu (cupper phthalocyanine), PEDOT (poly 3,4)-ethylenedioxythiophene), PEDOT:PSS (poly 3,4)-ethylenedioxythiophene) poly(styrenesulfonate)), PANI (polyaniline), and NPD (N,N-dinaphthyl-N,N'-diphenyl benzidine).

The hole transport layer HTL may act to facilitate transport of holes. In one example, the hole transport layer HTL may contain at least one selected from a group consisting of NPD (N,Ndinaphthyl-N,N'-diphenylbenzidine), TPD (N,N'-bis-3-methylphenyl)-N,N'-bis-(phenyl)-benzidine), s-TAD, and MTDATA (4,4',4"-Tris(N-3-methylphenyl-N-phenylamino)-triphenylamine).

The electron transport layer ETL may act to facilitate transport of electrons. In one example, the electron transport layer ETL may contain at least one selected from a group consisting of Alq3 (tris(8-hydroxyquinolino)aluminum), PBD, TAZ, spiro-PBD, BAlq, and SAlq.

The electron injection layer EIL may act to facilitate injection of electrons. In one example, the electron injection layer EIL may contain at least one selected from a group consisting of Alq3 (tris(8-hydroxyquinolino)aluminum), PBD, TAZ, spiro-PBD, BAlq, and SAlq.

The first light-emission layer B-EML may be embodied as a blue light-emission layer for blue light-emission. The second light-emission layer R-EML light-emits light of a wavelength longer compared to a blue wavelength. In one example, the second light-emission layer R-EML may be embodied as a red light-emission layer, a green light-emission layer, and a yellow-green light-emission layer.

The yellow-green light-emission layer may contain a combination of a host material with excellent hole-transfer characteristics and a host material with excellent electron-transfer characteristics. Controlling the balance between the numbers of electrons and holes in the yellow-green light-emission layer via the combination of the two type host materials with different characteristics may improve the life-span and efficiency characteristics of the organic electroluminescence device 100. The imbalance between the numbers of the electrons and holes in the yellow-green light-emission layer may cause the accumulation of specific polarity charges at the interface of each functional layer, which may reduce the life-span and efficiency of the organic electroluminescence device 100. An example of the host material having excellent hole transfer characteristics is CBP, while an example of a host material with excellent electron transfer characteristics is BA1q.

Referring to FIG. 3 and FIG. 4, the first stack S1 and second stack S2 are located between the anode A and cathode C. The first stack S1 is placed between the anode A and second stack S2. The first stack S1 may have a structure in which the hole injection layer HIL, the hole transport layer HTL, the first light-emission layer B-EML, the electron transport layer ETL, and the electron injection layer EIL are sequentially stacked in this order from the anode A to the cathode C. The second stack S2 has a structure in which the hole injection layer HIL, the hole transport layer HTL, the second light-emission layer R-EML, the electron transport layer ETL, and the electron injection layer EIL are sequentially stacked in this order to the cathode C from the first stack S1.

Although a detailed structure of the third stack S3 is not shown in FIG. 3 and FIG. 4, the third stack S3 may contain, like the second stack S2, a hole injection layer, a hole transport layer, a light emission layer (referred to as a third light-emission layer for convenience of description) to light-emit light of a wavelength longer compared to a blue wavelength, an electron transport layer, and an electron injection layer. The third stack S3 has a structure in which the hole injection layer, the hole transport layer, the third light-emission layer, the electron transport layer, and the electron injection layer are sequentially stacked in this order from the second stack S2 to the cathode C.

Referring again to FIG. 3, each of the charge generation layers CGL1 and CGL2 may contain an n-type charge generation layer n-CGL and a p-type charge generation layer p-CGL. Each of the charge generation layers CGL1 and CGL2 may control a charge balance between adjacent stacks of the stacks S1, S2, and S3. Specifically, the first charge generation layer CGL1 controls the charge balance between the first stack S1 and the second stack S2, while the second charge generation layer CGL2 controls the charge balance between the second stack S2 and the third stack S3.

The n-type charge generation layer n-CGL of the first charge generation layer CGL1 helps to inject electrons into the first stack S1, while the p-type charge generation layer p-CGL of the first charge generation layer CGL1 assists in the injection of holes into the second stack S2. The n-type charge generation layer n-CGL of the second charge generation layer CGL2 helps to inject electrons into the second stack S2, while the p-type charge generation layer p-CGL of the second charge generation layer CGL2 assists in the injection of holes into the third stack S3.

Referring again to FIG. 3 and FIG. 4, the n-type charge generation layer n-CGL of the first charge generation layer CGL1 may be disposed between the first stack S1 and the second stack S2, while the p-type charge generation layer p-CGL of the first charge generation layer CGL1 may be disposed between the n-type charge generation layer n-CGL of the first charge generation layer CGL1 and the second stack S2. The n-type charge generation layer n-CGL of the first charge generation layer CGL1 may be disposed between the first light emission layer B-EML and the second light emission layer R-EML while the p-type charge generation layer p-CGL of the first charge generation layer CGL1 may be disposed between the n-type charge generation layer n-CGL of the first charge generation layer CGL1 and the second light emission layer (R-EML). The n-type charge generation layer n-CGL of the first charge generation layer CGL1 may be disposed between the electron transport layer ETL of the first stack S1 and the hole transport layer HTL of the second stack S2 while the p-type charge generation layer p-CGL of the first charge generation layer CGL1 may be disposed between the n-type charge generation layer n-CGL of the first charge generation layer CGL1 and the hole transport layer HTL of the second stack S2.

As for the second charge generation layer CGL2 disposed between the second stack S2 and the third stack S3, the n-type charge generation layer n-CGL of the second charge generation layer CGL2 may be disposed between the electron transport layer ETL of the second stack S2 and the hole transport layer of the third stack S3 while the p-type charge generation layer p-CGL of the second charge generation layer CGL2 may be disposed between the n-type charge generation layer n-CGL of the second charge generation layer CGL2 and the hole transport layer of the third stack S3.

The n-type charge generation layer n-CGL is formed by doping an electron transport material with an alkali metal or an alkaline earth metal. The electron transport material may have a fused aromatic ring including a heterocycle. Examples of the alkali metal or the alkaline earth metal may include lithium (Li), sodium (Na), magnesium (Mg), calcium (Ca), cesium (Cs) and the like. The p-type charge generation layer p-CGL contains a hole transport material.

Hereinafter, comparative experimental results showing that the first light-emission layer contributes to the performance improvement of the organic electroluminescence device will be described. The comparative experiments were carried out based on organic electroluminescence devices as produced according to Examples and organic electroluminescence devices as produced according to Comparative Examples as follows.

EXAMPLE 1

A hole injection layer, a hole transport layer, a blue light-emission layer, an electron transport layer, an electron injection layer, and a cathode were deposited onto an ITO substrate in an order of following (a) to (f), under about $5 \times 10^{-6}$ to $7 \times 10^{-6}$ torr vacuum, via evaporation from a heated boat, to form an organic electroluminescence device (ITO/HIL/HTL/EML/ETL/EIL/Cathode). Then, the device was transferred from a deposition chamber to a drying box and subsequently encapsulated using UV cured epoxy and moisture getter.

The ITO substrate was washed with UV ozone before use and then loaded into an evaporation system. Thereafter, the ITO substrate was transferred into a vacuum deposition chamber in which following (a) to (f) were conducted to deposit the hole injection layer, the hole transport layer, the light-emission layer, the electron transport layer, the electron injection layer and the cathode on the ITO substrate in this order.

(a) hole injection layer (thickness 50 Å): HAT-CN was used as a material of the hole injection layer:

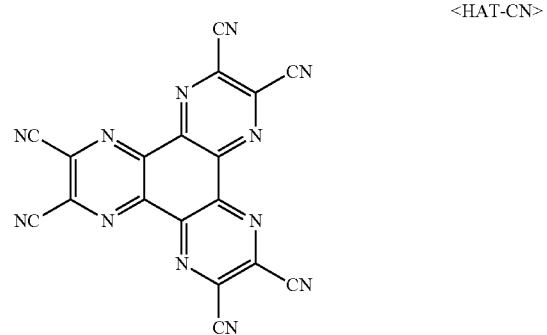 [SMILES: N#Cc1nc2c3nc(C#N)c(C#N)nc3c3nc(C#N)c(C#N)nc3c2nc1C#N]

<HAT-CN>

(b) hole transport layer (thickness 200 Å): HTL was used as a material of the hole transport layer:

<HTL>

(c) blue light-emission layer: a first light-emission layer (thickness 200 Å) was deposited on the hole transport layer. BH3 was used as the first host compound, BH1 was used as the second host compound, and the narrow blue dopant NBD 4% was doped thereto.

The mass ratio (BH1:BH3:NBD) between the second host compound, the first host compound and the dopant was 19.2:4.8:1.

<BH1>

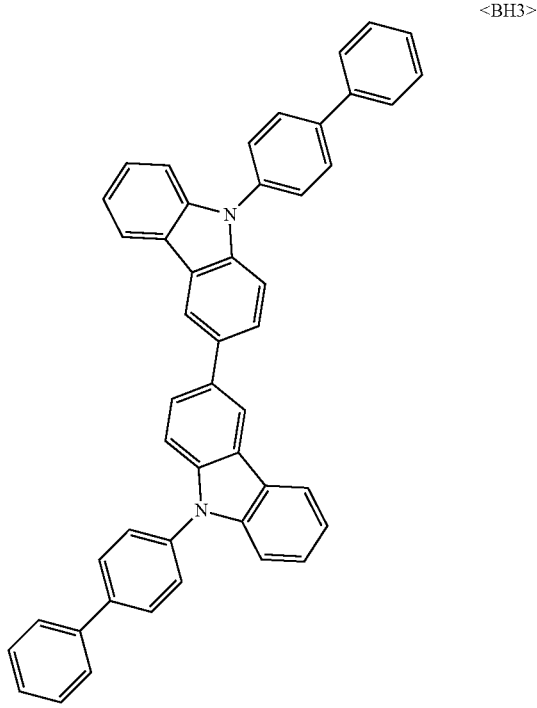

<BH3>

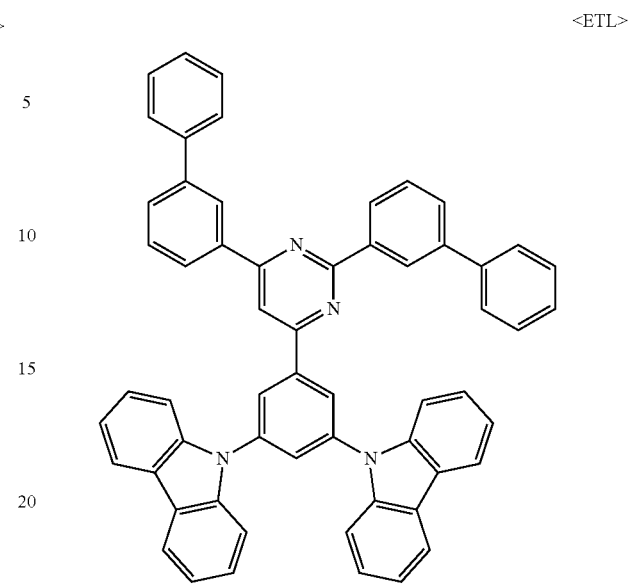

<ETL>

(e) electron injection layer (thickness 10 Å): the electron injection layer employed LiF as a material thereof.

(f) cathode (thickness 500 Å): the cathode employed Al as a material thereof.

EXAMPLE 2

An organic electroluminescence device was fabricated in the same manner as in Example 1 except that BH4 was employed instead of BH3 used in Example 1:

<BH4>

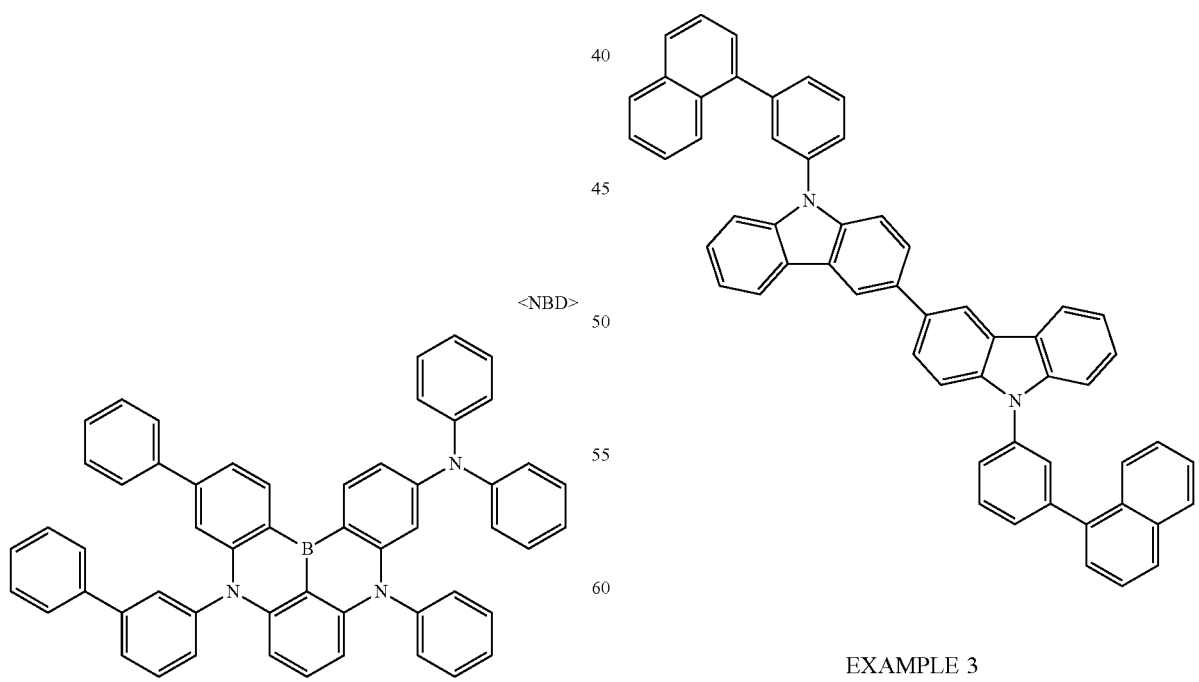

<NBD>

(d) electron transport layer (thickness 100 Å): The electron transport layer employed ETL as a material thereof:

EXAMPLE 3

An organic electroluminescence device was fabricated in the same manner as in Example 1 except that BH5 was employed instead of BH3 used in Example 1:

<BH5>

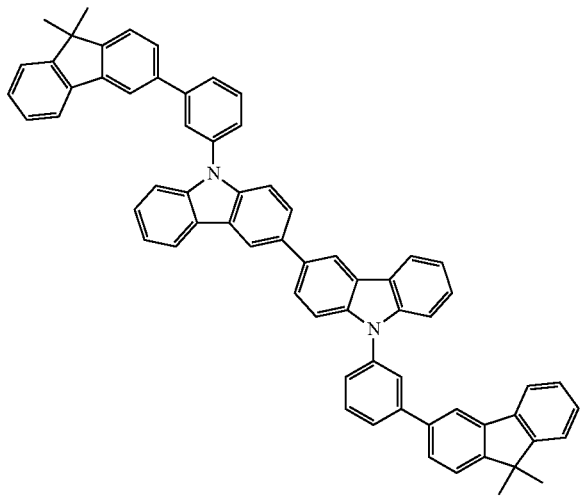

EXAMPLE 4

An organic electroluminescence device was fabricated in the same manner as in Example 1 except that BH6 was employed instead of BH3 used in Example 1:

<BH6>

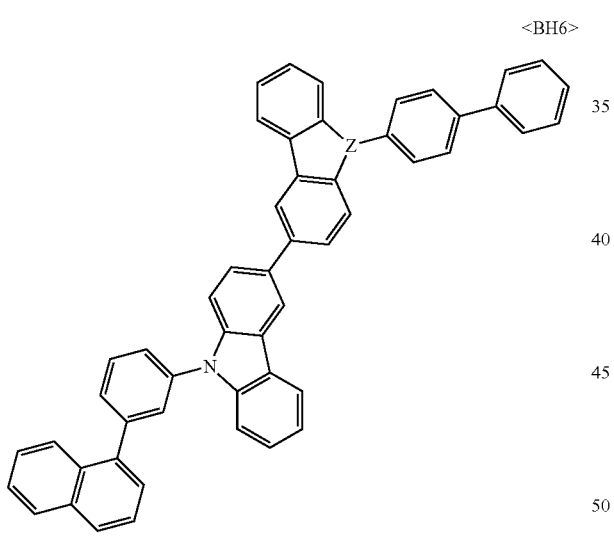

EXAMPLE 5

An organic electroluminescence device was fabricated in the same manner as in Example 2 except that a mass ratio between the second host compound, first host compound and narrow blue dopant (BH1:BH4:NBD) was 21.6:2.4:1.

EXAMPLE 6

An organic electroluminescence device was fabricated in the same manner as in Example 2 except that a mass ratio between the second host compound, first host compound and narrow blue dopant (BH1:BH4:NBD) was 16.8:7.2:1.

EXAMPLE 7

An organic electroluminescence device was fabricated in the same manner as in Example 2 except that a mass ratio between the second host compound, first host compound and narrow blue dopant (BH1:BH4:NBD) was 14.4:9.6:1.

Comparative Example 1

An organic electroluminescence device was fabricated in the same manner as in Example 1 except that a mass ratio between the second host compound, first host compound and narrow blue dopant (BH1:BH3:NBD) was 24:0:1.

Comparative Example 2

An organic electroluminescence device was fabricated in the same manner as in Example 1 except that BH2 was employed instead of BH3 used in Example 1, and except that a mass ratio between the second host compound, first host compound and narrow blue dopant (BH1:BH2:NBD) was 19.2:4.8:1:

<BH2>

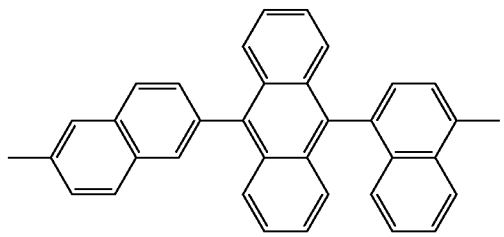

Comparative Example 3

An organic electroluminescence device was fabricated in the same manner as in Example 2 except that a mass ratio between the second host compound, first host compound and narrow blue dopant (BH1:BH4:NBD) was 9.6:14.4:1.

Table 1 summarizes HOMOs, LUMOs and triplet energies Ti of the HTL, ETL, NBD, BH1, BH2, BH3, BH4 and BH5 as used in the Present and Comparative Examples.

TABLE 1

|     | HOMO (eV) | LUMO (eV.) | T1 (eV) |
|-----|-----------|------------|---------|
| HTL | −5.79     | −2.57      | 2.82    |
| ETL | −6.21     | −2.73      | 2.67    |
| NBD | −5.38     | −2.75      | 2.47    |
| BH1 | −6.00     | −2.99      | 1.85    |
| BH2 | −5.90     | −2.95      | 1.75    |
| BH3 | −5.61     | −2.28      | 2.71    |
| BH4 | −5.61     | −2.28      | 2.71    |
| BH5 | −5.61     | −2.28      | 2.71    |
| BH6 | −5.61     | −2.28      | 2.71    |

Experimental Example 1—Evaluation of electro-optical characteristics based on combinations of first host compound, second host compound and narrow blue dopant The electro-optical characteristics were measured based on combinations of the first host compound, second host compound and narrow blue dopant using the organic electroluminescence devices of Comparative Examples 1 to 2 and the organic electroluminescence devices of Examples 1 to 4. The measurement results are summarized in Table 2 below. FIG. 5 to FIG. 8 show graphs showing driving characteristics and life-span characteristics of the devices.

TABLE 2

|  | Driving voltage (V) | Current efficiency (Cd/A) | Color coordinate CIE (x, y) | EQE (%) | Life-span (H) |
|---|---|---|---|---|---|
| Comparative Example 1 | 3.95 | 4.08 | 0.141, 0.056 | 7.07 | 100 |
| Comparative Example 2 | 4.00 | 4.05 | 0.141, 0.057 | 7.02 | 104 |
| Example 1 | 3.64 | 4.74 | 0.141, 0.058 | 8.05 | 112 |
| Example 2 | 3.62 | 4.81 | 0.141, 0.059 | 8.02 | 120 |
| Example 3 | 3.65 | 4.79 | 0.141, 0.058 | 8.01 | 110 |
| Example 4 | 3.63 | 4.83 | 0.141, 0.059 | 8.07 | 115 |

Comparative Example 1 is directed to an organic electroluminescence device including a blue light-emission layer composed of the second host compound BH1 and the narrow blue dopant NBD. Comparative Example 2 is directed to an organic electroluminescence device including a blue light-emission layer composed of the second host compound BH1, the further second host compound BH2, and the narrow blue dopant NBD. Both of the second host compound BH1 and the further second host compound BH2 are anthracene-based compounds.

Examples are directed to organic electroluminescence devices, each including a blue light-emission layer containing both the first host compound BH3, BH4, BH5 or BH6, the second host compound BH1, and the narrow blue dopant NBD.

Table 2 shows that the Examples exhibited a reduced driving voltage compared to the Comparative Examples and exhibited improved current efficiency, external quantum efficiency and life-span compared to the Comparative Examples.

Figure 5:
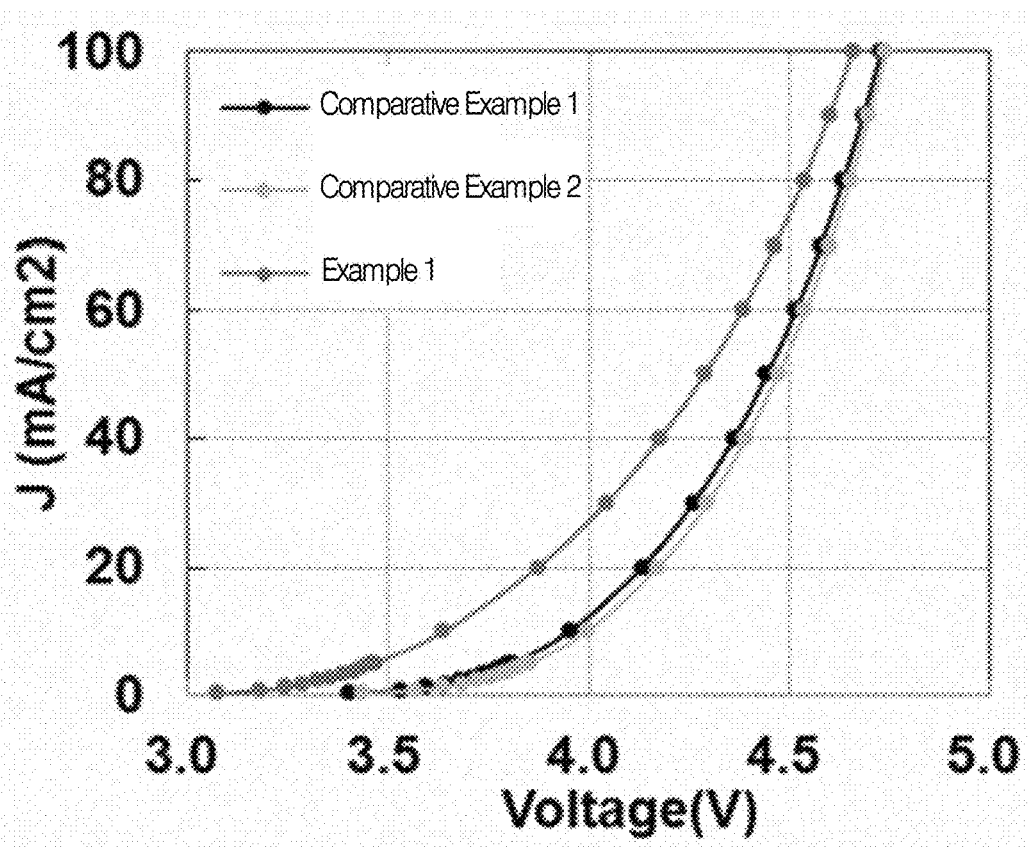
FIG. 5 is a graph showing a relationship between a current density and a driving voltage.
Figure 6:
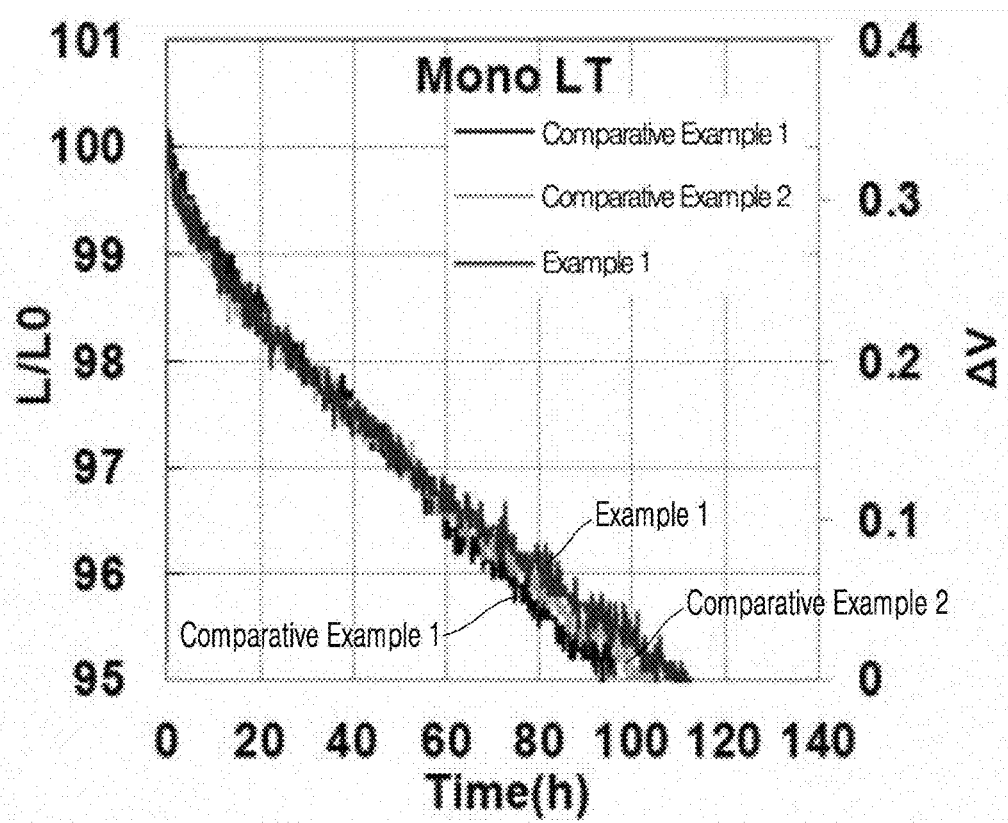
FIG. 6 is a graph of a relationship between a driving duration and L/L0. L/L0 refers to a ratio of current luminance (L) to initial luminance (L0).
Figure 7:
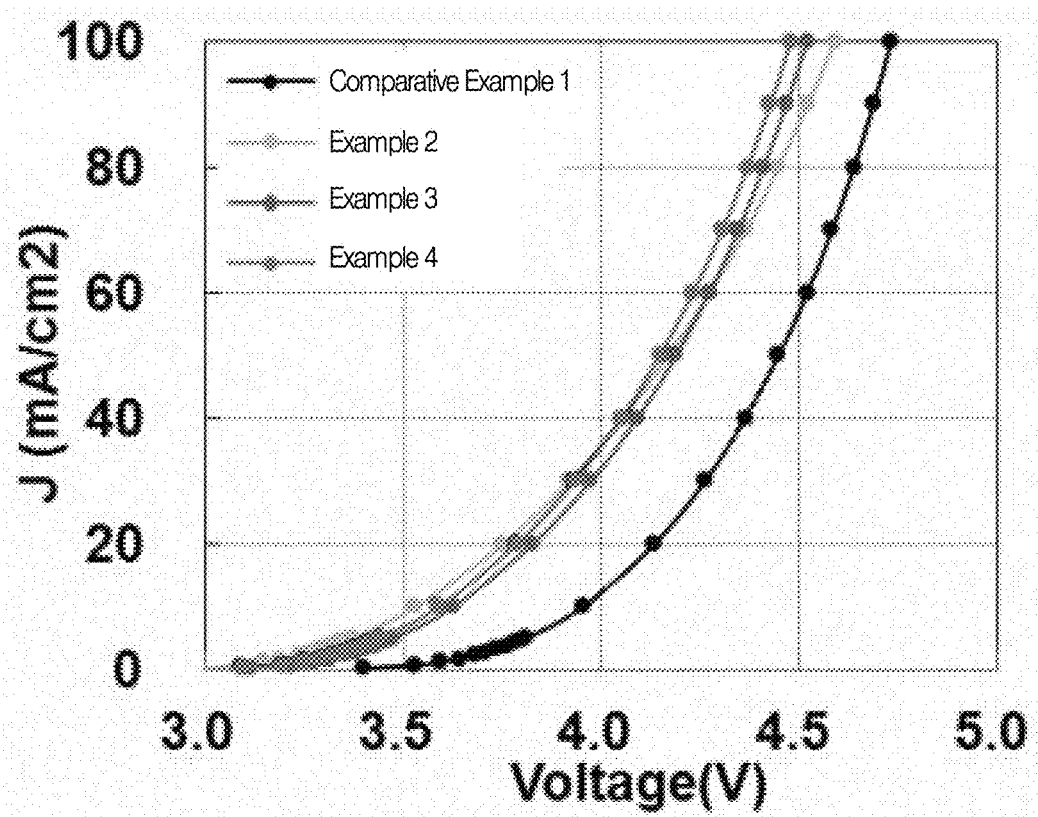
FIG. 7 is a graph showing a relationship between a current density and a driving voltage.
Figure 8:
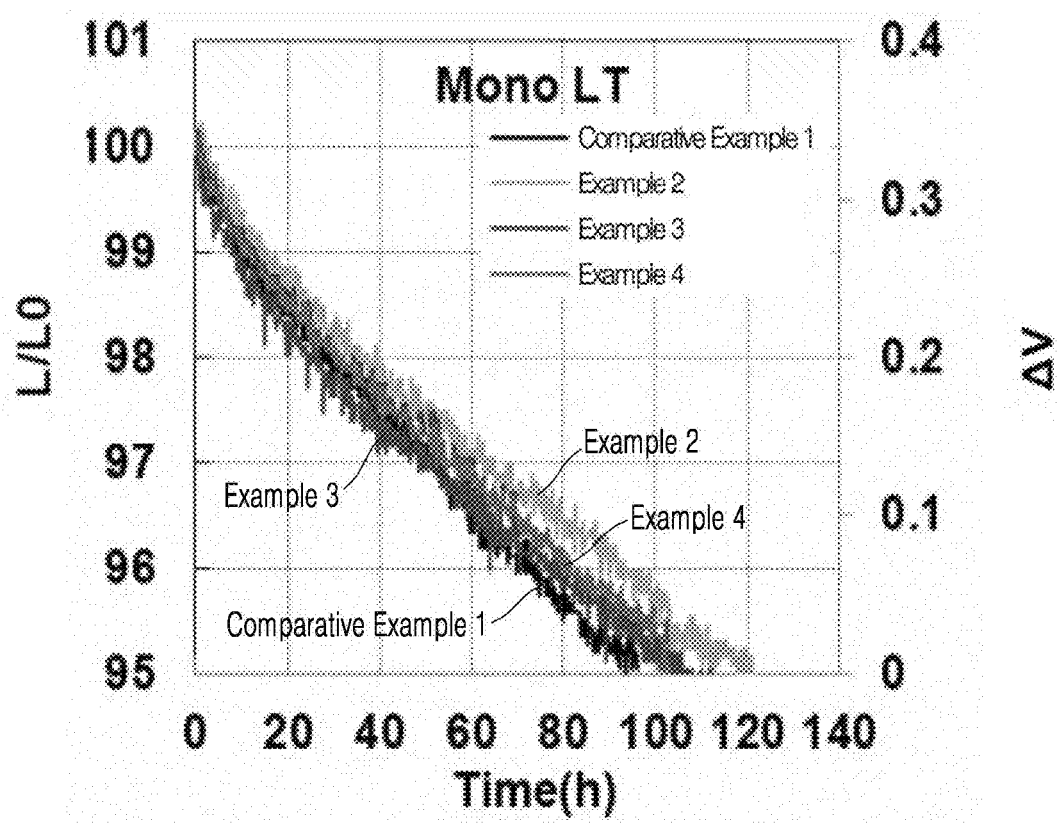
FIG. 8 is a graph of a relationship between a driving duration and L/L0. L/L0 refers to a ratio of current luminance (L) to initial luminance (L0).

Referring to FIG. 5, at the same current density, the Example 1 based organic electroluminescence device shows a lower driving voltage than the organic electroluminescence devices according to Comparative Examples 1 and 2. Referring to FIG. 6, the organic electroluminescence device according to Example 1 shows an improvement in life-span as compared to the organic electroluminescence devices according to Comparative Examples 1 and 2. Referring to FIG. 7, at the same current density, the organic electroluminescence devices in accordance with the Examples 2 to 4 show a lower driving voltage than the organic electroluminescence devices according to Comparative Example 1. Referring to FIG. 8, the organic electroluminescence devices according to Examples 2 to 4 show improved life-span as compared with the organic electroluminescence device according to Comparative Example 1.

Experimental Example 2—Evaluation of Electro-Optical Characteristics Based on Composition Ratios Between First Host Compound and Second Host Compound The electro-optical characteristic changes were observed based on the composition ratios of the first host compound and second host compound using the organic electroluminescence devices of Comparative Examples 1 and 3 and the organic electroluminescence devices of Examples 2, 5 to 7. Table 3 summarizes the measurement results. FIG. 9 to FIG. 12 show graphs showing driving characteristics and life-span characteristics of the devices.

TABLE 3

|  | Driving voltage (V) | Current efficiency (Cd/A) | Color coordinate CIE (x, y) | EQE (%) | Life-span (H) |
|---|---|---|---|---|---|
| Comparative Example 1 | 3.95 | 4.08 | 0.141, 0.056 | 7.07 | 100 |
| Comparative Example 3 | 3.48 | 2.75 | 0.141, 0.063 | 5.78 | 55 |
| Example 2 | 3.62 | 4.81 | 0.141, 0.059 | 8.02 | 120 |
| Example 5 | 3.87 | 4.20 | 0.141, 0.057 | 7.02 | 105 |
| Example 6 | 3.55 | 4.72 | 0.141, 0.060 | 7.70 | 110 |
| Example 7 | 3.51 | 4.05 | 0.141, 0.051 | 7.02 | 73 |

Referring to Table 3, Examples 2, 5 and 6 show a reduction in driving voltage compared with Comparative Examples 1 and 3, and have improved current efficiency, quantum light-emission efficiency and life-span compared with Comparative Examples 1 and 3. Example 2 has the mass ratio of the first host compound BH4 and second host compound BH1 being 19.2:4.8. Example 5 has the mass ratio of the first host compound BH4 and second host compound BH1 being 21.6:2.4. Example 6 has the mass ratio of the first host compound BH4 and second host compound BH1 being 16.8:7.2.

Example 7 has the mass ratio of the first host compound BH4 and second host compound BH1 being 14.4:9.6. Example 7 shows a reduction in driving voltage as compared with Comparative Example 1 and has current efficiency and quantum light-emission efficiency similar to Comparative Example 1 and has slightly lowered life-span compared to Comparative Example 1. Comparative Example 1 is directed to an organic electroluminescence device including a blue light-emission layer composed only of the second host compound BH1 and the narrow blue dopant NBD.

In Comparative Example 3, the mass ratio of the first host compound BH4 and the second host compound BH1 is 9.6:14.4, and the content of the first host compound BH4 is higher than that of the second host compound BH1. Comparative Example 3 shows a reduced driving voltage compared to the Examples, but shows lowered current efficiency, external quantum efficiency and life-span characteristics compared to the Examples.

Figure 9:
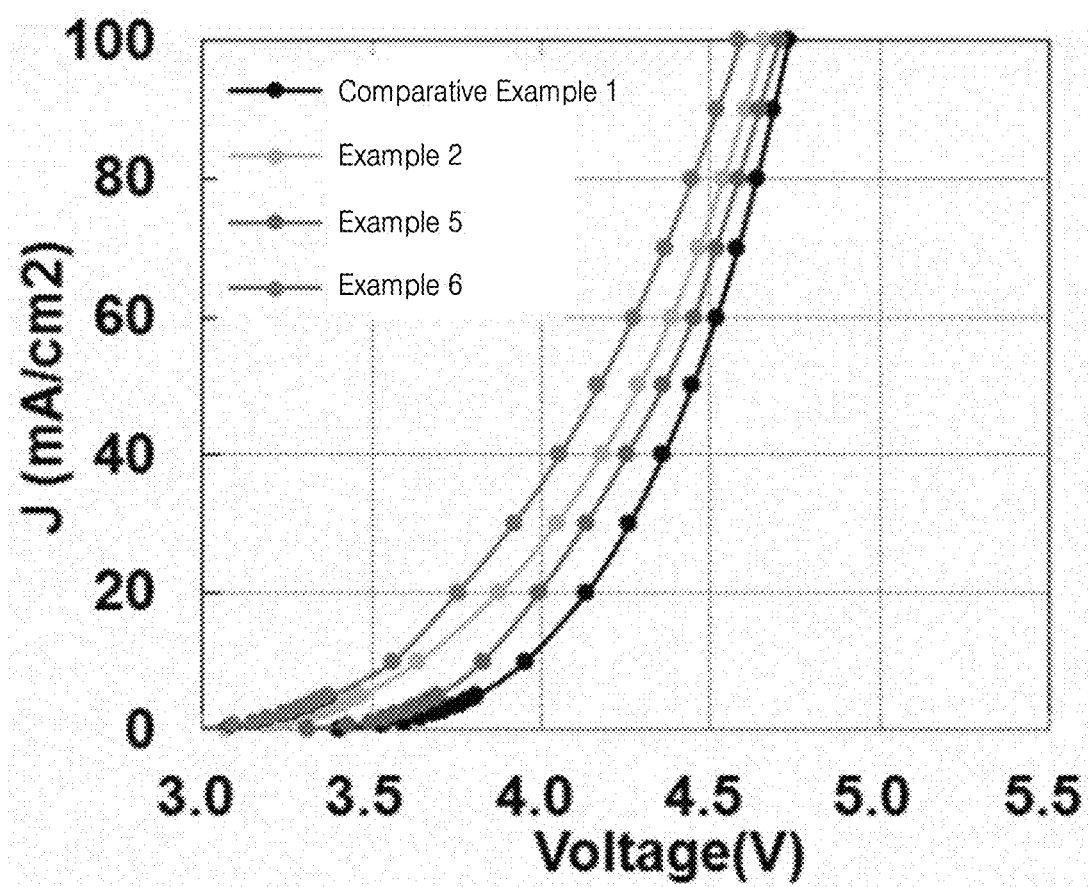
FIG. 9 is a graph showing a relationship between a current density and a driving voltage.
Figure 10:
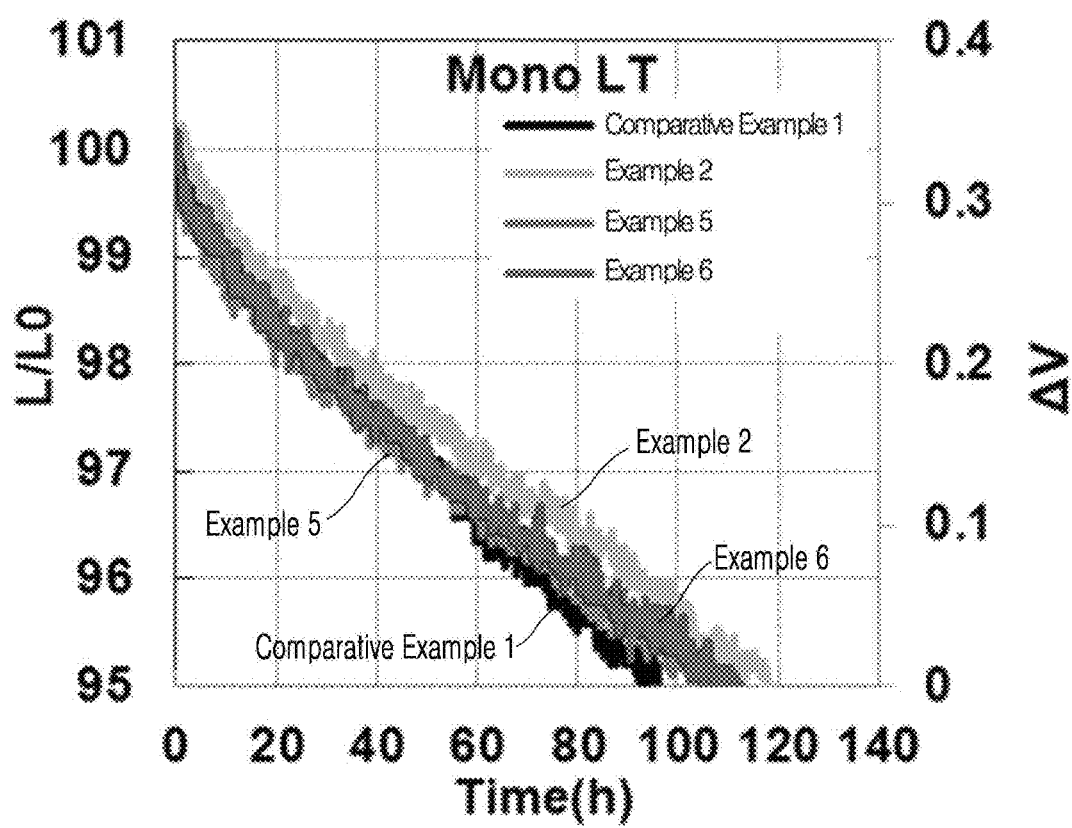
FIG. 10 is a graph of a relationship between a driving duration and L/L0. L/L0 refers to a ratio of current luminance (L) to initial luminance (L0).

FIG. 9 shows that organic electroluminescence devices according to Examples 2, 5 and 6 are driven at a lower driving voltage than that of the organic electroluminescence devices according to Comparative Example 1 at the same current density. FIG. 10 shows that the organic electroluminescence devices according to Examples 2, 5 and 6 have improved life-span compared to the organic electroluminescence device according to Comparative Example 1.

Figure 11:
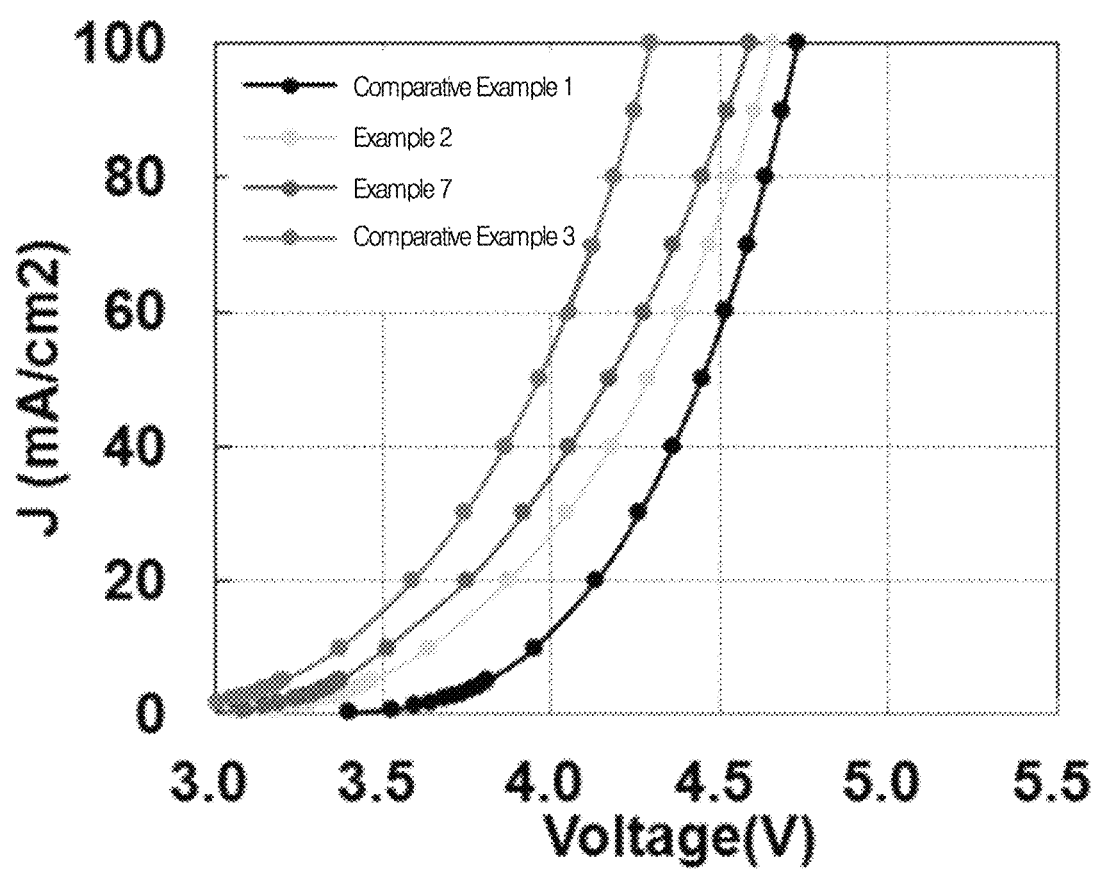
FIG. 11 is a graph showing a relationship between a current density and a driving voltage.
Figure 12:
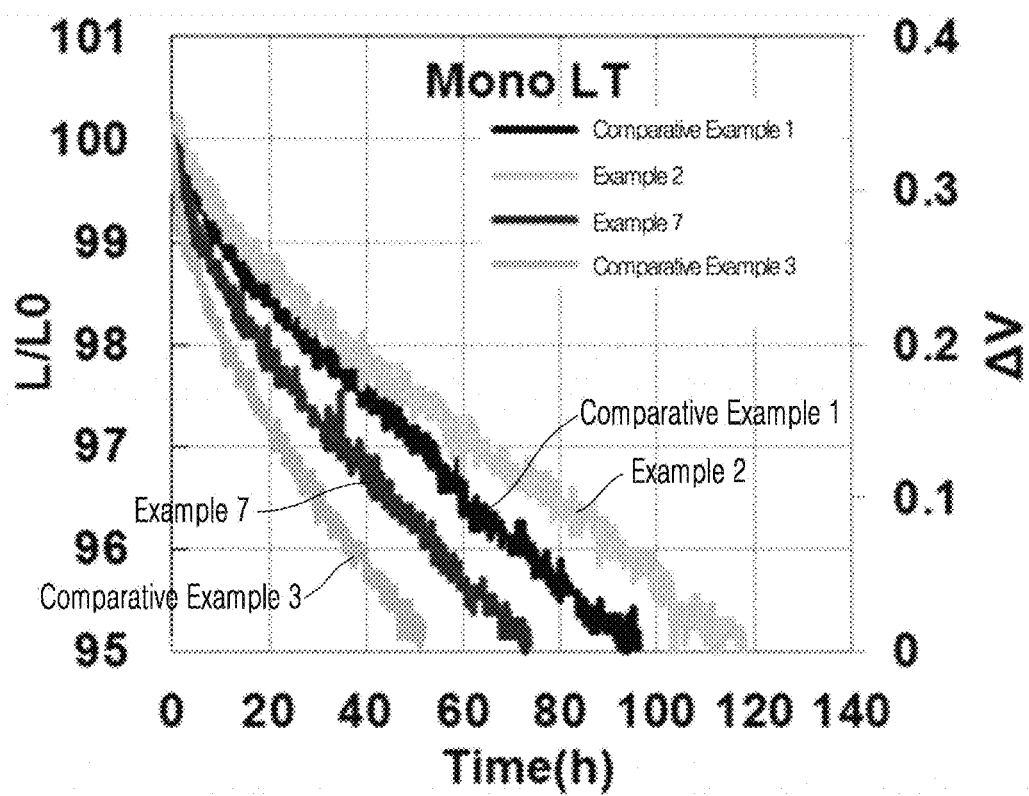
FIG. 12 is a graph of a relationship between a driving duration and L/L0. L/L0 refers to a ratio of current luminance (L) to initial luminance (L0).

FIG. 11 shows that the organic electroluminescence device according to Comparative Example 3 is driven at a lower driving voltage than that of the organic electroluminescence device according to Example 7 at the same current density. FIG. 12 shows that the life-span of the organic electroluminescence device according to Comparative Example 3 is shorter than that of the organic electroluminescence device according to Example 7.

EXAMPLE 8

A hole injection layer, first hole transport layer, first blue light-emission layer, first electron transport layer, first n-type charge generation layer, first p-type charge generation layer, second hole transport layer, yellow-green light-emission layer, second electron transport layer, second n-type charge generation layer, second p-type charge generation layer, third hole transport layer, second blue light-emission layer, third electron transport layer, electron injection layer and cathode were deposited on the ITO substrate in the same manner as in Example 1 in an order of following (a) to (p), to produce a white organic electroluminescence device with a multi-layer light-emission structure.

(a) hole injection layer (thickness 70 to 100 Å): the hole injection layer employed HAT-CN as a material thereof:

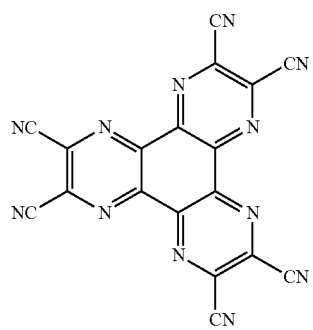
<HAT-CN>

(b) first hole transport layer (thickness 850 to 1000 Å): the hole transport layer employed HTL as a material thereof:

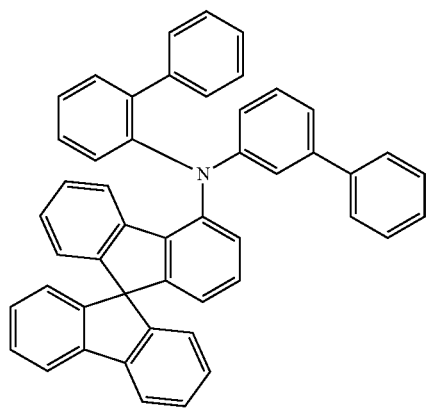
<HTL>

(c) first blue light-emission layer (thickness 150 to 250 Å): the first blue light-emission layer employed the first host compound BH3 and the second host compound BH1. The narrow blue dopant NBD 4% was doped thereto. The mass ratio between the second host compound, first host compound and dopant (BH1:BH3:NBD) was 19.2:4.8:1:

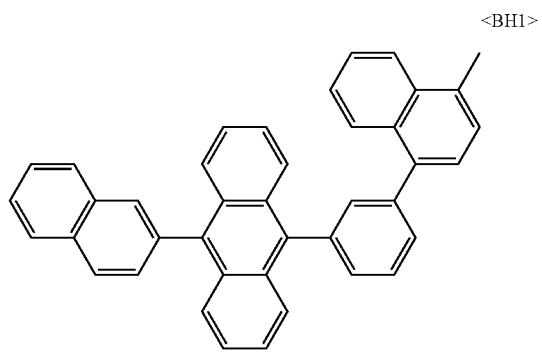
<BH1>

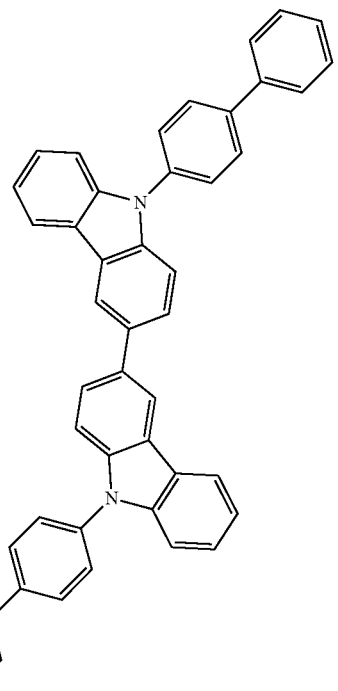
<BH3>

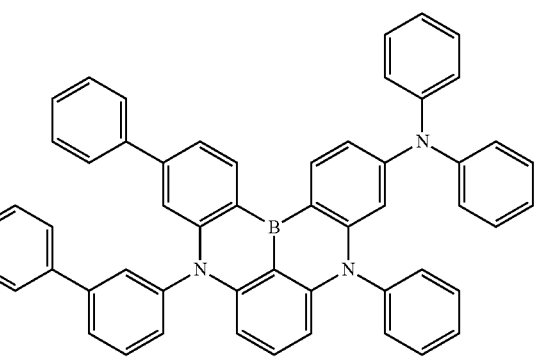
<NBD>

(d) first electron transport layer (thickness 100 to 150 Å): the first electron transport layer employed ETL as a material thereof:

<ETL>

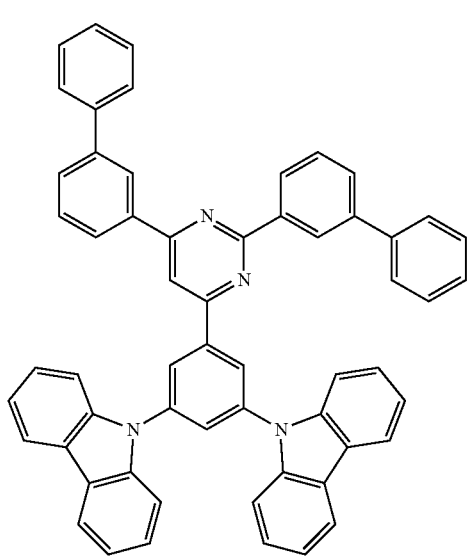

(e) first n-type charge generation layer (thickness 150 to 200 Å): the first n-type charge generation layer employed following BPhen:Li (Li doping 1 to 2%) as a material thereof:

<BPhen: Li>

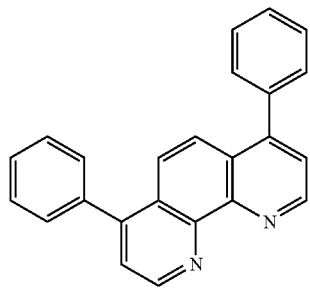

(f) first p-type charge generation layer (thickness 70 to 100 Å): the first p-type charge generation layer employed following HAT-CN as a material thereof:

<HAT-CN>

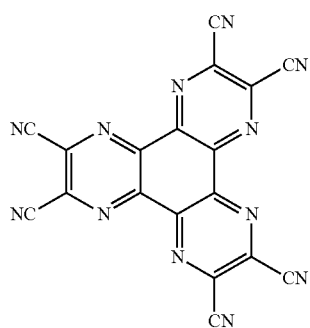

(g) second hole transport layer (thickness 50 to 100 Å): the second hole transport layer employed HTL as a material thereof:

<HTL>

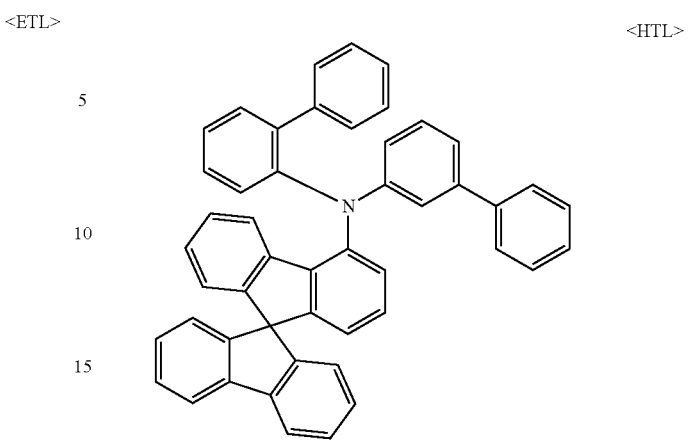

(h) yellow-green light-emission layer (thickness 300 to 400 Å): the yellow-green light-emission layer employed the first host compound CBP and the second host compound BAlq, and, employed doIr(btp)2(acac) as a dopant:

<CBP>

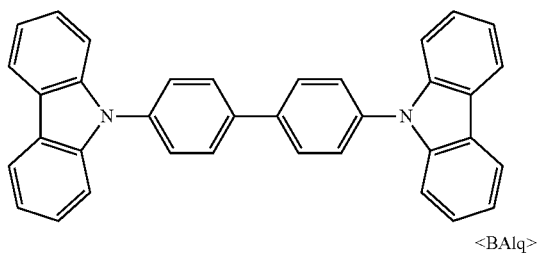

<BAlq>

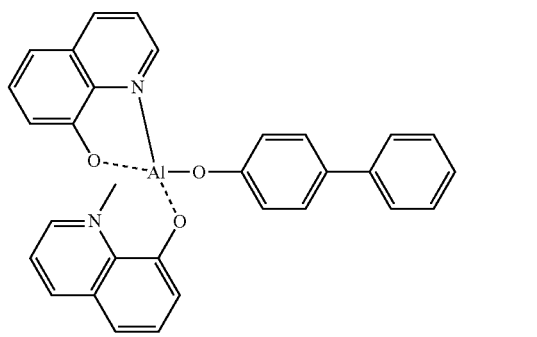

<Ir(btp)2(acac)>

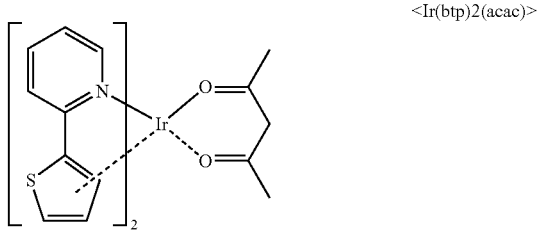

(i) second electron transport layer (thickness 200 to 250 Å): the second electron transport layer employed following TPBi as a material thereof:

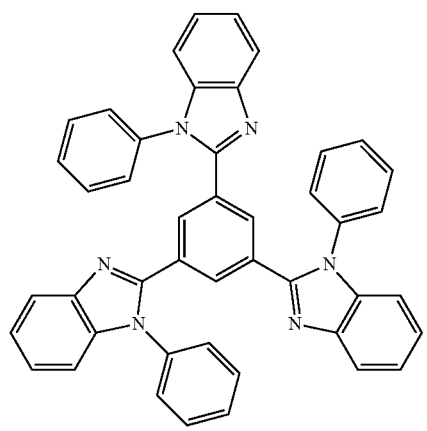
<TPBi>

(j) second n-type charge generation layer (thickness 150 to 200 Å): the second n-type charge generation layer employed following BPhen:Li (Li doping 1 to 2%) as a material thereof:

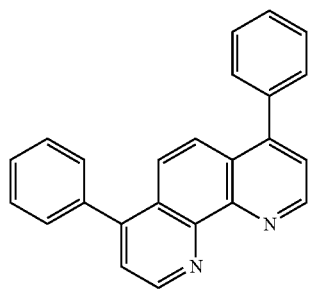
<BPhen: Li>

(k) second p-type charge generation layer (thickness 70 to 100 Å): the second p-type charge generation layer employed following HAT-CN as a material thereof:

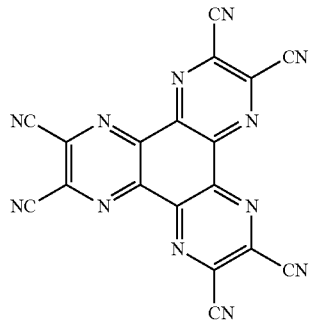
<HAT-CN>

(l) third hole transport layer (thickness 850 to 1000 Å): the hole transport layer employed HTL as a material thereof:

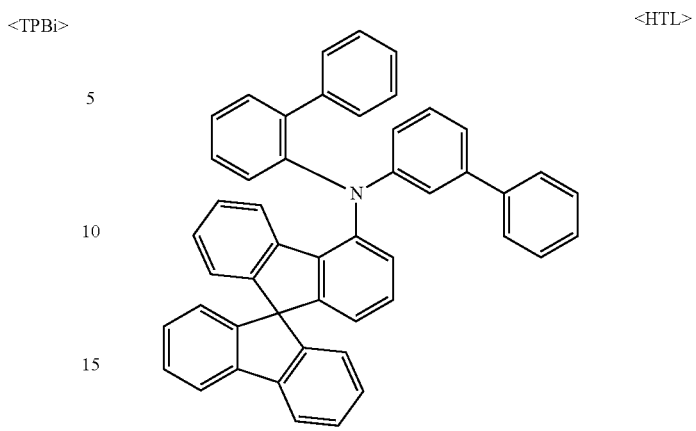
<HTL>

(m) second blue light-emission layer (thickness 200 to 300 Å): the second blue light-emission layer employed the first host compound BH3 and the second host compound BH1. The narrow blue dopant NBD 4% was doped thereto. The mass ratio between the second host compound, first host compound and dopant (BH1:BH3:NBD) was 19.2:4.8:1:

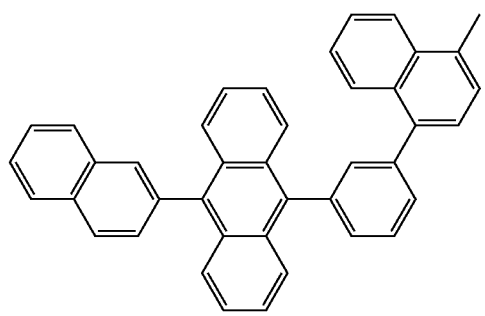
<BH1>

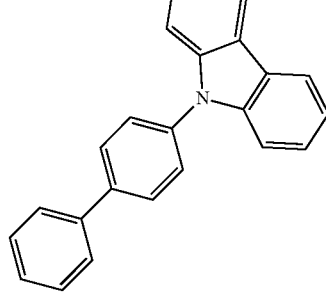
<BH3>

<NBD>

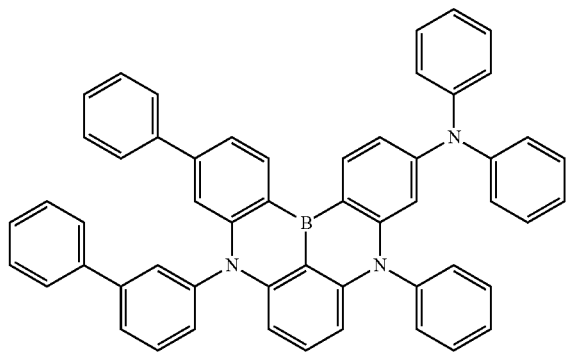

(n) third electron transport layer (thickness 200 to 300 Å): the third electron transport layer employed following TPBi as a material thereof:

<TPBi>

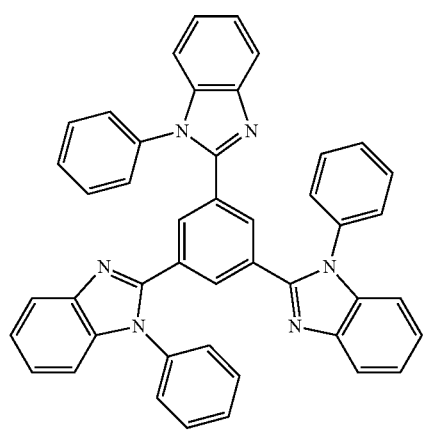

(o) electron injection layer (thickness 10 to 20 Å): the electron injection layer employed LiF as a material thereof.

(p) cathode (thickness 500 Å): the cathode employed Al as a material thereof.

Comparative Example 4

A white organic electroluminescence device with a multilayer light-emission structure was fabricated in the same manner as in Example 8, except that BH2 was employed instead of BH3 in each of the first blue light-emission layer and the second blue light-emission layer in Example 8 and except that, in Comparative Example 4, the mass ratio (BH1:BH2:NBD) between the second host compound, the further second host compound and the narrow blue dopant was 19.2:4.8:1:

<BH2>

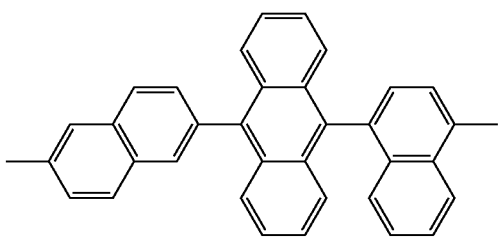

Figure 13:
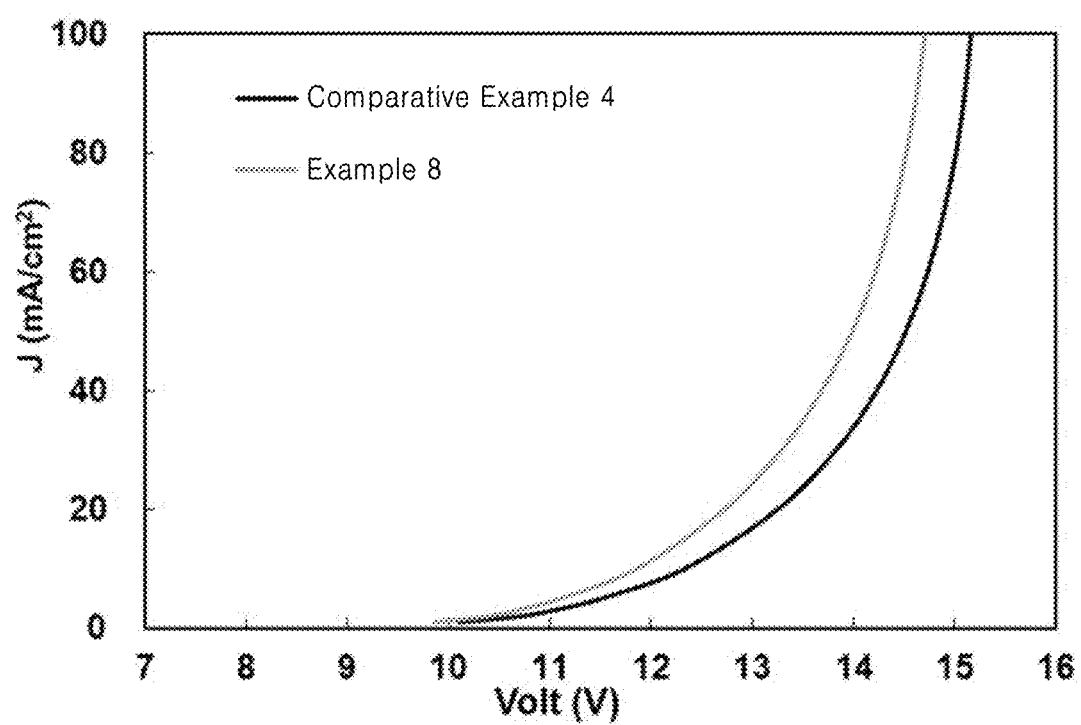
FIG. 13 is a graph showing a relationship between a current density and a driving voltage.
Figure 14:
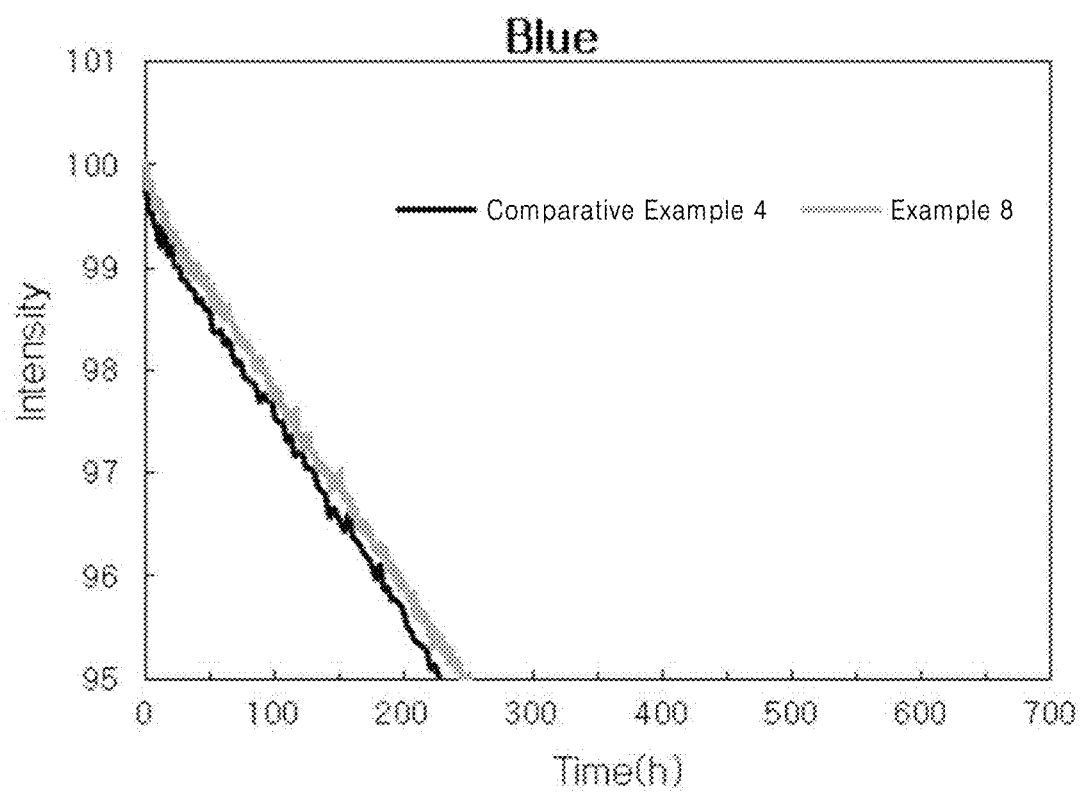
FIG. 14 is a graph of a relationship between a driving duration and L/L0. L/L0 refers to a ratio of current luminance (L) to initial luminance (L0).

Experimental Example 3—Evaluation of Electro-Optical Characteristics of Three Layered White Device The electro-optical characteristics were measured based on combinations of the first host compound, the second host compound and the narrow blue dopant using the three layered white organic electroluminescence devices in accordance with Example 8 and Comparative Example 4. Table 4 summarizes the measurement results. FIG. 13 and FIG. 14 show graphs showing driving characteristics and life-span characteristics of the devices.

TABLE 4

|  | Driving voltage (V) | Current efficiency (Cd/A) | EQE (%) | Life-span (H) |
|---|---|---|---|---|
| Example 8 | 11.68 | 76.80 | 33.81 | 250 |
| Comparative Example 4 | 12.24 | 73.84 | 33.12 | 230 |

While the present disclosure has been described with reference to the accompanying drawings and the embodiments, it is to be understood that the present disclosure is not limited to the embodiments, but may be embodied in various forms. Those of ordinary skill in the art to which the present disclosure pertains may understand that the present disclosure may be embodied in other specific forms without departing from the spirit or essential characteristics of the present disclosure. It is therefore to be understood that the embodiments as described above are in all respects illustrative and not restrictive.

The invention claimed is:

1. An organic electroluminescence device comprising:
an anode;
a cathode; and
a first light-emission layer disposed between the anode and the cathode and configured for emitting blue light,
wherein the first light-emission layer comprises a host composition and a blue dopant,
wherein the blue dopant comprises at least one compound represented by Chemical Formula D, and the host composition comprises a first host compound and a second host compound,
wherein the first host compound is a carbazole-based compound and the second host compound is an anthracene-based compound,
wherein the carbazole-based compound is a compound represented by Chemical Formula C:

<Chemical Formula C>

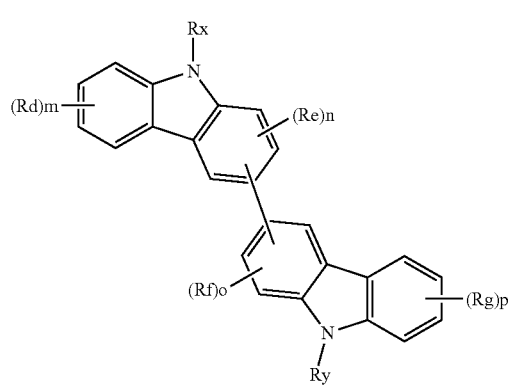

wherein, each of $R_d$, $R_e$, $R_f$ and $R_g$ independently represents one selected from a group consisting of hydrogen, deuterium, halogen, a substituted or unsubstituted C1 to C6 alkyl group, a substituted or unsubstituted C3 to C6 cycloalkyl group, a substituted or unsubstituted C6 to C15 aryl group, a substituted or unsubstituted C5 to C9 heteroaryl group, a substituted or unsubstituted carbazole group, a substituted or unsubstituted dibenzofuran group, a substituted or unsubstituted dibenzothiophene group, a substituted or unsubstituted trialkylsilyl group, and a substituted or unsubstituted triarylsilyl group, each of m and p independently is an integer of 1 to 4, each of n and o is independently an integer of 1 to 3, and each of $R_x$ and $R_y$ independently represents a substituted or unsubstituted C6 to C50 monovalent aromatic hydrocarbon group, wherein the anthracene-based compound is:

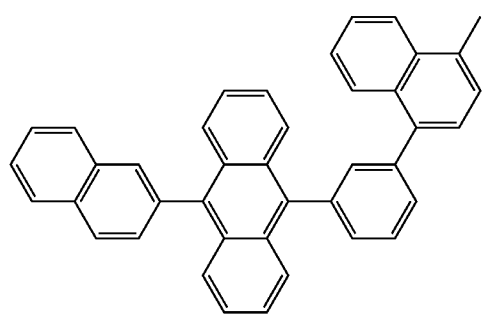

wherein a content of the first host compound is lower than a content of the second host compound, wherein the first host compound has a triplet energy level higher than a triplet energy level of the blue dopant, and the second host compound has a triplet energy level lower than the triplet energy level of the blue dopant selected from the group consisting of:

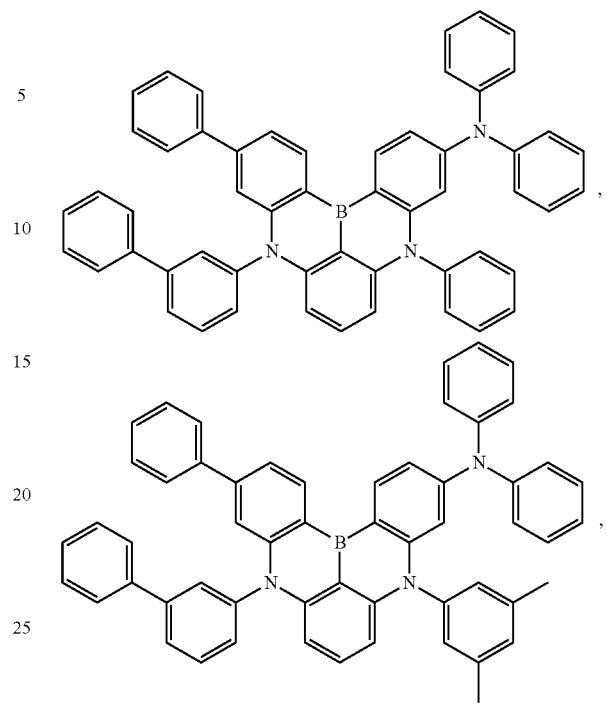

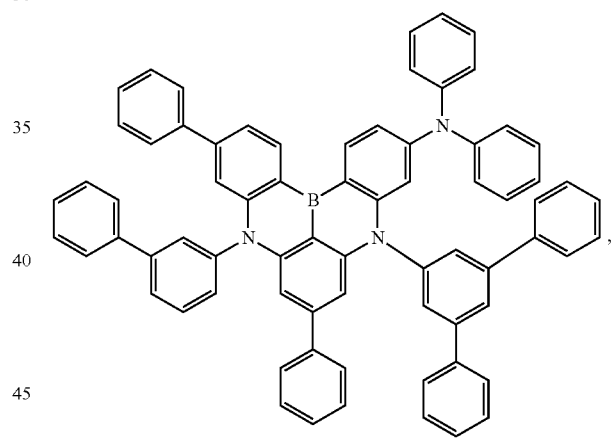

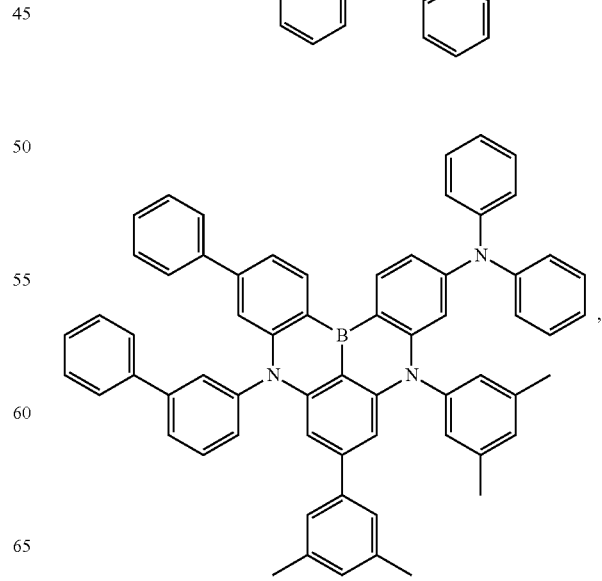

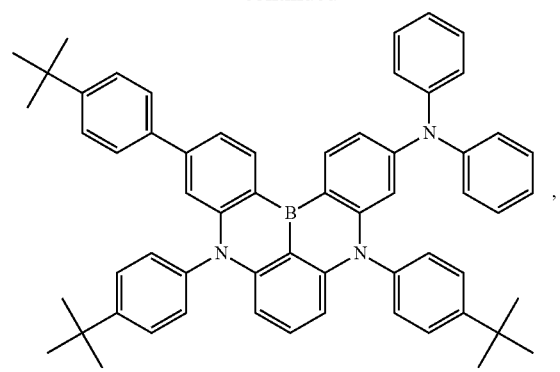
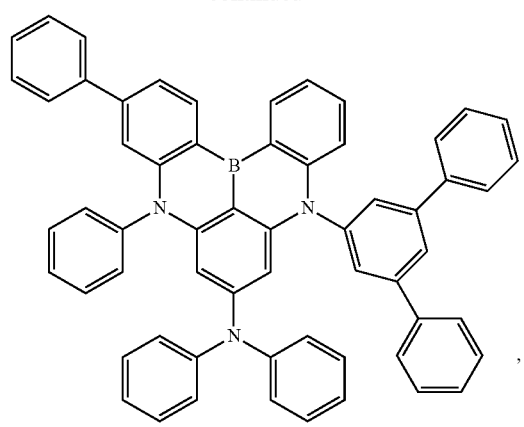
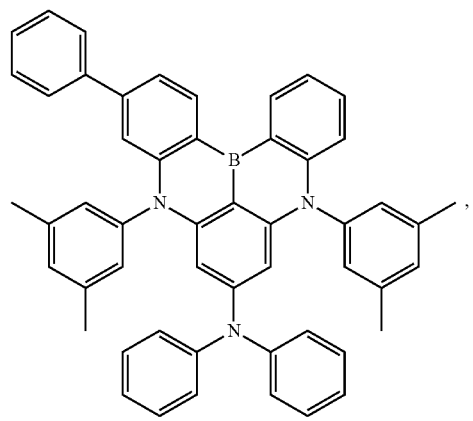
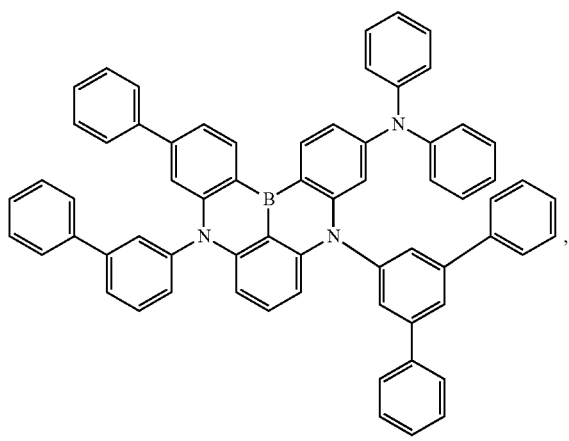
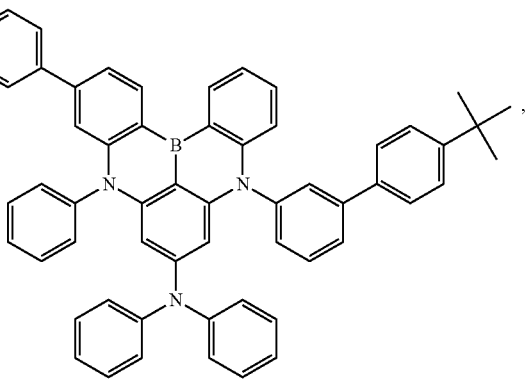
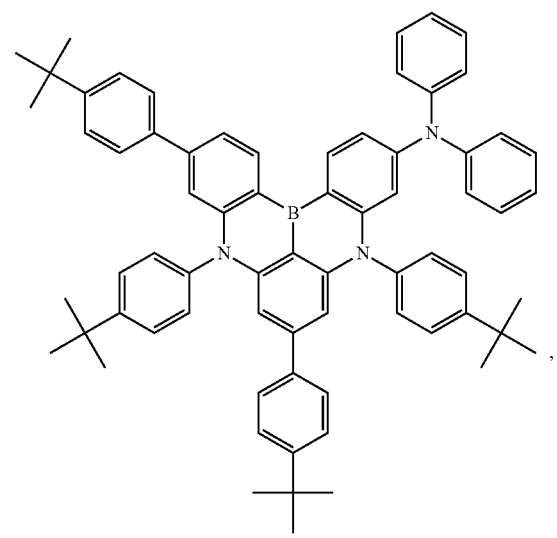
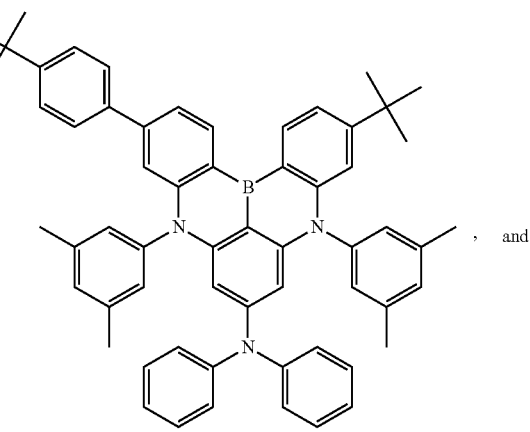
, and -continued

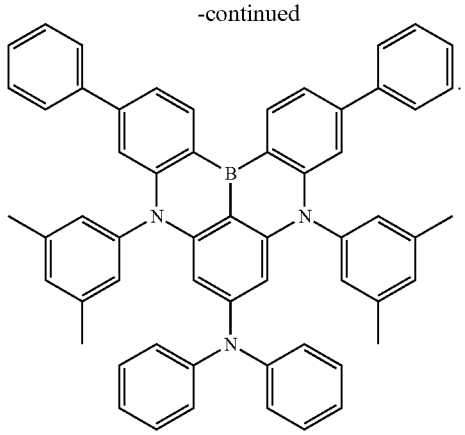

wherein the organic electroluminescence device satisfies Equation I:

$$X+Y=24 \quad \text{(Equation I)}$$

wherein, X denotes a ratio of a mass of the first host compound to a mass of the blue dopant, and Y denotes a ratio of a mass of the second host compound to the mass of the blue dopant, Y is a rational number from 14 to 22, and a ratio between X and Y is in a range from 1:9 to 3:7.

2. The organic electroluminescence device of claim 1, wherein Y is a rational number from 16 to 21.

3. The organic electroluminescence device of claim 1, wherein the triplet energy level of the first host compound is in a range from 2.7 eV to 2.8 eV, and the triplet energy level of the second host compound is in a range from 1.8 eV to 1.9 eV.

4. The organic electroluminescence device of claim 1, wherein the carbazole-based compound represented by Chemical Formula C is a compound represented by Chemical Formula C-1:

<Chemical Formula C-1>

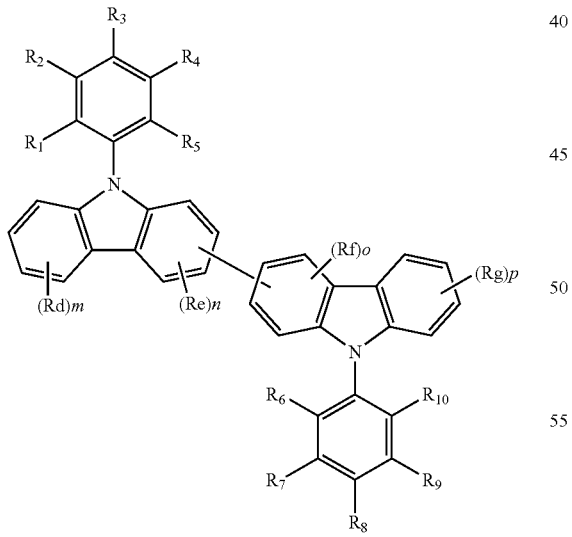

wherein, each of $R_d$, $R_e$, $R_f$ and $R_g$ independently represents one selected from a group consisting of hydrogen, deuterium, halogen, a substituted or unsubstituted C1 to C6 alkyl group, a substituted or unsubstituted C3 to C6 cycloalkyl group, a substituted or unsubstituted C6 to C15 aryl group, a substituted or unsubstituted C5 to C9 heteroaryl group, a substituted or unsubstituted carbazole group, a substituted or unsubstituted dibenzofuran group, a substituted or unsubstituted dibenzothiophene group, a substituted or unsubstituted trialkylsilyl group, and a substituted or unsubstituted triarylsilyl group, each of m and p independently is an integer of 1 to 4,
each of n and o is independently an integer of 1 to 3, and
each of $R_1$, $R_2$, $R_3$, $R_4$, $R_5$, $R_6$, $R_7$, $R_8$, $R_9$, and $R_{10}$ independently represents one selected from a group consisting of hydrogen, deuterium, halogen, a substituted or unsubstituted C1 to C6 alkyl group, a substituted or unsubstituted C6 to C15 aryl group, a substituted or unsubstituted carbazole group, a substituted or unsubstituted dibenzofuran group, and a substituted or unsubstituted dibenzothiophene group.

5. The organic electroluminescence device of claim 1, wherein the carbazole-based compound is selected from the group consisting of:

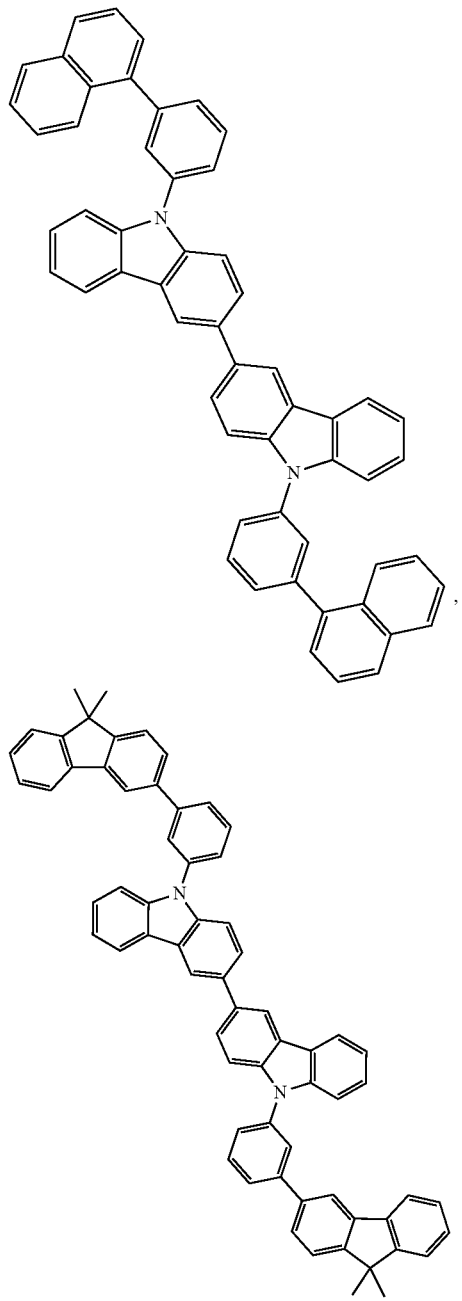

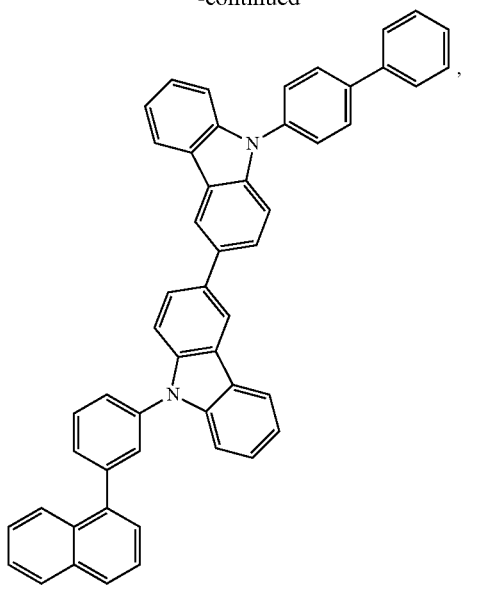
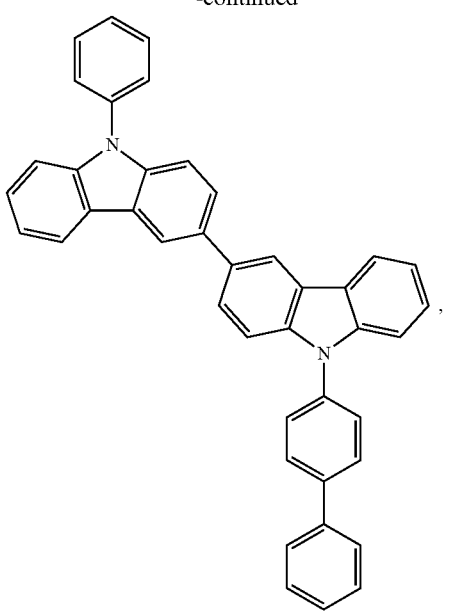
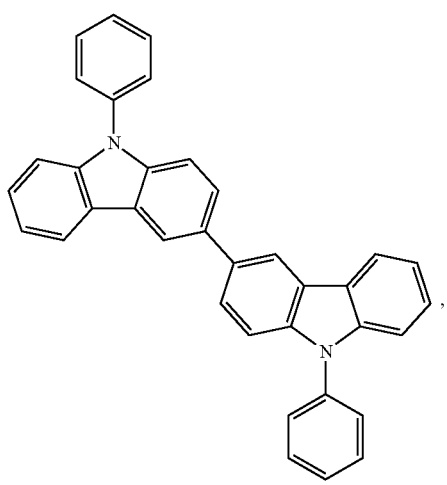
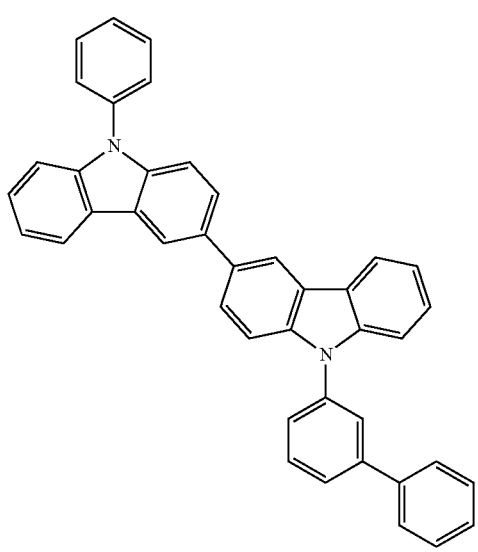
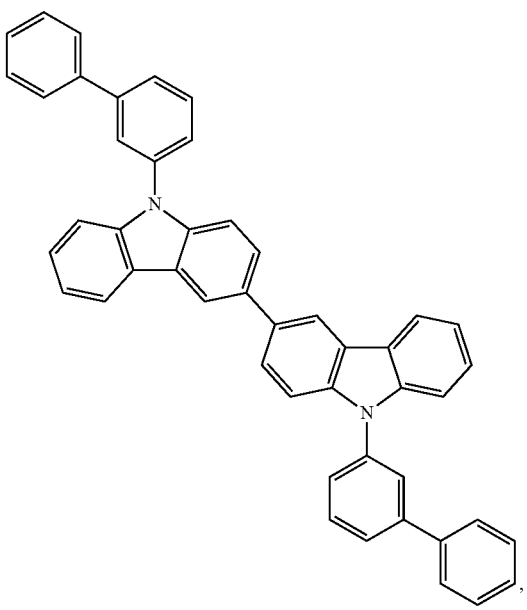

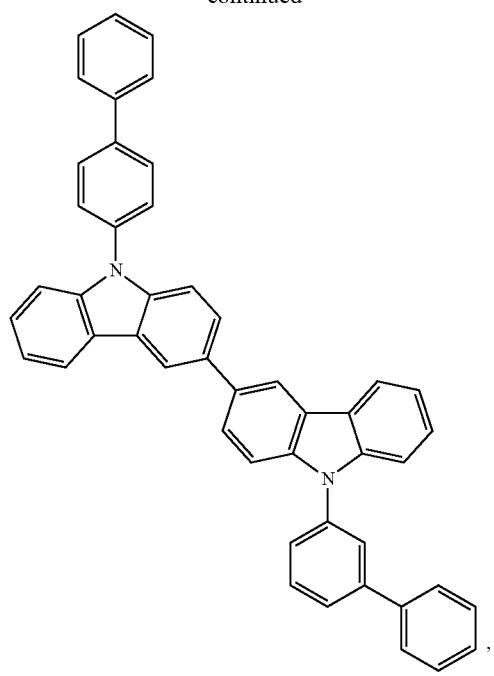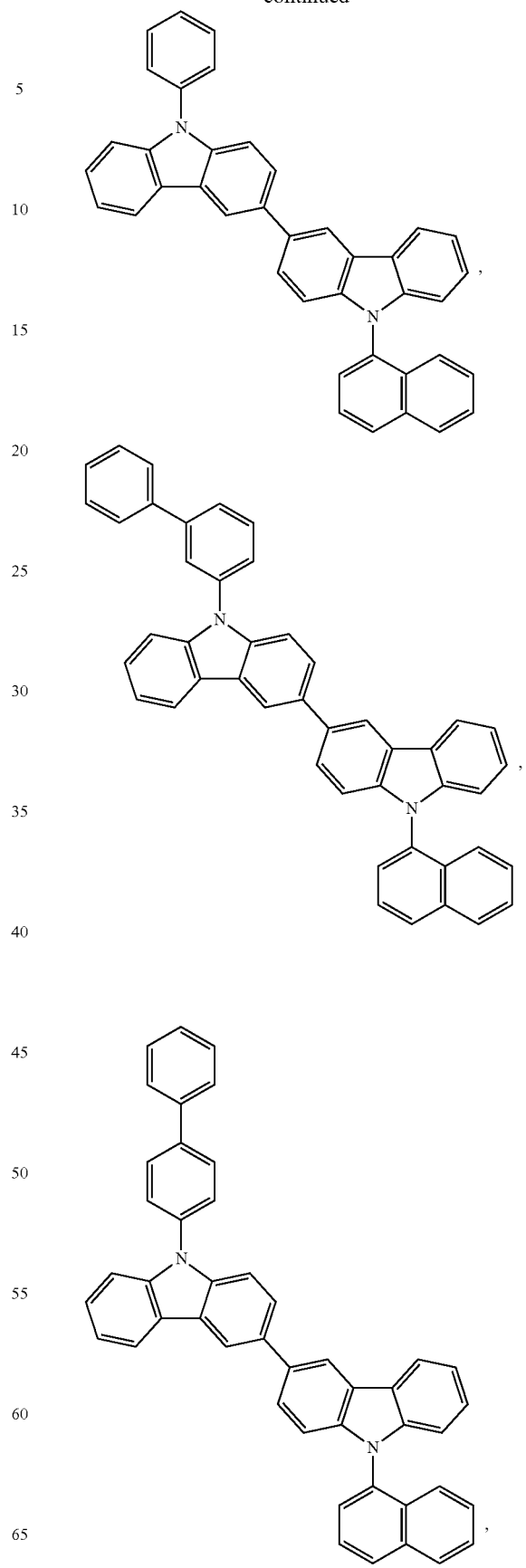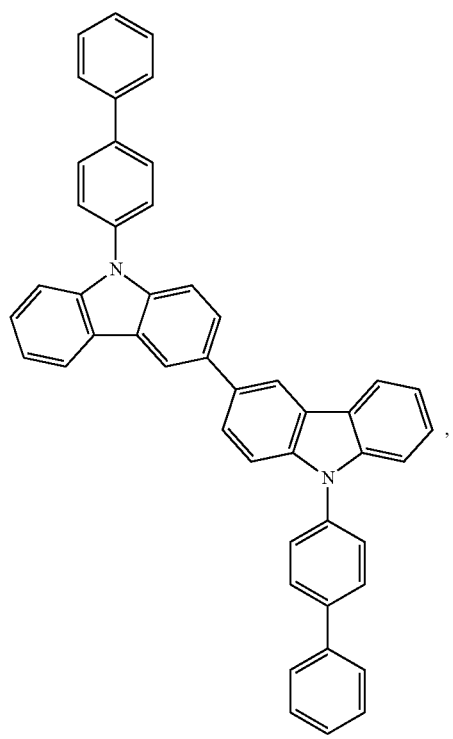

69
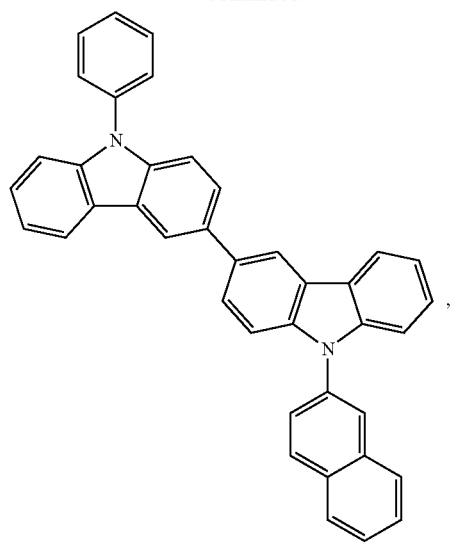
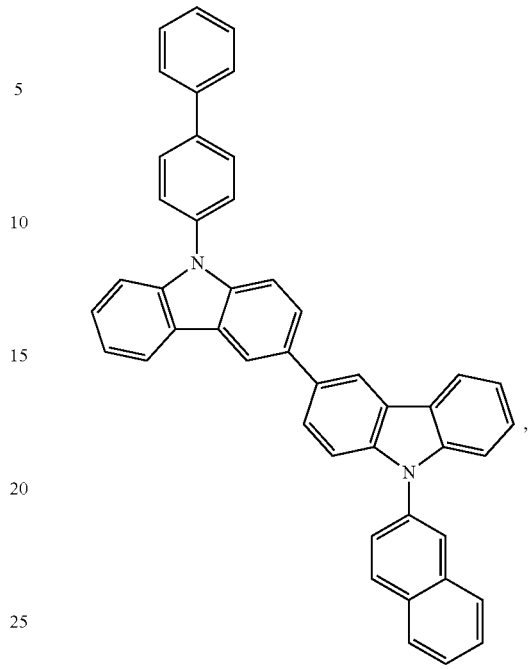
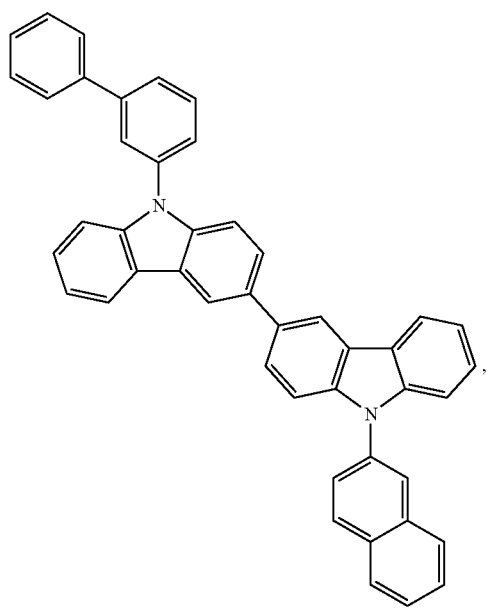
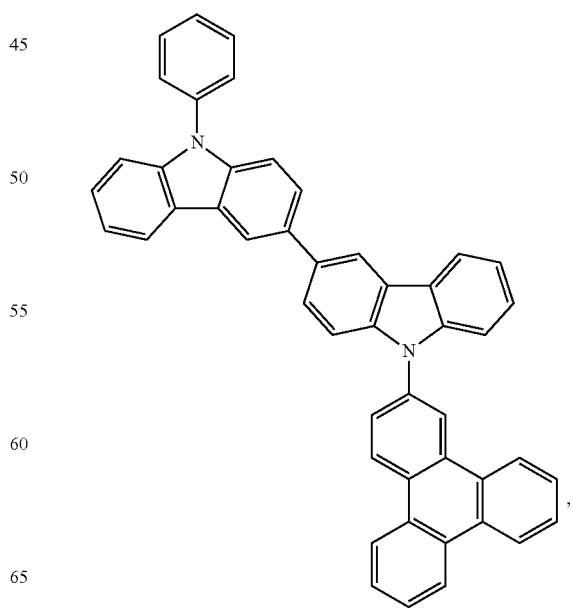

71
-continued
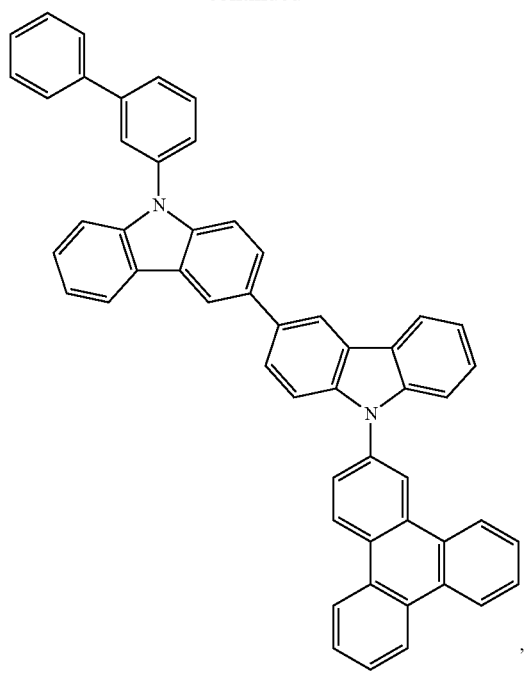
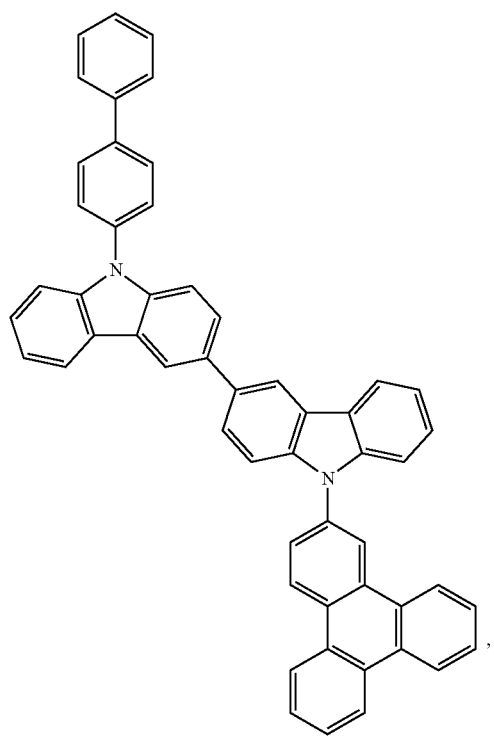
72
-continued
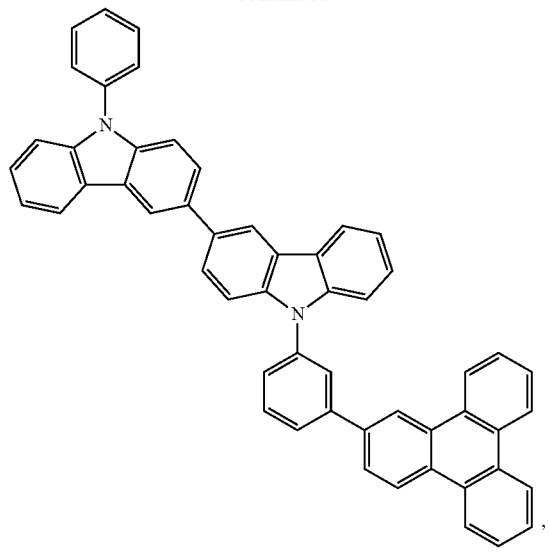
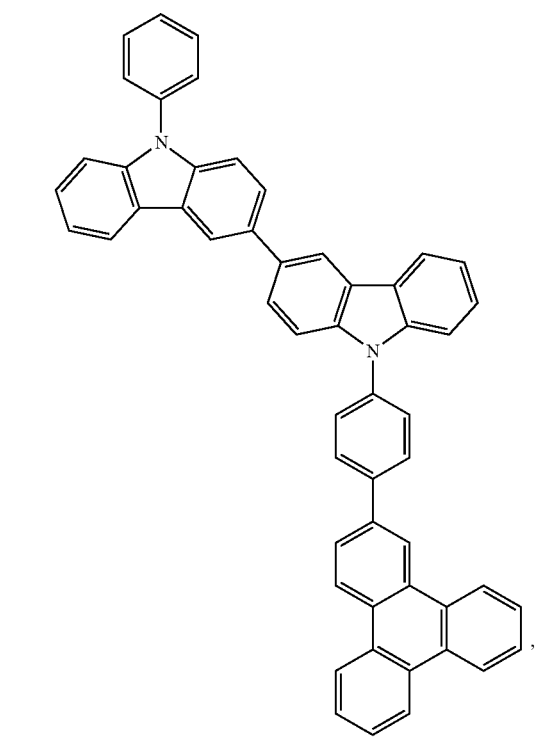

73
-continued
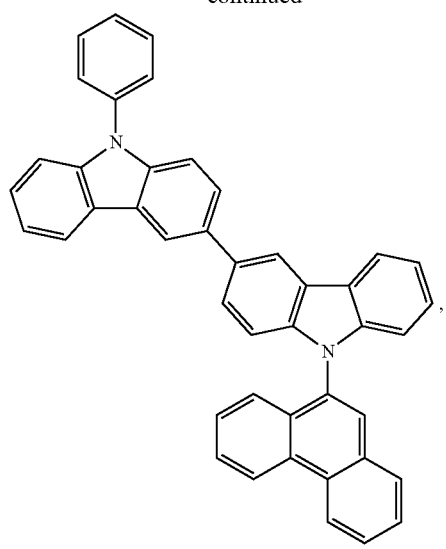
,
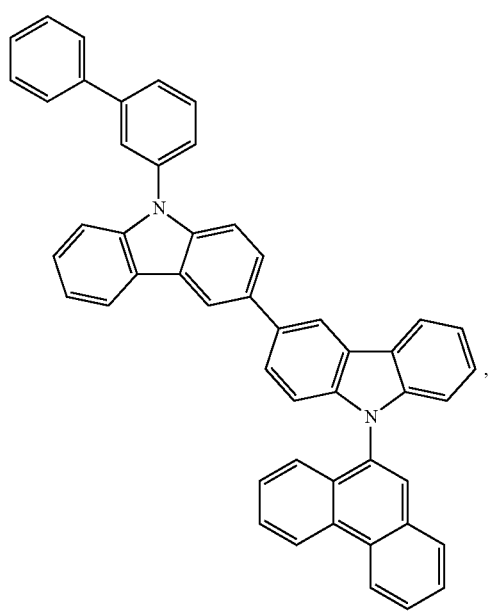
,
74
-continued
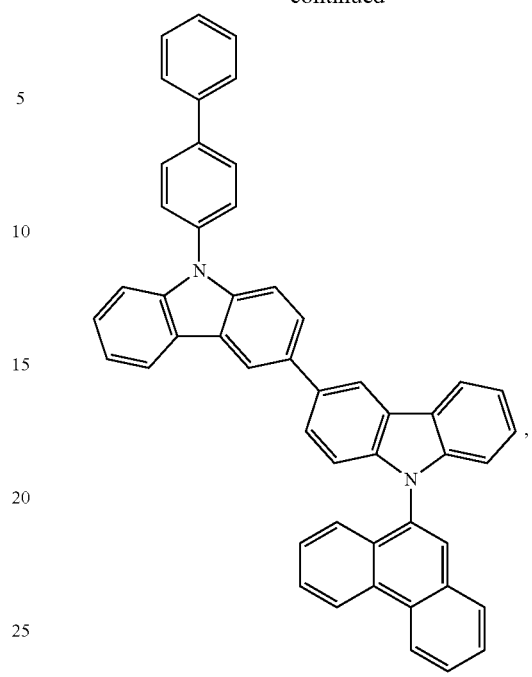
,
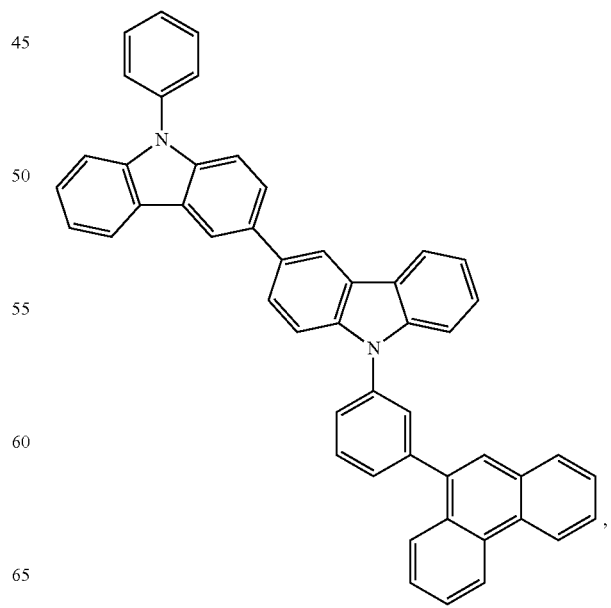
, 75
-continued
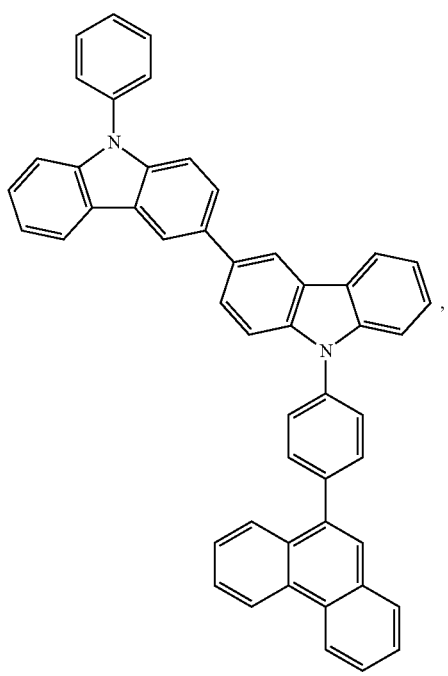
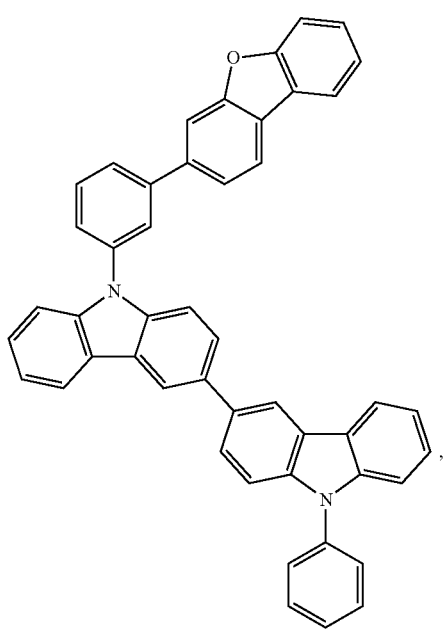
76
-continued
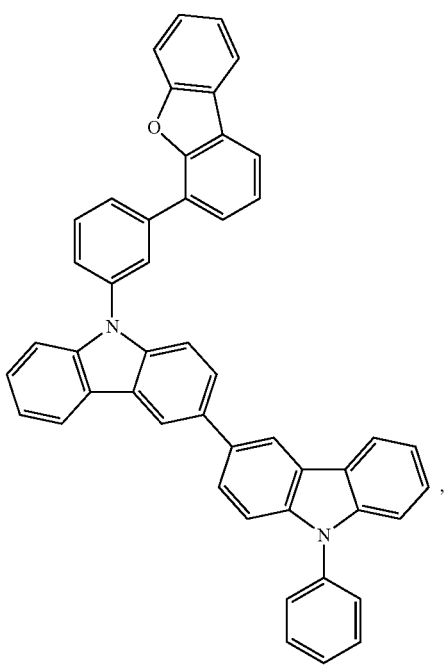
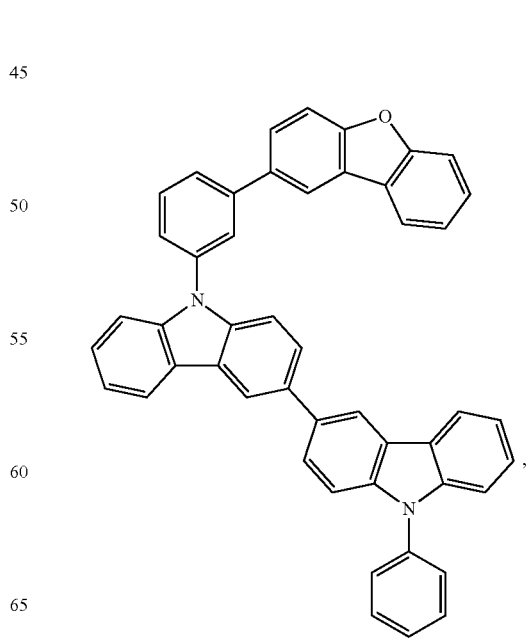

77
-continued
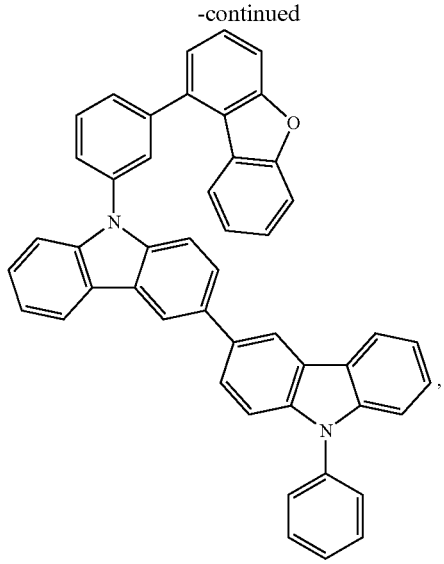
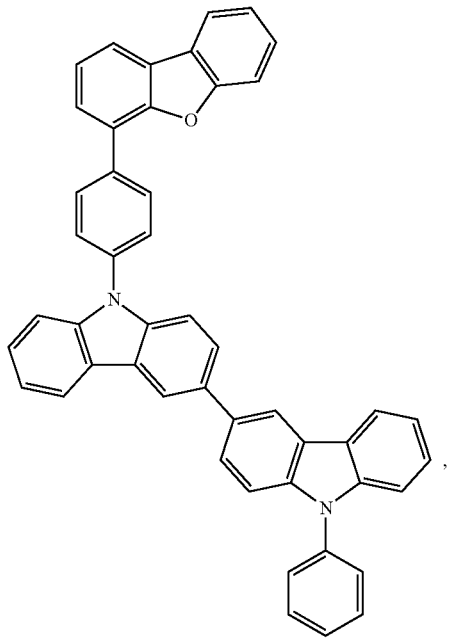
78
-continued
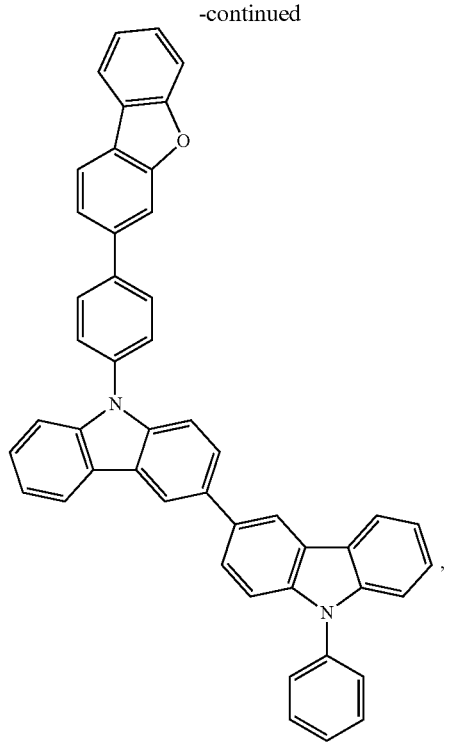

79
-continued
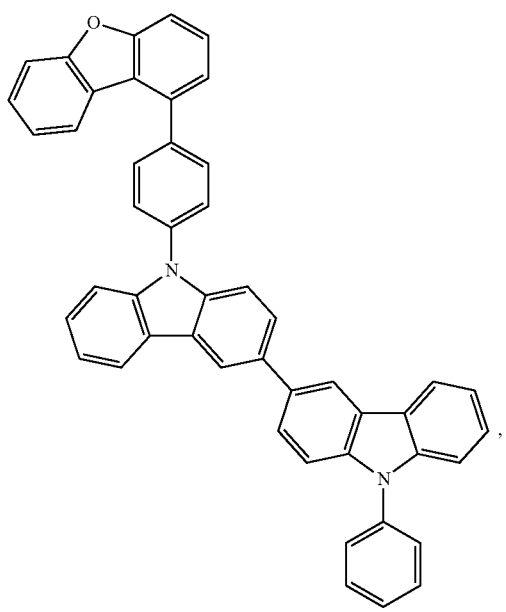
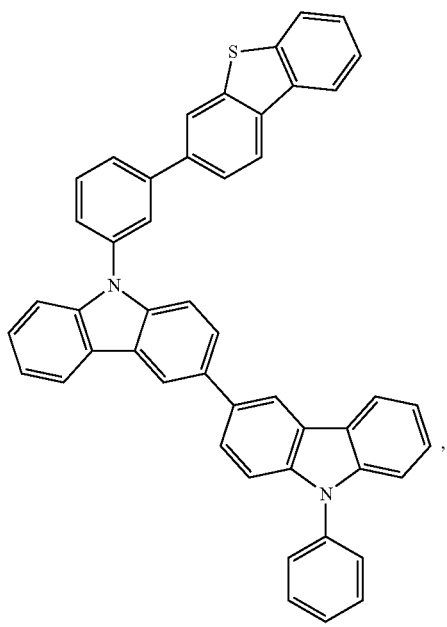
80
-continued
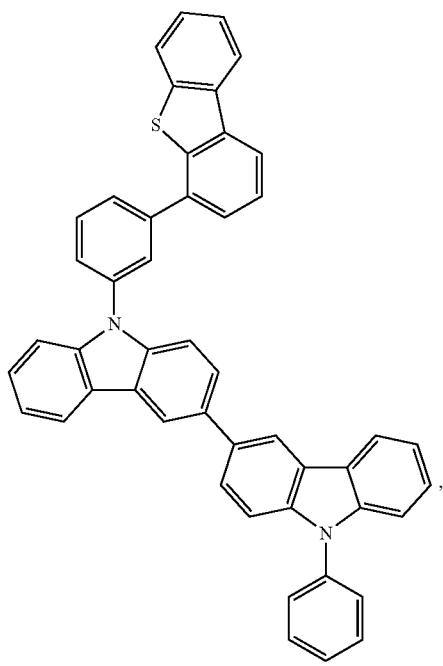
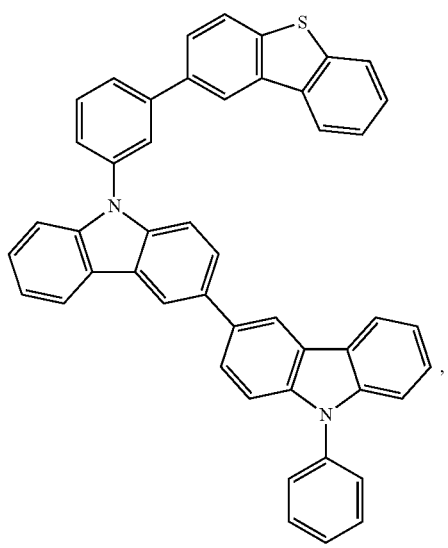

81
-continued
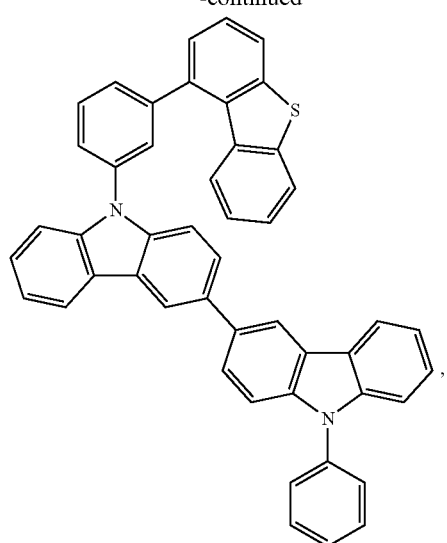
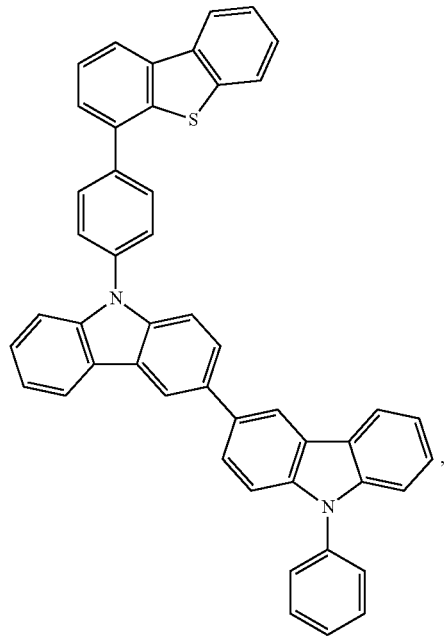
82
-continued
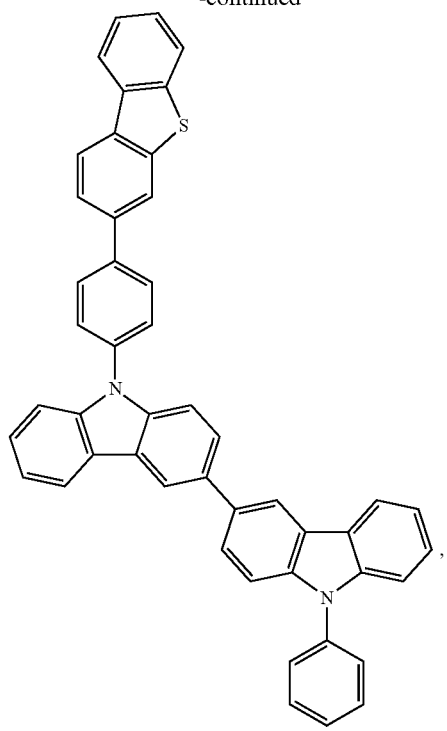
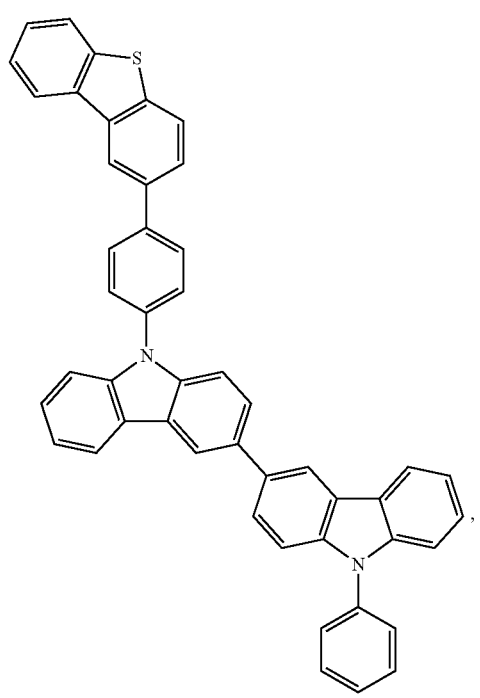

83
-continued
84
-continued
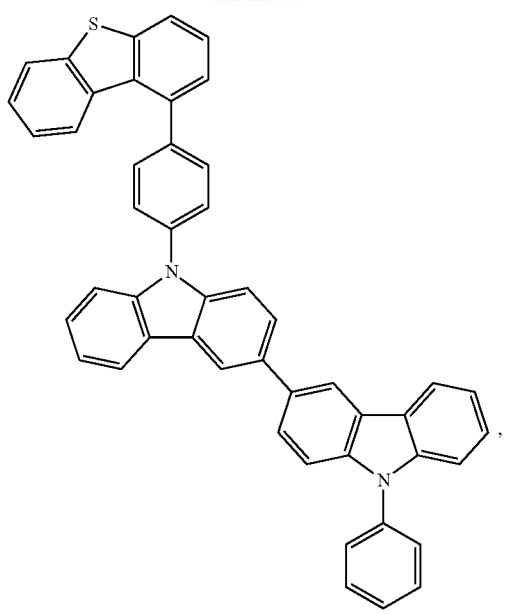
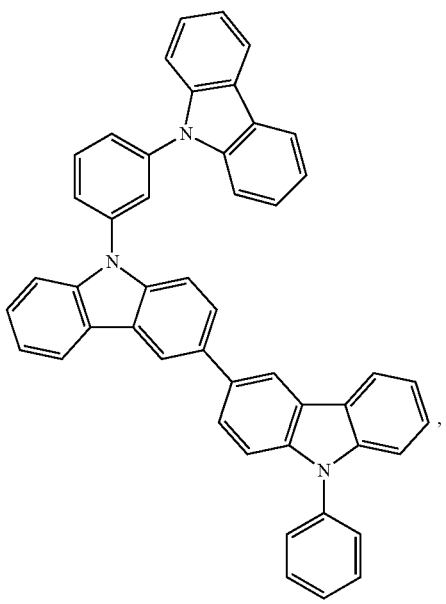
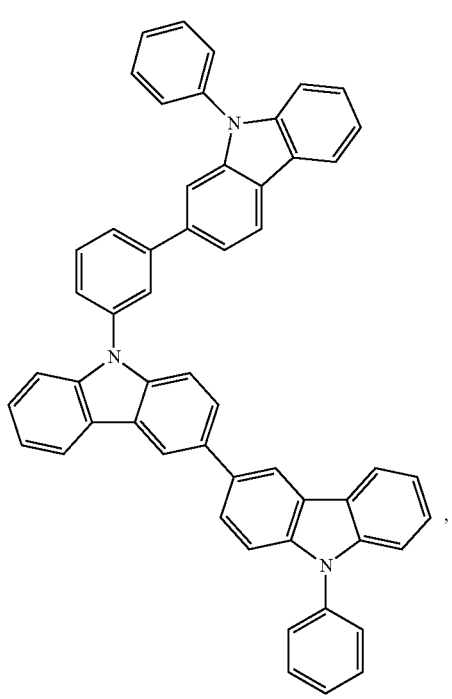

-continued

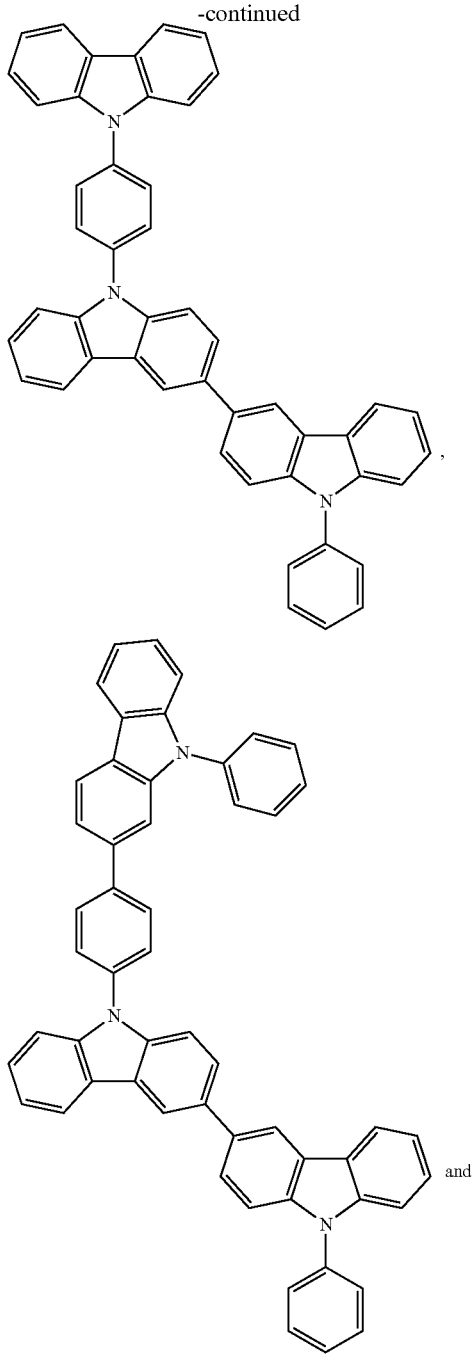

and

-continued

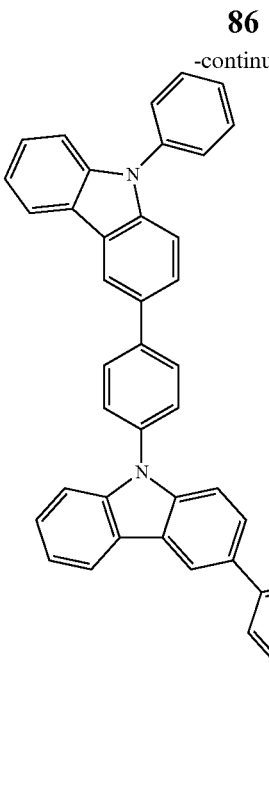

6. The organic electroluminescence device of claim 1, further comprising:
  a second light-emission layer for emitting light of a wavelength longer than a blue light wavelength; and
  a charge generation layer comprising an n-type charge generation layer and a p-type charge generation layer, wherein the charge generation layer is disposed between the first light-emission layer and the second light-emission layer, and the p-type charge generation layer is disposed between the n-type charge generation layer and the second light-emission layer.

* * * * *